(12) United States Patent
Li et al.

(10) Patent No.: US 12,038,590 B2
(45) Date of Patent: Jul. 16, 2024

(54) DISPLAY PANELS WITH AN INTEGRATED OFF-AXIS MICRO-LENS ARRAY

(71) Applicant: Jade Bird Display (Shanghai) Limited, Shanghai (CN)

(72) Inventors: Qiming Li, Albuquerque, NM (US); Yuankun Zhu, Shanghai (CN); Shuang Zhao, Shanghai (CN)

(73) Assignee: JADE BIRD DISPLAY (SHANGHAI) LIMITED, Shanghai (CN)

( * ) Notice: Subject to any disclaimer, the term of this patent is extended or adjusted under 35 U.S.C. 154(b) by 404 days.

(21) Appl. No.: 17/486,113

(22) Filed: Sep. 27, 2021

(65) Prior Publication Data

US 2022/0099985 A1   Mar. 31, 2022

Related U.S. Application Data

(60) Provisional application No. 63/083,972, filed on Sep. 27, 2020.

(51) Int. Cl.
G02B 27/09 (2006.01)
(52) U.S. Cl.
CPC ..... G02B 27/0961 (2013.01); G02B 27/0922 (2013.01)
(58) Field of Classification Search
CPC .......... G02B 27/0961; G02B 27/0922
See application file for complete search history.

(56) References Cited

U.S. PATENT DOCUMENTS

| | | | |
|---|---|---|---|
| 2006/0087741 A1 | 4/2006 | Shimizu | |
| 2009/0067055 A1 | 3/2009 | Yamamura | |
| 2012/0074835 A1 | 3/2012 | Piquette et al. | |
| 2012/0281293 A1 | 11/2012 | Gronenborn et al. | |
| 2020/0357854 A1* | 11/2020 | Koshihara | H10K 59/879 |

OTHER PUBLICATIONS

International Searching Authority, International Search Report and Written Opinion, PCT/US2021/052185, Hong Kong Beida Jade Bird Display Limited, dated Feb. 1, 2022, 4 pages.

* cited by examiner

*Primary Examiner* — Joseph P Martinez
(74) *Attorney, Agent, or Firm* — MORGAN, LEWIS & BOCKIUS LLP

(57) ABSTRACT

Various embodiments include a display panel with an integrated micro-lens array. The display panel typically includes an array of mesas which includes an array of pixel light sources (e.g., LEDs) electrically coupled to corresponding pixel driver circuits (e.g., FETs). The array of micro-lenses is off-axially arranged on the mesas including the pixel light sources, and are positioned to reduce the divergence of light produced by the pixel light sources, and direct the light to a certain angle or focus point on a pixel by pixel basis. Different micro-lens shapes and combinations are implemented in the display panel. The display panel may also include an integrated optical spacer formed from the same micro-lens material layer to maintain the positioning between the micro-lenses and pixel driver circuits.

17 Claims, 38 Drawing Sheets

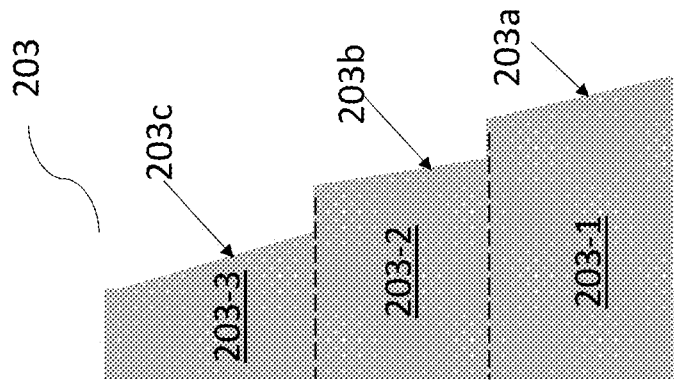
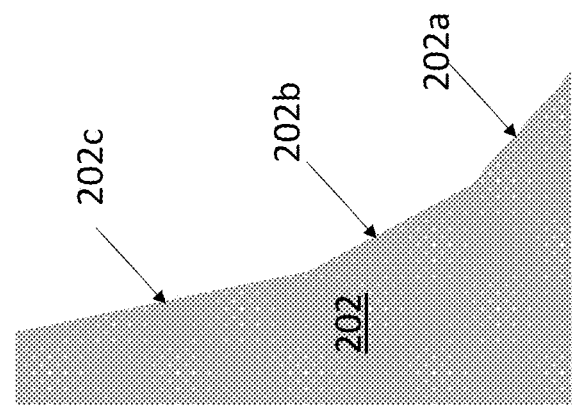
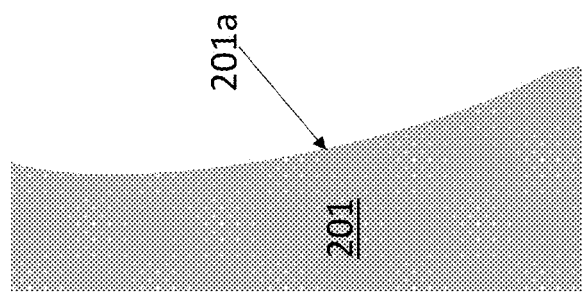
Figure 2C
Figure 2B
Figure 2A

DISPLAY PANELS WITH AN INTEGRATED OFF-AXIS MICRO-LENS ARRAY

RELATED APPLICATION

This application claims priority to U.S. Provisional Patent Application No. 63/083,972, filed Sep. 27, 2020, entitled "DISPLAY PANELS WITH AN INTEGRATED OFF-AXIS MICRO-LENS ARRAY," which is hereby incorporated by reference.

TECHNICAL FIELD

The present disclosure relates generally to display devices, and more particularly, to systems and fabrication methods for display panels integrated with an off-axis micro-lens array.

BACKGROUND

Display technologies are becoming increasingly important in today's commercial electronic devices. These display panels are widely used in stationary large screens such as liquid crystal display televisions (LCD TVs) and organic light emitting diode televisions (OLED TVs) as well as portable electronic devices such as laptop personal computers, smartphones, tablets and wearable electronic devices. Much of development for the stationary large screens is directed to achieve a high viewing angle in order to accommodate and enable multiple audiences to see the screen from various angles. For example, various liquid crystal materials such as super twisted nematic (STN) and film compensated super twisted nematic (FSTN) have been developed to achieve a large viewing angle of each and every pixel light source in a display panel.

However, most of the portable electronic devices are designed mainly for single users, and screen orientation of these portable devices should be adjusted to be the best viewing angle for the corresponding users instead of a large viewing angle to accommodate multiple audiences. For example, a suitable viewing angle for a user may be perpendicular to the screen surface. In this case, compared with stationary large screens, light emitted at a large viewing angle is mostly wasted. Additionally, large viewing angles raise privacy concerns for portable electronic devices used in public areas.

In addition, in a conventional projection system based on a passive imager device, such as liquid crystal display (LCD), digital mirror devices (DMD), and liquid crystal on silicon (LCOS), the passive imager device itself does not emit light. Specifically, the conventional projection system projects images by optically modulating collimated light emitted from a light source, i.e., by either transmitting, e.g., by an LCD panel, or reflecting, e.g., by a DMD panel, part of the light at the pixel level. However, the part of the light that is not transmitted or reflected is lost, which reduces the efficiency of the projection system. Furthermore, to provide the collimated light, complex illumination optics are used to collect divergent light emitted from the light source. The illumination optics not only cause the system to be bulky but also introduce additional optical loss into the system, which further impacts the performance of the system. In a conventional projection system, typically less than 10% of the illumination light generated by the light source is used to form the projection image.

Light emitting diode (LED) having the advantages of long service life, low energy consumption and others, is widely used in various fields. As the next generation's optical source, they are being used as the back light unit for mobile phones, digital devices, liquid crystal displays etc., and also as lightings for dashboards and tail lights of vehicles, traffic lights, and other general lightings. They are widely used in display fields including interior and exterior electric signs as well as in bio and environmental fields including water contamination and oxygen concentration in blood. The application range of LEDs continues to extend every year due to improvement of product performance and drop in production cost. To satisfy these needs, various researches are in progress. There are two main methods: enhancing internal quantum efficiency and enhancing external extraction efficiency. The internal quantum efficiency can be enhanced by increasing the recombination rate of electron-hole pairs, which emits lights in the active layer of LEDs, and decreasing the recombination rate of that, which does not emit lights. However, this method has some limit in its technology. On the other hand, active researches are going on now regarding the increase in external extraction efficiency. In order to overcome this problem, the micro-lens array is used to reduce one or more of scattering, internal reflection, wave guiding, absorption and the like.

LEDs made of semiconductor materials can be used in mono-color or full-color displays. In current displays that employs LEDs, the LEDs are usually used as the light source to provide the light to be optically modulated by, e.g., the LCD or the DMD panel. That is, the light emitted by the LEDs does not form images by itself. LED displays using LED panels including a plurality of LED dies as the imager devices have also been studied. In such an LED display, the LED panel is a self-emissive imager device, where each pixel can include one LED die (mono-color display) or a plurality of LED dies each of which represents one of primary colors (full-color display).

However, the light emitted by the LED dies is generated from spontaneous emission and is thus not directional, resulting in a large divergence angle. The large divergence angle can cause various problems in an LED display. For example, due to the large divergence angle, the light emitted by the LED dies can be more easily scattered and/or reflected in the LED display. The scattered/reflected light can illuminate other pixels, resulting in light crosstalk between pixels, loss of sharpness, and loss of contrast. Furthermore, the direction of the light emitted out of every micro-lens in the conventional LED is same, thereby the lights can only focus on a plane and not on a single point, which limits the application fields of the LEDs. In addition, extra refraction optical structures are needed to be applied in the LED, causing light crosstalk between pixels, loss of sharpness and loss of contrast.

SUMMARY

There is a need for improved display designs that improve upon, and help to address the shortcomings of conventional display systems, such as those described above. In particular, there is a need for display panels with reduced viewing angle for better protection for user's privacy, better directional focus, or/and reduced light waste for reduced power consumption and reduced light interference between pixels with better images.

Various embodiments include a display panel with integrated micro-lens array. The display panel typically includes an array of pixel light sources (e.g., LEDs, OLEDs) electrically coupled to corresponding pixel driver circuits (e.g., FETs). The array of micro-lenses is aligned to the pixel light sources and positioned to reduce the divergence of light produced by the pixel light sources. The display panel may also include an integrated optical spacer to maintain the positioning between the micro-lenses and pixel driver circuits.

The micro-lens array reduces the divergence angle of light produced by the pixel light sources and the useable viewing angle of the display panel. This, in turn, reduces power waste, increases brightness and/or better protects user privacy in public areas.

A display panel with integrated micro-lens array can be fabricated using a variety of manufacturing methods, resulting in a variety of device designs. In one aspect, the micro-lens array is fabricated directly as mesas or protrusions of the substrate with the pixel light sources. In some aspects, self-assembly, high temperature reflow, grayscale mask photolithography, molding/imprinting/stamping, and dry etching pattern transfer are techniques that can be used to fabricate micro-lens arrays.

Other aspects include components, devices, systems, improvements, methods and processes including manufacturing methods, applications, and other technologies related to any of the above.

The present disclosure provides a light emitting structure with an off-axis micro-lens, thereby the direction of the light out of the micro-lens can be changed without extra optical structures.

In some embodiments, the light emitting display with an off-axis micro-lens array, can control the light direction of every micro-lens, and light from different micro-lenses of the micro-lens array can focus on one point.

The present disclosure also provides a light detective device with an off-axis micro-lens array, and the light detective device can receive the light from a point. Furthermore, the non-parallel light from the point can be changed to parallel light through the micro-lens array. The parallel light can then enter into the sensor or another light detection unit.

In some embodiments, the present disclosure provides a light emitting structure comprising three micro-lenses. Thereby the brightness and/or sharpness of the light emitting display using the light emitting structure can be adjusted, and the useable viewing angle can be decreased.

Some exemplary embodiments of the present disclosure include a light emitting structure comprising three micro-lenses. For example, a first micro-lens may be formed above a first light emitting mesa, and a central axis of the first micro-lens is not coaxially aligned with a central axis of the first light emitting mesa. One part of the light emitted from the first light emitting area can directly arrive at and pass through the first micro-lens. A second micro-lens may be positioned on the second light emitting mesa and a third micro-lens may be positioned on the second micro-lens. One part of the light emitted from the second light emitting mesa can directly arrive at and pass through the second micro-lens. One part of the light passing through the second micro-lens may further arrive at and pass through the third micro-lens. As a consequence, the light path can be adjusted upon the relative position of the three micro-lenses. Therefore, the divergence can be reduced and the useable viewing angle can be decreased to the extent that displays and panels using LED devices may be seen by a user's view perpendicular to surfaces of the displays and panels. This, in turn, can reduce power waste and increase brightness and/or better protect user privacy in public areas.

In another example, the light emitting structure may further comprise one or more reflective cups, and the first light emitting mesa and the second light emitting mesa may be surrounded by the one or more reflective cups. One part of the light emitted from the first and second light emitting mesas can directly arrive at and pass through one or more of the three micro-lenses. Another part of the light emitted from the first and second light emitting mesas can arrive at and be reflected by the one or more reflective cups and then arrive at and pass through one or more of the three micro-lenses. As a result, more light emitted from the first and second light emitting mesas can be utilized, compared to the light emitting structure without any reflective cup. Therefore, the divergence can be reduced and the useable viewing angle can be decreased to the extent that displays and panels using the LED devices may be seen by several users. This can also reduce power waste, increase brightness and/properly protect user privacy in public areas.

In some embodiments, a light emitting structure includes a diffraction lens, thereby the brightness and/or sharpness of the light emitting display can be adjusted. Selective wavelength of the light may also be reflected by or pass through the diffraction lens.

Some exemplary embodiments of the present disclosure include a light emitting structure comprising a micro-lens formed on a light emitting mesa and a diffraction lens covering the micro-lens. The micro-lens may be aligned to the light emitting mesa and covered by the diffraction lens to reduce the divergence of the light emitting from the light emitting mesa. For example, the micro-lens may be co-axially aligned to the light emitting mesa and covered by the diffraction lens. One part of the light emitted from the light emitting area can directly arrive at and pass through the micro-lens, and then selectively pass through the diffraction lens. Another part of the light emitted from the light emitting mesa may directly arrive at and selectively pass through the diffraction lens. One advantage of the disclosed light emitting structure is to enhance the brightness of the light emitting structure. Another advantage is to increase the contrast of the light emitting structure. Therefore, the divergence can be reduced and the useable viewing angle can be decreased to the extent that displays and panels using LED devices may be seen by a user's view perpendicular to surfaces of the displays and panels. This, in turn, can reduce power waste and increase brightness and/or better protects user privacy in public areas.

In another example, the micro-lens may be co-axially aligned to the light emitting area, positioned on the light emitting mesa, covered by the diffraction lens and surrounded by a reflective cup. Part of the light emitted from the light emitting area can directly arrive at and pass through the micro-lens and/or the diffraction lens. Another part of the light emitted from the light emitting center can arrive at and be reflected by the reflective cup and then arrive at and pass through the micro-lens and/or the diffraction lens. As a result, more light emitted from the light emitting mesa can be utilized, compared to the light emitting structure without the reflective cup. Therefore, the divergence can be reduced and the useable viewing angle can be decreased to the extent that displays and panels using the LED devices may be seen by several users. This can also reduce power waste, increase brightness and/properly protect user privacy in public areas.

The present disclosure thus includes, without limitation, the following exemplary embodiments.

Some exemplary embodiments of the present disclosure include a light emitting structure array system with an off-axis micro-lens array structure comprising: at least one light emitting mesa; and at least one micro-lens, formed above the light emitting mesa, wherein a central axis of the at least one micro-lens is not coaxially aligned with a central axis of the at least one light emitting mesa.

In some exemplary embodiments or any combination of exemplary embodiments of the light emitting structure array system, the relative position of each micro-lens relative to a corresponding light emitting mesa in the light emitting structure array system are the same.

In some exemplary embodiments or any combination of exemplary embodiments, the light emitting structure array system further includes a sensor, and emitting light rays from the at least one light emitting mesa through the at least one micro-lens is converted together into the sensor.

In some exemplary embodiments or any combination of exemplary embodiments of the light emitting structure array system, the sensor is arranged at a central axis of the light emitting structure array system.

In some exemplary embodiments or any combination of exemplary embodiments of the light emitting structure array system, a respective offset distance of a central axis of a respective micro-lens relative to a central axis of a respective light emitting mesa becomes larger from the center of the light emitting structure array system to either edge of the light emitting structure array system.

In some exemplary embodiments or any combination of exemplary embodiments of the light emitting structure array system, the sensor is not arranged at a central axis of the light emitting structure array system.

In some exemplary embodiments or any combination of exemplary embodiments of the light emitting structure array system, an offset distance of a central axis of a respective micro-lens relative to a central axis of a respective light emitting mesa becomes larger from a central axis of the sensor to either edge of the light emitting structure array system.

In some exemplary embodiments or any combination of exemplary embodiments of the light emitting structure array system, an angle of light emitted out of a respective micro-lens becomes larger from a central axis of the sensor to either edge of the light emitting structure array system.

In some exemplary embodiments or any combination of exemplary embodiments of the light emitting structure array system, the offset range of the central axis of the at least one micro-lens from the central axis of the at least one light emitting mesa is not more than 4.5 µm.

In some exemplary embodiments or any combination of exemplary embodiments of the light emitting structure array system, the offset distance between an edge of a bottom surface of the at least one light emitting mesa and an edge of a bottom surface of the at least one micro-lens is within 30% of a diameter of the bottom surface of the at least one micro-lens.

In some exemplary embodiments or any combination of exemplary embodiments of the light emitting structure array system, the material of the at least one micro-lens is silicon oxide or organic materials.

In some exemplary embodiments or any combination of exemplary embodiments of the light emitting structure array system, the bottom surface of the at least one micro-lens intersects with the central axis of the at least one light emitting mesa.

In some exemplary embodiments or any combination of exemplary embodiments, the light emitting structure array system further includes a semiconductor substrate and a reflective cup, and the at least one light emitting mesa is formed on the semiconductor substrate, and the at least one light emitting mesa is surrounded by the reflective cup.

In some exemplary embodiments or any combination of exemplary embodiments of the light emitting structure array system, the inside wall of the reflective cup is stair-shaped.

In some exemplary embodiments or any combination of exemplary embodiments of the light emitting structure array system, the at least one light emitting mesa includes: a light emitting layer, a bottom bonding layer, at the bottom of the light emitting layer and bonded with the semiconductor substrate, and a top electrode layer, covering the at least one light emitting mesa and electrically connected with the reflective cup. In some embodiments, the reflective cup is electrically connected with the semiconductor substrate.

In some exemplary embodiments or any combination of exemplary embodiments, the light emitting structure array system further includes a spacer, formed between the at least one light emitting mesa and the at least one micro-lens.

In some exemplary embodiments or any combination of exemplary embodiments of the light emitting structure array system, the height of the spacer is less than the height of the at least one micro-lens.

In some exemplary embodiments or any combination of exemplary embodiments of the light emitting structure array system, the semiconductor substrate is an IC substrate.

Some exemplary embodiments of the present disclosure include a light emitting structure with at least one off-axis micro-lens that includes: a light emitting mesa; a first micro-lens, formed on the light emitting mesa; and, a second micro-lens, formed on the light emitting mesa and covering the first micro-lens.

In some exemplary embodiments or any combination of exemplary embodiments of the light emitting structure with at least one off-axis micro-lens, the diameter of the second micro-lens is larger than the diameter of the first micro-lens.

In some exemplary embodiments or any combination of exemplary embodiments of the light emitting structure with at least one off-axis micro-lens, a central axis of the first micro-lens is coaxially aligned with a central axis of the light emitting mesa, and a central axis of the second micro-lens is not coaxially aligned with the central axis of the light emitting mesa.

In some exemplary embodiments or any combination of exemplary embodiments of the light emitting structure with at least one off-axis micro-lens, a central axis of the second micro-lens is coaxially aligned with a central axis of the light emitting mesa, and a central axis of the first micro-lens is not coaxially aligned with the central axis of the light emitting mesa.

In some exemplary embodiments or any combination of exemplary embodiments of the light emitting structure with at least one off-axis micro-lens, a central axis of the first micro-lens is not coaxially aligned with a central axis of the light emitting mesa, a central axis of the second micro-lens is not coaxially aligned with the central axis of the light emitting mesa, and, the central axis of the first micro-lens is not coaxially aligned with the central axis of the second micro-lens.

In some exemplary embodiments or any combination of exemplary embodiments of the light emitting structure with at least one off-axis micro-lens, the light emitting structure includes more than one set of light emitting mesa, first micro-lens and second micro-lens. In some embodiments, the position of a respective first micro-lens relative to a respective second micro-lens on the light emitting structure within a respective set is different.

In some exemplary embodiments or any combination of exemplary embodiments of the light emitting structure with at least one off-axis micro-lens, the offset distance between the central axis of the second micro-lens and the central axis of the light emitting mesa is not more than 12 μm.

In some exemplary embodiments or any combination of exemplary embodiments of the light emitting structure with at least one off-axis micro-lens, the offset distance between the central axis of the first micro-lens and the central axis of the light emitting mesa is not more than 1.5 μm.

In some exemplary embodiments or any combination of exemplary embodiments of the light emitting structure with at least one off-axis micro-lens, the offset distance between the central axis of the first micro-lens and the central axis of the second micro-lens is not more than 6 μm and is not less than 4.5 μm.

In some exemplary embodiments or any combination of exemplary embodiments of the light emitting structure with at least one off-axis micro-lens, the bottom surface of the second micro-lens intersects with the central axis of the light emitting mesa.

In some exemplary embodiments or any combination of exemplary embodiments of the light emitting structure with at least one off-axis micro-lens, the bottom surface of the first micro-lens intersects with the central axis of the light emitting mesa.

In some exemplary embodiments or any combination of exemplary embodiments of the light emitting structure with at least one off-axis micro-lens, the material of the first micro-lens is as same as the material of the second micro-lens.

In some exemplary embodiments or any combination of exemplary embodiments, the light emitting structure with at least one off-axis micro-lens further includes a semiconductor substrate and a reflective cup. In some embodiments, the light emitting mesa is formed on the semiconductor substrate, and the light emitting mesa is surrounded by the reflective cup.

In some exemplary embodiments or any combination of exemplary embodiments of the light emitting structure with at least one off-axis micro-lens, the inside wall of the reflective cup is stair-shaped.

In some exemplary embodiments or any combination of exemplary embodiments of the light emitting structure with at least one off-axis micro-lens, the light emitting mesa includes: a light emitting layer; a bottom bonding layer, at the bottom of the light emitting layer and bonded with the semiconductor substrate; and a top electrode layer, covering the light emitting mesa and electrically connected with the reflective cup, wherein the reflective cup is electrically connected with the semiconductor substrate.

In some exemplary embodiments or any combination of exemplary embodiments, the light emitting structure with at least one off-axis micro-lens further includes a spacer, formed between the light emitting mesa and the first micro-lens.

In some exemplary embodiments or any combination of exemplary embodiments of the light emitting structure with at least one off-axis micro-lens, the height of the spacer is less than that of the first micro-lens.

In some exemplary embodiments or any combination of exemplary embodiments of the light emitting structure with at least one off-axis micro-lens, the semiconductor substrate is an IC substrate.

Some exemplary embodiments of the present disclosure include a light emitting structure with at least one off-axis micro-lens, comprising: a light emitting mesa; a first micro-lens, formed on the light emitting mesa; and, a second micro-lens, formed on the first micro-lens.

In some exemplary embodiments or any combination of exemplary embodiments of the light emitting structure with at least one off-axis micro-lens, the diameter of the second micro-lens is less than the diameter of the first micro-lens.

In some exemplary embodiments or any combination of exemplary embodiments of the light emitting structure with at least one off-axis micro-lens, a central axis of the first micro-lens is coaxially aligned with a central axis of the light emitting mesa, and a central axis of the second micro-lens is not coaxially aligned with the central axis of the light emitting mesa.

In some exemplary embodiments or any combination of exemplary embodiments of the light emitting structure with at least one off-axis micro-lens, the light emitting structure includes more than one set of light emitting mesa, first micro-lens and second micro-lens. In some embodiments, a position of a respective first micro-lens relative to a respective second micro-lens on the light emitting structure within a respective set is different.

In some exemplary embodiments or any combination of exemplary embodiments of the light emitting structure with at least one off-axis micro-lens, the offset distance between the central axis of the second micro-lens and the central axis of the light emitting mesa is not more than 1.5 μm.

In some exemplary embodiments or any combination of exemplary embodiments of the light emitting structure with at least one off-axis micro-lens, the bottom surface of the first micro-lens intersects with the central axis of the light emitting mesa.

In some exemplary embodiments or any combination of exemplary embodiments of the light emitting structure with at least one off-axis micro-lens, the bottom surface of the second micro-lens does not intersect with the central axis of the light emitting mesa.

In some exemplary embodiments or any combination of exemplary embodiments of the light emitting structure with at least one off-axis micro-lens, the material of the first micro-lens is the same as the material of the second micro-lens.

In some exemplary embodiments or any combination of exemplary embodiments, the light emitting structure with at least one off-axis micro-lens further includes a semiconductor substrate and a reflective cup, wherein the light emitting mesa is formed on the semiconductor substrate, and the light emitting mesa is surrounded by the reflective cup.

In some exemplary embodiments or any combination of exemplary embodiments of the light emitting structure with at least one off-axis micro-lens, the inside wall of the reflective cup is stair-shaped.

In some exemplary embodiments or any combination of exemplary embodiments of the light emitting structure with at least one off-axis micro-lens, the light emitting mesa includes: a light emitting layer; a bottom bonding layer, at the bottom of the light emitting layer and bonded with the semiconductor substrate; and, a top electrode layer, covering the light emitting mesa and electrically connected with the reflective cup, wherein the reflective cup is electrically connected with the semiconductor substrate.

In some exemplary embodiments or any combination of exemplary embodiments, the light emitting structure with at least one off-axis micro-lens further includes a spacer, formed between the light emitting mesa and the first micro-lens.

In some exemplary embodiments or any combination of exemplary embodiments of the light emitting structure with at least one off-axis micro-lens, the height of the spacer is less than height of the first micro-lens.

In some exemplary embodiments or any combination of exemplary embodiments of the light emitting structure with at least one off-axis micro-lens, the semiconductor substrate is an IC substrate.

Some exemplary embodiments of the present disclosure include a light emitting structure with an off-axis micro-lens structure, comprising: a first light emitting mesa; at least a first micro-lens, formed above the first light emitting mesa, wherein a central axis of the first micro-lens is not coaxially aligned with a central axis of the first light emitting mesa; a second light emitting mesa; at least a second micro-lens, formed above the second light emitting mesa; and at least a third micro-lens, formed on the second light emitting mesa.

In some exemplary embodiments or any combination of exemplary embodiments of the light emitting structure, the third micro-lens covers and contacts a whole top surface of the second micro-lens.

In some exemplary embodiments or any combination of exemplary embodiments of the light emitting structure, the offset range of the central axis of the first micro-lens from the central axis of the first light emitting mesa is not more than 4.5 μm.

In some exemplary embodiments or any combination of exemplary embodiments of the light emitting structure, the offset distance between an edge of the bottom surface of the first light emitting mesa and an edge of the bottom surface of the first micro-lens is within 30% of a diameter of the bottom surface of the first micro-lens.

In some exemplary embodiments or any combination of exemplary embodiments of the light emitting structure, the material of the first micro-lens is silicon oxide or organic materials.

In some exemplary embodiments or any combination of exemplary embodiments of the light emitting structure, the bottom surface of the first micro-lens intersects with the central axis of the first light emitting mesa.

In some exemplary embodiments or any combination of exemplary embodiments, the light emitting structure further includes a semiconductor substrate and at least two reflective cups, wherein the first light emitting mesa, the second light emitting mesa are formed on the semiconductor substrate, and the first light emitting mesa and the second light emitting mesa are surrounded by a respective reflective cup of the two reflective cups.

In some exemplary embodiments or any combination of exemplary embodiments of the light emitting structure, the inside walls of the reflective cups are stair-shaped.

In some exemplary embodiments or any combination of exemplary embodiments of the light emitting structure, the first light emitting mesa includes: a first light emitting layer; a first bottom bonding layer, at a bottom of the first light emitting layer and bonded with the semiconductor substrate, and; a top electrode layer, at a top surface the first light emitting mesa and electrically connected with a first reflective cup of the two reflective cups. In some embodiments, the second light emitting mesa includes: a second light emitting layer; a second bottom bonding layer, at a bottom of the second light emitting layer and bonded with the semiconductor substrate; and the top electrode layer, also at a top surface of the second light emitting mesa and electrically connected with a second reflective cup of the two reflective cups, wherein the first and the second reflective cups are electrically connected with the semiconductor substrate.

In some exemplary embodiments or any combination of exemplary embodiments, the light emitting structure further includes a spacer, covering the first light emitting mesa and the second light emitting mesa, wherein the spacer is formed between the first light emitting mesa and the first micro-lens, and the spacer is also formed between the second light emitting mesa and the second micro-lens.

In some exemplary embodiments or any combination of exemplary embodiments of the light emitting structure, the height of the spacer is less than height of the first micro-lens.

The light emitting structure according to any one of claims 51-61, wherein diameter of the third micro-lens is larger than diameter of the second micro-lens.

In some exemplary embodiments or any combination of exemplary embodiments of the light emitting structure, a central axis of the second micro-lens is coaxially aligned with a central axis of the second light emitting mesa, and a central axis of the third micro-lens is not coaxially aligned with the central axis of the second light emitting mesa.

In some exemplary embodiments or any combination of exemplary embodiments of the light emitting structure, a central axis of the third micro-lens is coaxially aligned with a central axis of the second light emitting mesa, and a central axis of the second micro-lens is not coaxially aligned with the central axis of the second light emitting mesa.

In some exemplary embodiments or any combination of exemplary embodiments of the light emitting structure, a central axis of the second micro-lens is not coaxially aligned with a central axis of the second light emitting mesa, a central axis of the third micro-lens is not coaxially aligned with the central axis of the second light emitting mesa, and, the central axis of the second micro-lens is not coaxially aligned with the central axis of the third micro-lens.

In some exemplary embodiments or any combination of exemplary embodiments of the light emitting structure, the light emitting structure includes more than one set of light emitting mesa, first micro-lens, second micro-lens, and third micro-lens. In some embodiments, a position of a respective second micro-lens relative to a respective third micro-lens on the light emitting structure within a respective set is different.

In some exemplary embodiments or any combination of exemplary embodiments of the light emitting structure, the offset distance between the central axis of the third micro-lens and the central axis of the second light emitting mesa is not more than 12 μm.

In some exemplary embodiments or any combination of exemplary embodiments of the light emitting structure, the offset distance between the central axis of the second micro-lens and the central axis of the second light emitting mesa is not more than 1.5 μm.

In some exemplary embodiments or any combination of exemplary embodiments of the light emitting structure, the offset distance between the central axis of the second micro-lens and the central axis of the third micro-lens is not more than 6 μm and is not less than 4.5 μm.

In some exemplary embodiments or any combination of exemplary embodiments of the light emitting structure, the bottom surface of the third micro-lens intersects with a central axis of the second light emitting mesa.

In some exemplary embodiments or any combination of exemplary embodiments of the light emitting structure, the bottom surface of the second micro-lens does not intersect with a central axis of the second light emitting mesa.

In some exemplary embodiments or any combination of exemplary embodiments of the light emitting structure, the material of the second micro-lens is the same as the material of the third micro-lens, and, the material of the first micro-lens is the same as the material of the third micro-lens.

In some exemplary embodiments or any combination of exemplary embodiments of the light emitting structure, the offset distance between the central axis of the first micro-lens and the central axis of the first light emitting mesa is less than an offset distance between a central axis of the third micro-lens and a central axis of the second light emitting mesa.

In some exemplary embodiments or any combination of exemplary embodiments of the light emitting structure, the semiconductor substrate is an IC substrate.

Some exemplary embodiments of the present disclosure include a light emitting structure, comprising: a first light emitting mesa; a first micro-lens, formed above the first light emitting mesa, wherein a central axis of the first micro-lens is not coaxially aligned with a central axis of the first light emitting mesa; a second light emitting mesa; a second micro-lens, formed above the second light emitting mesa; and a third micro-lens, formed on the second micro-lens, wherein the third micro-lens does not cover a whole top surface of the second micro-lens.

In some exemplary embodiments or any combination of exemplary embodiments of the light emitting structure, the offset distance between the central axis of the first micro-lens and the central axis of the first light emitting mesa is not more than 4.5 µm.

In some exemplary embodiments or any combination of exemplary embodiments of the light emitting structure, the offset distance between an edge of a bottom surface of the first light emitting mesa and an edge of a bottom surface of the first micro-lens is within 30% of a diameter of the bottom surface of the first micro-lens.

In some exemplary embodiments or any combination of exemplary embodiments of the light emitting structure, the material of the first micro-lens is silicon oxide or organic materials.

In some exemplary embodiments or any combination of exemplary embodiments of the light emitting structure, the bottom surface of the first micro-lens intersects with the central axis of the first light emitting mesa.

In some exemplary embodiments or any combination of exemplary embodiments, the light emitting structure further includes a semiconductor substrate and reflective cups, wherein the first light emitting mesa and the second light emitting mesa are formed on the semiconductor substrate, and wherein the first light emitting mesa and the second light emitting mesa are surrounded by a respective reflective cup.

In some exemplary embodiments or any combination of exemplary embodiments of the light emitting structure, the inside wall of each of the reflective cups is stair-shaped.

In some exemplary embodiments or any combination of exemplary embodiments of the light emitting structure, the first light emitting mesa includes: a first light emitting layer; a first bottom bonding layer, formed at a bottom of the first light emitting layer and bonded with the semiconductor substrate; a top electrode layer, covering the first light emitting layer and electrically connected with a first reflective cup of the reflective cups. In some embodiments, the second light emitting mesa includes: a second light emitting layer; a second bottom bonding layer, formed at a bottom of the second light emitting layer and bonded with the semiconductor substrate; the top electrode layer, also covering the second light emitting layer and electrically connected with a second reflective cup of the reflective cups, wherein the reflective cups are electrically connected with the semiconductor substrate.

In some exemplary embodiments or any combination of exemplary embodiments, the light emitting structure further includes a spacer covering the first light emitting mesa and the second light emitting mesa, wherein the spacer is formed between the first light emitting mesa and the first micro-lens, and the spacer is also formed between the second light emitting mesa and the second micro-lens.

In some exemplary embodiments or any combination of exemplary embodiments of the light emitting structure, the height of the spacer is less than the height of the first micro-lens.

In some exemplary embodiments or any combination of exemplary embodiments of the light emitting structure, the horizontal dimension of the third micro-lens is less than the horizontal dimension of a bottom surface of the second micro-lens.

In some exemplary embodiments or any combination of exemplary embodiments of the light emitting structure, a central axis of the second micro-lens is coaxially aligned with a central axis of the second light emitting mesa, and a vertical axis of the third micro-lens is not coaxially aligned with the central axis of the second light emitting mesa, the vertical axis passing a center point of the third micro-lens when the third micro-lens is a complete shape.

In some exemplary embodiments or any combination of exemplary embodiments of the light emitting structure, the light emitting structure includes more than one set of light emitting mesa, first micro-lens and second micro-lens. In some embodiments, a position of a respective first micro-lens relative to a respective second micro-lens on the light emitting structure within a respective set is different.

In some exemplary embodiments or any combination of exemplary embodiments of the light emitting structure, the offset distance between the vertical axis of the third micro-lens and the central axis of the second light emitting mesa is not more than 1.5 µm.

In some exemplary embodiments or any combination of exemplary embodiments of the light emitting structure, the bottom surface of the second micro-lens intersects with the central axis of the second light emitting mesa In some exemplary embodiments or any combination of exemplary embodiments of the light emitting structure, the bottom surface of the first micro-lens does not intersect with the central axis of the first light emitting mesa.

In some exemplary embodiments or any combination of exemplary embodiments of the light emitting structure, the material of the second micro-lens is the same as the material of the third micro-lens, and the material of the first micro-lens is the same as the material of the second micro-lens.

In some exemplary embodiments or any combination of exemplary embodiments of the light emitting structure, the offset distance between the central axis of the first micro-lens and the central axis of the first light emitting mesa is larger than the offset distance between the vertical axis of the third micro-lens and the central axis of the second light emitting mesa.

In some exemplary embodiments or any combination of exemplary embodiments of the light emitting structure, the semiconductor substrate is an IC substrate.

Some exemplary embodiments of the present disclosure include a light emitting structure with coaxial micro-lenses, comprising: a light emitting mesa; a first micro-lens, formed on the light emitting mesa; and, a second micro-lens, covering and contacting the first micro-lens.

In some exemplary embodiments or any combination of exemplary embodiments of the light emitting structure with coaxial micro-lenses, the refractive index of the first micro-lens is higher than the refractive index of the second micro-lens.

In some exemplary embodiments or any combination of exemplary embodiments of the light emitting structure with coaxial micro-lenses, the material of the second micro-lens is different from the material of the first micro-lens.

In some exemplary embodiments or any combination of exemplary embodiments of the light emitting structure with coaxial micro-lenses, the first micro-lens has a hemisphere structure, and the second micro-lens has a polygon structure without carve-out of the first micro-lens or composite structure without carve-out of the first micro-lens.

In some exemplary embodiments or any combination of exemplary embodiments of the light emitting structure with coaxial micro-lenses, the composite structure is a combination of a hemisphere structure and a trapezoid structure or a hemisphere structure and a triangle structure.

In some exemplary embodiments or any combination of exemplary embodiments of the light emitting structure with coaxial micro-lenses, the trapezoid structure is formed at a bottom of the hemisphere structure, or, the triangle structure is formed at the bottom of the hemisphere structure.

In some exemplary embodiments or any combination of exemplary embodiments of the light emitting structure with coaxial micro-lenses, the polygon structure is a trapezoid structure having an inclined top surface relative to a bottom surface of the trapezoid structure.

In some exemplary embodiments or any combination of exemplary embodiments of the light emitting structure with coaxial micro-lenses, a central axis of the first micro-lens and a central axis of the second micro-lens is coaxially aligned with a central axis of the light emitting mesa.

In some exemplary embodiments or any combination of exemplary embodiments, the light emitting structure with coaxial micro-lenses further includes a semiconductor substrate and a reflective cup, wherein the light emitting mesa is formed on the semiconductor substrate, and the light emitting mesa is surrounded by the reflective cup.

In some exemplary embodiments or any combination of exemplary embodiments of the light emitting structure with coaxial micro-lenses, the inside wall of the reflective cup is stair-shaped.

In some exemplary embodiments or any combination of exemplary embodiments of the light emitting structure with coaxial micro-lenses, the light emitting mesa includes: a light emitting layer; a bottom bonding layer, at the bottom of the light emitting layer and bonded with the semiconductor substrate, and; a top electrode layer, covering the light emitting mesa and electrically connected with the reflective cup, wherein the reflective cup is electrically connected with the semiconductor substrate.

In some exemplary embodiments or any combination of exemplary embodiments, the light emitting structure with coaxial micro-lenses further includes a spacer, formed above the light emitting mesa.

In some exemplary embodiments or any combination of exemplary embodiments of the light emitting structure with coaxial micro-lenses, the height of the spacer is less than the height of the first micro-lens or height of the second micro-lens.

In some exemplary embodiments or any combination of exemplary embodiments of the light emitting structure with coaxial micro-lenses, the semiconductor substrate is an IC substrate.

Some exemplary embodiments of the present disclosure include a light emitting structure with an elliptical micro-lens structure, comprising: a light emitting mesa; at least an elliptical micro-lens, formed above the light emitting mesa, wherein a central axis of the elliptical micro-lens is not coaxially aligned with a central axis of the light emitting mesa.

In some exemplary embodiments or any combination of exemplary embodiments of the light emitting structure, the elliptical micro-lens is formed by a quarter of sphere combined with a quarter of ellipsoid.

In some exemplary embodiments or any combination of exemplary embodiments of the light emitting structure, a radius of the sphere is not more than 9 μm, and a long radius of the ellipsoid is not more than 18 μm.

In some exemplary embodiments or any combination of exemplary embodiments of the light emitting structure, an offset distance of a center of the elliptical micro-lens from a center of the light emitting mesa in the horizontal level is not more than 4.5 μm.

In some exemplary embodiments or any combination of exemplary embodiments of the light emitting structure, the material of the elliptical micro-lens is silicon oxide or organic materials.

In some exemplary embodiments or any combination of exemplary embodiments of the light emitting structure, the bottom surface of the elliptical micro-lens intersects with the central axis of the light emitting mesa.

In some exemplary embodiments or any combination of exemplary embodiments, the light emitting structure further includes a semiconductor substrate and a reflective cup, wherein the light emitting mesa is formed on the semiconductor substrate, and the light emitting mesa is surrounded by the reflective cup.

In some exemplary embodiments or any combination of exemplary embodiments of the light emitting structure, the inside wall of the reflective cup is stair-shaped.

In some exemplary embodiments or any combination of exemplary embodiments of the light emitting structure, the light emitting mesa includes: a light emitting layer; a bottom bonding layer, at a bottom of the light emitting layer and bonded with the semiconductor substrate; and a top electrode layer, covering the light emitting mesa and electrically connected with the reflective cup, wherein the reflective cup is electrically connected with the semiconductor substrate.

In some exemplary embodiments or any combination of exemplary embodiments, the light emitting structure further includes a spacer, formed between the light emitting mesa and the elliptical micro-lens.

In some exemplary embodiments or any combination of exemplary embodiments of the light emitting structure, the height of the spacer is less than the height of the elliptical micro-lens.

In some exemplary embodiments or any combination of exemplary embodiments of the light emitting structure, the height of the spacer is less than 5 μm.

In some exemplary embodiments or any combination of exemplary embodiments of the light emitting structure, the semiconductor substrate is an IC substrate.

Some exemplary embodiments of the present disclosure include a light emitting structure with a micro-lens composite structure, comprising: a light emitting mesa; and a micro-lens composite structure. In some embodiments, micro-lens composite structure includes: at least a micro-lens, formed above the light emitting mesa; and, a reflective part, formed on one side of the micro-lens.

In some exemplary embodiments or any combination of exemplary embodiments of the light emitting structure with a micro-lens composite structure, the micro-lens is a sphere with a breach at a surface of the micro-lens.

In some exemplary embodiments or any combination of exemplary embodiments of the light emitting structure with a micro-lens composite structure, the reflective part is formed on a surface of the breach.

In some exemplary embodiments or any combination of exemplary embodiments of the light emitting structure with a micro-lens composite structure, the breach has an inclined surface relative to a bottom surface of the micro-lens, and, the reflective part is a plane structure attached on the inclined surface.

In some exemplary embodiments or any combination of exemplary embodiments of the light emitting structure with a micro-lens composite structure, the breach is a depression, and, the reflective part is attached to a surface of the depression.

In some exemplary embodiments or any combination of exemplary embodiments of the light emitting structure with a micro-lens composite structure, the material of the micro-lens is silicon oxide or organic materials.

In some exemplary embodiments or any combination of exemplary embodiments of the light emitting structure with a micro-lens composite structure, the bottom surface of the micro-lens intersects with a central axis of the light emitting mesa.

In some exemplary embodiments or any combination of exemplary embodiments, the light emitting structure with a micro-lens composite structure further includes a semiconductor substrate and a reflective cup, wherein the light emitting mesa is formed on the semiconductor substrate and the light emitting mesa is surrounded by the reflective cup.

In some exemplary embodiments or any combination of exemplary embodiments of the light emitting structure with a micro-lens composite structure, the inside wall of the reflective cup is stair-shaped.

In some exemplary embodiments or any combination of exemplary embodiments of the light emitting structure with a micro-lens composite structure, the light emitting mesa includes: a light emitting layer; a bottom bonding layer, at the bottom of the light emitting layer and bonded with the semiconductor substrate; and a top electrode layer, covering the light emitting mesa and electrically connected with the reflective cup, wherein the reflective cup is electrically connected with the semiconductor substrate.

In some exemplary embodiments or any combination of exemplary embodiments, the light emitting structure with a micro-lens composite structure further includes a spacer, formed between the light emitting mesa and the micro-lens.

In some exemplary embodiments or any combination of exemplary embodiments of the light emitting structure with a micro-lens composite structure, the height of the spacer is less than height of the micro-lens.

In some exemplary embodiments or any combination of exemplary embodiments of the light emitting structure with a micro-lens composite structure, the semiconductor substrate is an IC substrate.

Some exemplary embodiments of the present disclosure include a light emitting structure, comprising: a light emitting mesa; a micro-lens formed on the light emitting mesa; and a diffraction lens covering the micro-lens.

In some exemplary embodiments or any combination of exemplary embodiments of the light emitting structure, the material of the micro-lens is different from material of the diffraction lens.

In some exemplary embodiments or any combination of exemplary embodiments of the light emitting structure, the diffraction lens is a Bragg mirror.

In some exemplary embodiments or any combination of exemplary embodiments of the light emitting structure, the center point of a top surface of the diffraction lens is on the central axis of the micro-lens.

In some exemplary embodiments or any combination of exemplary embodiments of the light emitting structure, a central axis of the diffraction lens is inclined relative to a vertical axis perpendicular to a substrate of the light emitting structure and the central axis of the micro-lens is vertical relative to the vertical axis perpendicular to the substrate of the light emitting structure.

In some exemplary embodiments or any combination of exemplary embodiments of the light emitting structure, the micro-lens has a hemisphere structure, and the diffraction lens has a polygon structure or a composite structure.

In some exemplary embodiments or any combination of exemplary embodiments of the light emitting structure, the composite structure comprises a combination of a hemisphere structure and a trapezoid structure or a combination of a hemisphere structure and a triangle structure.

In some exemplary embodiments or any combination of exemplary embodiments of the light emitting structure, the trapezoid structure is formed at a bottom of the hemisphere structure, or the triangle structure is formed at the bottom of the hemisphere structure.

In some exemplary embodiments or any combination of exemplary embodiments of the light emitting structure, the polygon structure is a trapezoid structure comprising an inclined top surface relative to a bottom surface of the trapezoid structure.

In some exemplary embodiments or any combination of exemplary embodiments of the light emitting structure, a central axis of the micro-lens and an axis passing through a center point of a top surface of the diffraction lens are coaxially aligned with a central axis of the light emitting mesa.

In some exemplary embodiments or any combination of exemplary embodiments, the light emitting structure further includes a semiconductor substrate and at least one reflective cup, wherein the light emitting mesa is formed on the semiconductor substrate, and the light emitting mesa is surrounded by the at least one reflective cup.

In some exemplary embodiments or any combination of exemplary embodiments of the light emitting structure, the inside wall of the reflective cup is stair-shaped.

In some exemplary embodiments or any combination of exemplary embodiments of the light emitting structure, the light emitting mesa includes: a light emitting layer; a bottom bonding layer at the bottom of the light emitting layer and bonded with the semiconductor substrate; and a top electrode layer, covering the light emitting mesa and electrically connected with the at least one reflective cup, and wherein the at least one reflective cup is electrically connected with the semiconductor substrate.

In some exemplary embodiments or any combination of exemplary embodiments, the light emitting structure further includes a spacer covering the light emitting mesa.

In some exemplary embodiments or any combination of exemplary embodiments of the light emitting structure, the height of the spacer is less than the height of the micro-lens.

In some exemplary embodiments or any combination of exemplary embodiments of the light emitting structure, the semiconductor substrate is an IC substrate.

Some exemplary embodiments of the present disclosure include a light emitting structure with an off-axis micro-lens structure, comprising: a light emitting mesa; and at least a micro-lens, formed above the light emitting mesa, wherein a central axis of the micro-lens is not coaxially aligned with a central axis of the light emitting mesa.

In some exemplary embodiments or any combination of exemplary embodiments of the light emitting structure with an off-axis micro-lens structure, the offset distance of the central axis of the micro-lens from the central axis of the light emitting mesa is not more than 4.5 μm.

In some exemplary embodiments or any combination of exemplary embodiments of the light emitting structure with an off-axis micro-lens structure, the offset distance between an edge of a bottom surface of the light emitting mesa and an edge of a bottom surface of the micro-lens is within 30% of a diameter of the bottom surface of the first micro-lens.

In some exemplary embodiments or any combination of exemplary embodiments of the light emitting structure with an off-axis micro-lens structure, the material of the micro-lens is silicon oxide or organic materials.

In some exemplary embodiments or any combination of exemplary embodiments of the light emitting structure with an off-axis micro-lens structure, the bottom surface of the micro-lens intersects with the central axis of the light emitting mesa.

In some exemplary embodiments or any combination of exemplary embodiments, the light emitting structure with an off-axis micro-lens structure further includes a semiconductor substrate and a reflective cup, wherein the light emitting mesa is formed on the semiconductor substrate, and the light emitting mesa is surrounded by the reflective cup.

In some exemplary embodiments or any combination of exemplary embodiments of the light emitting structure with an off-axis micro-lens structure, the inside wall of the reflective cup is stair-shaped.

In some exemplary embodiments or any combination of exemplary embodiments of the light emitting structure with an off-axis micro-lens structure, the light emitting mesa includes: a light emitting layer; a bottom bonding layer, at a bottom of the light emitting layer and bonded with the semiconductor substrate; and a top electrode layer, covering the light emitting mesa and electrically connected with the reflective cup, wherein the reflective cup is electrically connected with the semiconductor substrate.

In some exemplary embodiments or any combination of exemplary embodiments, the light emitting structure with an off-axis micro-lens structure further includes a spacer, formed between the light emitting mesa and the micro-lens.

In some exemplary embodiments or any combination of exemplary embodiments of the light emitting structure with an off-axis micro-lens structure, the height of the spacer is less than the height of the micro-lens.

In some exemplary embodiments or any combination of exemplary embodiments of the light emitting structure with an off-axis micro-lens structure, the semiconductor substrate is an IC substrate.

The design of the display devices and systems disclosed herein results in reduced viewing angle and reduced light interference that improve the light emission efficiency, resolution, and overall performance of the display systems. Thus, implementation of the display systems with micro-lens arrays can better satisfy the display requirements for Augmented Reality (AR) and Virtual Reality (VR), heads-up displays (HUD), mobile device displays, wearable device displays, high definition projectors, and automotive displays as compared with the use of conventional displays.

Note that the various embodiments described above can be combined with any other embodiments described herein. The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

For convenience, "up" is used to mean away from the substrate of a light emitting structure, "down" means toward the substrate, and other directional terms such as top, bottom, above, below, under, beneath, etc. are interpreted accordingly.

FIGS. 2A-2C each illustrate a cross-sectional view of some exemplary embodiments of the reflective cups, according to some embodiments.

Figure 1A:
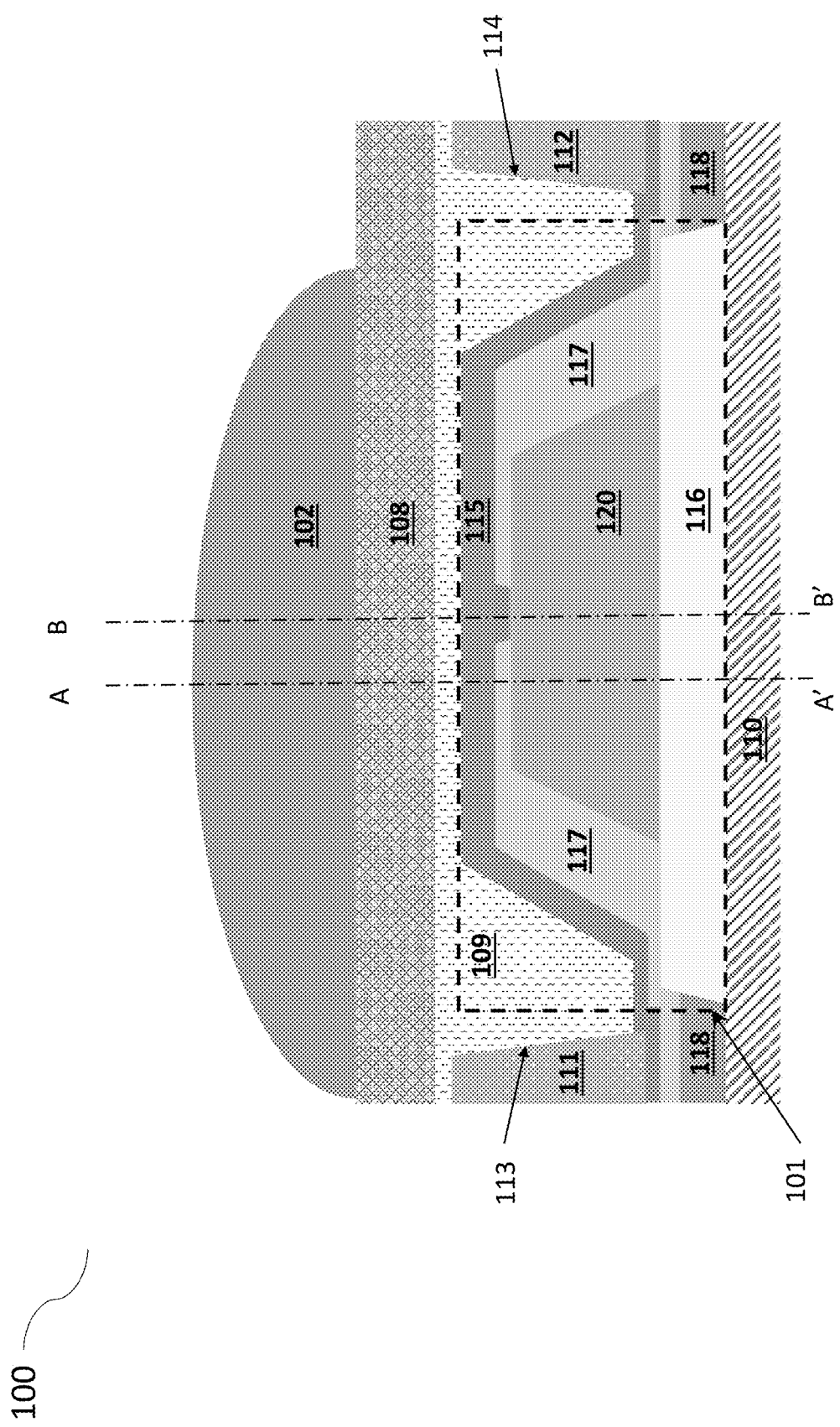
FIG. 1A illustrates a cross-sectional view of an exemplary light emitting structure, according to some embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known processes, components, and materials have not been described in exhaustive detail so as not to unnecessarily obscure pertinent aspects of the embodiments described herein.

As discussed above, in some examples, LED dies have a large divergence angle, which can cause various problems such as those discussed in the Background section. Moreover, in a projection system employing an LED array having a plurality of LED dies as a self-emissive imager device, a projection lens or a projection lens set is needed to project the image generated by the LED array, and the projection lens may have a limited numerical aperture. Thus, due to the large divergence angle of the LED dies, only a portion of the light emitted by the LED dies can be collected by the projection lens. This reduces the brightness of the LED-based projection system and/or increases the power consumption.

Embodiments consistent with the disclosure include an integrated display panel as a self-emissive imager device, including a substrate with an array of pixel driver circuits, an array of mesas which can include, for example, LED dies, formed over the substrate, and an array of micro-lens formed over the array of mesas, and methods of making the display panel. The display panel and projection systems based on the display panel combine the light source, the image forming function, and the light beam collimation function into a single monolithic device and are capable of overcoming the drawbacks of conventional projection systems. Furthermore, direction and focus of the light from the LEDs can be adjusted individually on each of the micro-lens group and light emitting mesa pairs formed on the display panel.

FIG. 1A illustrates a cross-sectional view of an exemplary light emitting structure 100, according to some embodiments. For convenience, "up" is used to mean away from the substrate 110, "down" means toward the substrate 110, and other directional terms such as top, bottom, above, below, under, beneath, etc. are interpreted accordingly. The light emitting structure 100 comprises a light emitting mesa 101, as shown in FIG. 1A within the dashed line rectangle. In some embodiments, the light emitting mesa 101 includes at least one single pixel light emitting device, such as an LED or a micro-LED, or an OLED, and light is emitted from the light emitting mesa 101. The light emitting mesa 101 has a top surface and a bottom surface. In some embodiments, the diameter or width of the top surface of the light emitting mesa 101 is in the range of 1 μm-8 μm, and the diameter or width of the bottom surface of the light emitting mesa 101 is in the range of 3 μm-10 μm. In some embodiments, the diameter or width of the top surface of the light emitting mesa 101 is in the range of 8 μm-25 μm, and the diameter or width of the bottom surface of the light emitting mesa 101 is in the range of 10 μm-35 μm. In some embodiments, the height of the light emitting mesa 101 is in the range of 1-10 μm. In some embodiments, the height of the light emitting mesa 101 is about 1.3 μm. In some embodiments, the diameter or width of the top surface of the light emitting mesa 101 is equal or more than the diameter or width of the bottom surface of the light emitting mesa 101.

In some embodiments, a display panel includes an array of single pixel light emitting devices, such as the light emitting mesa 101. In some embodiments, the distance between center axes of the two adjacent light emitting mesas is in the range of 1 μm-10 μm. In some embodiments, the distance between center axes of the two adjacent light emitting mesas may vary from about 40 μm, to about 20 μm, to about 10 μm, and/or to about 5 μm or below. In some embodiments, sizes of the mesas and distances between the light emitting mesas may depend on the resolution of the display. For example, for a display panel with 5000 Pixels Per Inch (PPI), the diameter or width of the top surface of the light emitting mesa 101 is 1.5 μm and the diameter or width of the bottom surface of the light emitting mesa 101 is 2.7 μm. In some embodiments, the distance between the closest bottom edges of two adjacent light emitting mesas may be in the range of 1 μm-10 μm. In some embodiments, the distance between the closest bottom edges of two adjacent light emitting mesas is 2.3 μm.

In some exemplary embodiments, the light emitting structure 100 further comprises a micro-lens. As shown in FIG. 1A, the light emitting structure 100 may comprise a micro-lens 102 formed above the light emitting mesa 101. In some embodiments, the micro-lens 102 is positioned relative to the light emitting mesa 101, and to reduce the divergence of the light emitting from the light emitting mesa 101 and decrease usable viewing angle from the single pixel LED device. As shown in FIG. 1A, the micro-lens 102 has a vertical central axis A-A', and the light emitting mesa 101 has a vertical central axis B-B'. The vertical central axis is perpendicular to the surface of the substrate 110. The central axis may refer to a straight line passing any two center points of a figure. For example, the central axis of the micro-lens 102 (i.e., the central axis A-A') passes through the center point of the top surface of the micro-lens 102 and the center point of the bottom surface of the micro-lens 102.

In some embodiments, the micro-lens 102 is off-axially stacked on the light emitting mesa 101, i.e., the central axis A-A' of the micro-lens 102 is not coaxially aligned with, does not overlap or coincide with the central axis B-B' of the light emitting mesa 101. In some embodiments, the horizontal distance between the central axis A-A' of the micro-lens 102 and central axis B-B' of the light emitting mesa 101 is at least 1 μm, 2 μm, 5 μm or 10 μm. In some embodiments, the horizontal distance between the central axis A-A' of the micro-lens 102 and central axis B-B' of the light emitting mesa 101 is no more than 4.5 μm. In some instances, the horizontal offset distance may be less than half of the diameter of the bottom surface of the light emitting mesa 101, less than a quarter of the diameter of the bottom surface of the light emitting mesa 101. Therefore, the divergence can be reduced and the usable viewing angle can be decreased to the extent that displays and panels using the single pixel LED devices may be seen by several users. This can also reduce power waste, increase brightness and/properly protect user privacy in public areas.

In some other embodiments (not shown in FIG. 1A), micro-lens 102 is co-axially aligned to the light emitting mesa 101 along the A-A' direction, and the horizontal distance between the central axis A-A' of the micro-lens 102 and central axis B-B' of the light emitting mesa 101 is 0. All of the light emitted from the light emitting mesa 101 can directly arrive at and pass through the micro-lens 102. Therefore, the divergence can be reduced and the useable viewing angle can be decreased to the extent that displays and panels using the single pixel LED devices may be seen by a user's view perpendicular to surfaces of the displays and panels when the central axis A-A' of the micro-lens 102 and central axis B-B' of the light emitting mesa 101 are the same. This, in turn, can reduce power waste and increase brightness and/or better protect user privacy in public areas. In another example, a part of the light emitted from the light emitting mesa 101 can directly arrive at and pass through the micro-lens 102, and another part of the light emitted from the light emitting center can pass around or bypass the micro-lens 102. Thus, the brightness of the light emitting structure can be adjusted.

In some embodiments, the structure of the micro-lens may include one element with one plane surface and one convex surface. For example, as shown in FIG. 1A, the structure of the micro-lens 102 may be hemisphere. The structure of the micro-lens 102 may also be semi-ellipsoid, semi-oval, or other single element with one plane surface and one convex surface. In some embodiments, the structure of the micro-lens 102 may also be a polygon structure or a composite structure. For example, the composite structure may comprise a hemisphere and a cylinder positioned under the plane surface of the hemisphere. For another example, the composite structure may be formed by a quarter of sphere combined with a quarter of ellipsoid. In this example, the radius of the sphere may not be more than 9 μm and the long radius of the ellipsoid may not be more than 18 μm. Yet in some embodiments, the micro-lens may have a triangular or rectangular footprint while having a curved surface.

In some embodiments, the micro-lens may further include a reflective part which can adjust the light path. For example, the micro-lens 102 may include an inclined surface formed on one side of the surface of the micro-lens 101 and the reflective part may be formed on the inclined surface. In one example, the reflective part may be a plane attached to the inclined surface. In another example, the reflective part may be a curved or wavy surface.

In some embodiments, the material of the micro-lens may comprise inorganic or plastic (organic) materials that are transparent to the light emitted from the light emitting structure 100. For example, the preferred material of the micro-lens 102 may be silicon oxide. In some embodiments, the inorganic materials include silicon oxide, silicon nitride, silicon carbide, titanium oxide, zirconium oxide, aluminum oxide, Phosphosilicate glass (PSG), or Borophosphosilicate glass (BPSG), or any combination thereof. In some embodiments, the plastic materials include polymers such as SU-8, PermiNex, Benzocyclobutene (BCB), or transparent plastic (resin) including spin-on glass (SOG), or bonding adhesive Micro Resist BCL-1200, or any combination thereof.

In some embodiments, micro-lenses composed of inorganic or organic materials are formed by patterning with a mask, a photolithography process, and then etching. In some embodiments, micro-lenses composed of organic materials are formed by patterning with a mask, a photolithography process, and then a reflow process at a high temperature.

In some embodiments, a first method for fabricating a micro-lens includes a step of depositing a micro-lens material layer directly on at least the top of the pixel light source and in direct physical contact with the pixel light source. In some embodiments, the shape of the micro-lens material layer is conformed to the shape of the pixel light source and forms a hemisphere on the pixel light source. In some embodiments, the top of the pixel light source is generally flat and the shape of the formed micro-lens 102 is generally hemispheric. In some embodiments, the micro-lens material layer is deposited on the surface of the pixel light source, such as the planarized surface of the single pixel tri-color LED device, directly by chemical vapor deposition (CVD) technology. In some embodiments, the deposition parameters for the CVD process are: the power is about 0 W to about 1000 W, the pressure is about 100 milli-torr to about 2000 milli-torr, the temperature is around 23° C. to around 500° C., the gas flow is about 0 to about 3000 sccm (standard cubic centimeters per minute), and the time is about 1 hour to about 3 hours. In some embodiments, the material of the micro-lens material layer is a dielectric material such as silicon dioxide.

In some embodiments, the first method for fabricating a micro-lens further includes a step of patterning the micro-lens material layer to expose the electrode area of the substrate. In some embodiments, the step of patterning the micro-lens material layer includes an etching step. In some embodiments, the etching step includes a step of forming a mask on the surface of the micro-lens material. The etching step also includes a step of patterning the mask via a photolithography process, thereby forming openings in the mask and exposing the micro-lens material layer above the electrode area of the pixel light source. The etching step further includes a step of etching the portions of the micro-lens material layer exposed by the openings with the mask protection in place. In some embodiments, the exposed micro-lens material layer is etched by a wet etching method.

In some embodiments, a second method for fabricating a micro-lens also includes an optional step of forming a mark layer with marks for aligning to the micro-lens material layer deposited in later steps. For example, the mark layer is formed to align the units of the light emitting pixels to the micro-lens material layer in order to form the micro-lens at the center of the pixel light source. In some embodiments, the mark layer is formed to align the pixel light source to the layers above it especially the micro-lens material layer in order to form the micro-lens on the top of the pixel light source.

Figure 1B:
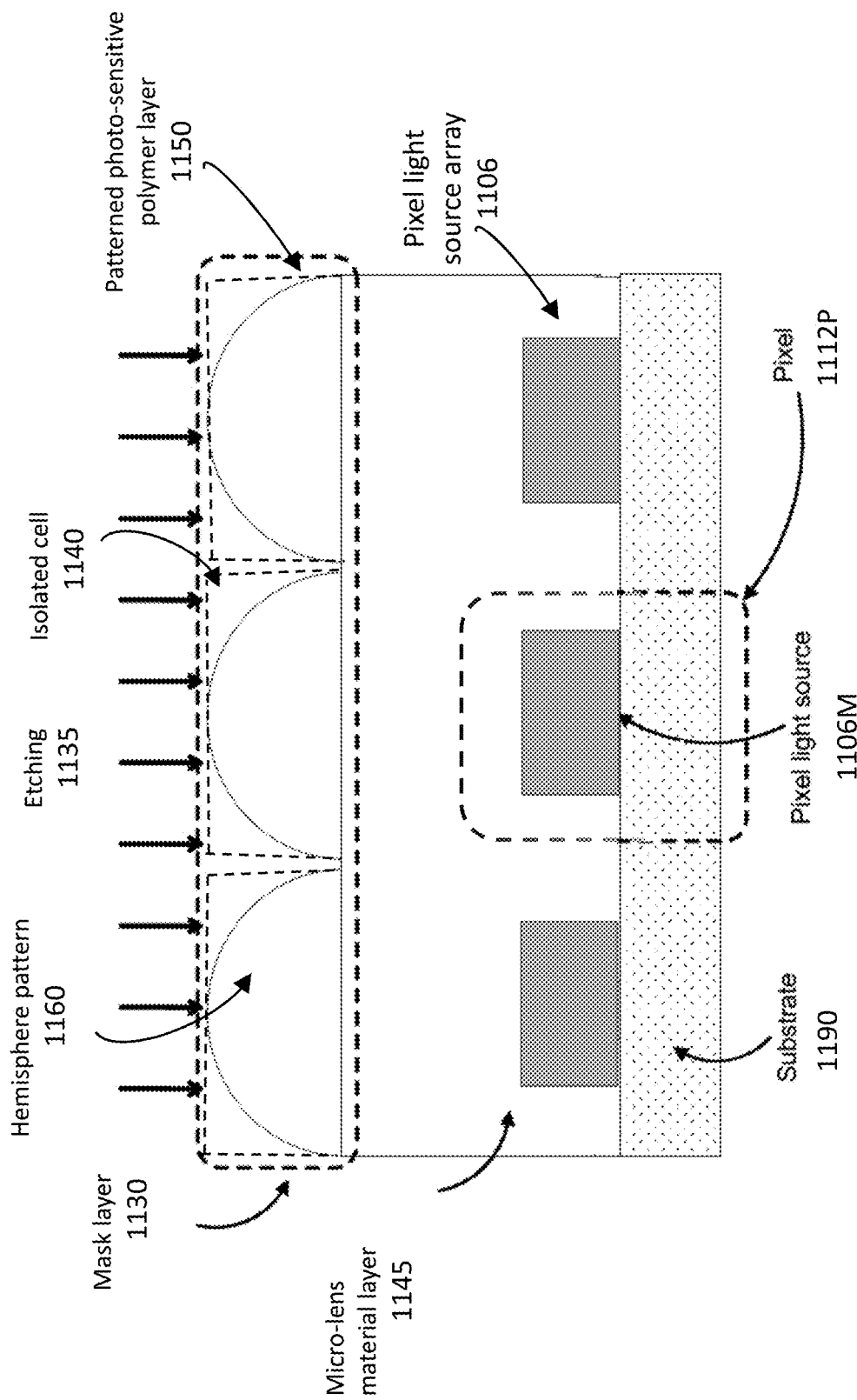
FIG. 1B illustrates a fabrication method to form a display panel integrated with a micro-lens array using top down pattern transfer, according to some embodiments.
Figure 1C:
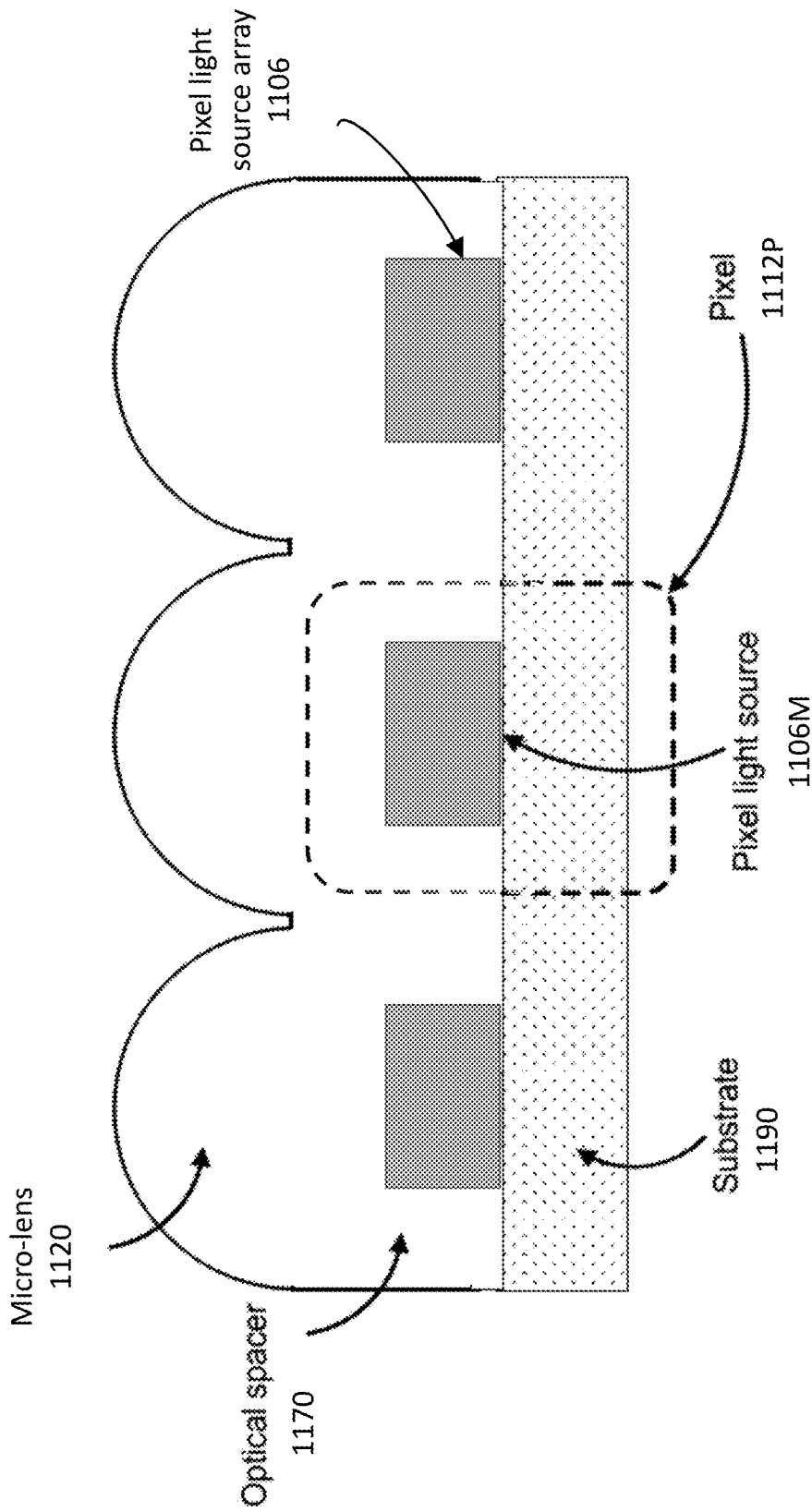
FIG. 1C illustrates a fabrication method to form a display panel integrated with a micro-lens array using top down pattern transfer, according to some embodiments.

The second method for fabricating a micro-lens further includes a step of depositing a micro-lens material layer directly on at least the top of one pixel light source. FIGS. 1B-1C further show a fabrication method to form a display panel integrated with a micro-lens array using top down pattern transfer, according to some embodiments. In some embodiments, the micro-lens material layer 1145 covers the top of the pixel light source 1106M as shown in FIG. 1B and the top surface of the micro-lens material layer 1145 is flat. In some embodiments, the micro-lens material layer 1145 is deposited on the top of the pixel light source array 1106 by spin coating. In some embodiments, the material of the micro-lens material layer 1145 is photoresist. In some embodiments, the material of the micro-lens material layer 1145 is dielectric material such as silicon oxide.

The second method for fabricating a micro-lens further includes a step of patterning the micro-lens material layer from the top down, thereby forming at least a hemisphere in the micro-lens material layer as shown in FIGS. 1B-1C. In some embodiments, the patterning is carried out without passing through or etching to the bottom of the micro-lens material layer 1145. In some embodiments, the hemisphere of the micro-lens 1120 is placed above at least one pixel light source 1106M.

In some embodiments, the step of patterning the micro-lens material layer from the top down further includes a first step of depositing a mask layer 1130 on the surface of the micro-lens material layer 1145 as shown in FIG. 1B.

The step of patterning the micro-lens material layer from the top down also includes a second step of patterning the mask layer 1130 to form a hemisphere pattern in the mask layer 1130. In some examples, the mask layer 1130 is patterned by a photolithography process firstly and then a reflowing process. In some embodiments, the photo-sensitive polymer mask layer 1130 is patterned into isolated cells 1140, as shown in FIG. 1B in dotted rectangle cells, to prepare for the formation of the hemisphere pattern. As one example, the isolated cells 1140 are patterned and formed via a photo-lithography process. The patterned photo-sensitive polymer mask layer 1150 with the isolated cells 1140 is then shaped into hemisphere pattern 1160 using high temperature reflow process. In one approach, the isolated cells 1140 are formed into isolated hemisphere pattern 1160 via high temperature reflow. In some embodiments, the isolated hemisphere pattern 1160 of one pixel is not in direct physical contact with a hemisphere pattern of an adjacent pixel. In some embodiments, the hemisphere pattern 1160 of one pixel only contacts with a hemisphere pattern of an adjacent pixel at the bottom of the hemisphere pattern 1160. The patterned photo-sensitive polymer mask layer 1150 is heated to a temperature above the melting point of the polymer material for a certain time. After the polymer material melts into a liquefied state, the surface tension of the liquefied material will render it into a shape with a smooth curvature surface. For a cell with a round base of a radius R when the height of the cell is 2R/3, a hemispherical shape/pattern will be formed after the reflow process. FIG. 1B shows a display panel integrated with the array of hemisphere patterns 1160 after the high temperature reflow process is finished. In some embodiments, the hemisphere pattern in the mask layer can be formed by other fabrication method including the fabrication method for the micro-lens described in the first method for fabricating a micro-lens. In some other embodiments, the hemisphere pattern in the mask layer can be formed using grayscale mask photolithography exposure. In some other embodiments, the hemisphere pattern in the mask layer can be formed via a mold/imprinting process.

The step of patterning the micro-lens material layer from the top down further includes a third step of using the hemisphere pattern 1160 as a mask, etching the micro-lens material layer 1145 to form the hemisphere in the micro-lens material layer 1145. In some examples, etching the micro-lens material layer 1145 is by a photolithography process. In some examples, etching the micro-lens material layer 1145 is by a dry etching such as plasma etching process 1135 as shown in FIG. 1B. In some embodiments, after the micro-lens material layer 1145 is etched, the micro-lens material layer 1145 is not etched through to expose the top surface of the pixel light source 1106M as shown in FIGS. 1B-1C, thereby a spacer 1170 is formed on the top of the pixel light source 1106M or covering the top of the pixel light source 1106M as shown in FIG. 1C.

The second method for fabricating a micro-lens further includes a step of patterning the micro-lens material layer to expose the electrode area (not shown in FIG. 1C) of the substrate. In some embodiments, the step of patterning the micro-lens material layer includes an etching step. In some embodiments, the etching step includes a step of forming a mask on the surface of the micro-lens material. The etching step also includes a step of patterning the mask via a photolithography process, thereby forming openings in the mask and exposing the micro-lens material layer above the electrode area of the pixel light source. The etching step further includes a step of etching the exposed micro-lens material layer with the mask protection. In some embodiments, the exposed micro-lens material layer is etched by a wet etching method. In some embodiments, the opening for an electrode is positioned outside the display array area.

As described above, FIGS. 1B to 1C show various fabrication methods to form a display panel integrated with a micro-lens array. It should be understood that these are merely examples, and other fabrication techniques can also be used.

Although the detailed description contains many specifics, these should not be construed as limiting the scope of the invention but merely as illustrating different examples and aspects of the invention. It should be appreciated that the scope of the invention includes other embodiments not discussed in detail above. For example, micro-lenses with different shape bases may also be used, such as square base or other polygon base.

In some exemplary embodiments, the light emitting structure 100 may further comprise a spacer covering the light emitting mesa. For example, as shown in FIG. 1A, the light emitting structure 100 may comprise a spacer 108 covering the light emitting mesa 101. The spacer 108 may be an optically transparent layer formed to provide a proper spacing between the micro-lens 102 and the light emitting mesa 101. Thus, the light emitted from the light emitting mesa 101 can pass through the spacer 108 and then arrive at the micro-lens 102. In some embodiments, the spacer 108 may also fill up the area surrounding the light emitting mesa 101 and increase the refractive index of the medium surrounding the light emitting mesa 101. Therefore, the spacer 108 may change the optical path of the light emitted from the light emitting mesa 101. In some embodiments, the spacer 108 may be positioned between the light emitting mesa 101 and the micro-lens 102. In some embodiments, a top surface of the spacer 108 may be planarized. In some embodiments, the spacer 108 may be formed directly on the surface of a planarized insulation layer 109, as shown in FIG. 1A. In some embodiments, the spacer 108 may cover and be in contact with the exposed top surface of a conductive layer, such as the conductive layer 115 as shown in FIG. 1A. In some embodiments, the spacer 108 may be integrated with the micro-lens 102. In some embodiments, the spacer 108 may be the same as or part of the planarized insulation layer 109 and integrated with the planarized insulation layer 109.

In some embodiments, the spacer 108 extends the light path emitted from the light emitting mesa 101. In some embodiments, the spacer 108 changes the light path emitted from the single pixel LED device by making the light emitted from the LED device more focused or more divergent according to the design needs.

In some embodiments, the dimension of the bottom surface of the micro-lens 102 may be smaller than the dimension of the bottom surface of the light emitting mesa 101. In some embodiments, the dimension of the bottom surface of the micro-lens 102 may be the same or greater than the dimension of the bottom surface of the light emitting mesa 101, as shown in FIG. 1A.

In some embodiments, the spacer 108 can be made from a variety of materials that are transparent at the wavelengths emitted from the light emitting mesa 101. Example transparent materials for the spacer 108 include polymers, dielectrics and semiconductors. In some embodiments, the spacer 108 may comprise one or more dielectric materials. In some embodiments, the dielectric materials include one or more materials, such as silicon oxide, silicon nitride, silicon carbide, titanium oxide, zirconium oxide, aluminum oxide. In some embodiments, the spacer 108 is made of photoresist. In some embodiments, the spacer 108 and the micro-lens 102 have the same material. In some embodiments, the spacer 108 and the micro-lens 102 have different materials.

In some exemplary embodiments, the height of the spacer may be less than the height of the micro-lens. For example, as shown in FIG. 1A, the height of the spacer 108 may be less than the height of the micro-lens 102. In some exemplary embodiments, the height of the spacer 108 may be equal to or more than the height of the micro-lens 102. In some embodiments, the height of the spacer formed between the one light emitting mesa and one micro-lens may not be equal to the height of the spacer formed between another light emitting mesa and another micro-lens within the same display panel. In other embodiments, the height of the spacer formed between one light emitting mesa and one micro-lens may not be even. For example, as for the height of the spacer formed between the light emitting mesa 101 and the first micro-lens 102, the height of the spacer at the central axis A-A' may be smaller than the height of the space at the central axis B-B'.

In some exemplary embodiments, the light emitting structure 100 may further comprise a semiconductor substrate and at least one reflective cup. The light emitting mesa may be formed on the semiconductor substrate, and the edges/edge surfaces of the light emitting mesa may be surrounded by the at least one reflective cup. A reflective cup is a structure that is located relative to the light emitting mesa 101 in order to reflect light emitted from the light emitting mesa 101 in a substantially upward direction. In some embodiments, a reflective cup forms a round sidewall around the light emitting mesa 101 and includes multiple parts such as reflective cup parts 111 and 112. For example, as shown in FIG. 1A, the light emitting structure 100 may comprise a semiconductor substrate 110 and reflective cup parts 111 and 112. The light emitting mesa 101 may be formed on the semiconductor substrate 110, and surrounded by the reflective cup parts 111 and 112. The reflective cup parts 111 and 112 may be formed on the semiconductor substrate 110.

In some exemplary embodiments, the semiconductor substrate 110 may be an integrated circuitry (IC) substrate. The light emitting mesa may be driven by the IC individually or collectively. In some embodiments, the semiconductor substrate 110 may be another electric conductive substrate.

In some embodiments, the reflective cup parts 111 and 112 can isolate at least some of the light or substantially all the light emitted from the light emitting mesa 101. For example, as shown in FIG. 1A, when the heights of the reflective cup parts 111 and 112 are higher than the height of the light emitting mesa 101, the reflective cup parts 111 and 112 can prevent some or substantially all the light emitted from adjacent light emitting mesas around the light emitting mesa 101 from interfering the light emitted from the light emitting mesa 101. Therefore, the reflective cup parts 111 and 112 can suppress the inter-pixel light crosstalk and improve the overall contrast of LED displays using the light emitting structure 100. In some embodiments, reflection from the reflective cups can also increase the light emitting efficiency and brightness by focusing the light emission into a certain direction. For example, some of the light emitted from the light emitting mesa 101 may arrive at and be reflected upward by the reflective cup parts 111 and 112.

In some embodiments, the heights of the reflective cup parts 111 and 112 may be larger than the height of the light emitting mesa 101. In some embodiments, the heights of the reflective cup parts 111 and 112 may be equal to or lower than the height of the light emitting mesa 101. In some embodiments, the heights of the reflective cup parts 111 and 112 may be between 0.5 micron to 50 microns. In some embodiments, the heights of the reflective cup parts 111 and 112 may be between 1 micron to 20 microns. In some embodiments, the heights of the reflective cup parts 111 and 112 may be between 2 microns to 10 microns. In a preferred embodiment, the heights of the reflective cup parts 111 and 112 is about 2.5 microns while the height of the light emitting mesa 101 is about 1.9 microns. In some embodiments, the heights of the reflective cups may vary. For example, the height of the reflective cup part 111 may be different than the height of the reflective cup part 112.

In some embodiments, the top surface of the spacer 108 may be above top surfaces of the reflective cup parts 111 and 112. In some embodiments, the top surface of the spacer 108 may be at the same height as or below the top surfaces of the reflective cup parts 111 and 112. In some embodiments, the top surface of the spacer 108 may be at the same height as or below the top surfaces of the reflective cup part 111 but higher that the top surface of the reflective cup part 112.

An inside wall of the reflective cup may refer to the surface facing the light emitting mesa. For example, as shown in FIG. 1A, the inside wall 113 of the reflective cup 111 part and the inside wall 114 of the reflective cup part 112 may face the light emitting mesa 101. Shapes of the inside wall of the reflective cup may be various. In some embodiments, the inside wall of the reflective cup may be straight, such as the inside walls 113 and 114 as shown in FIG. 1A. In some embodiments, steepness of the inside walls of the reflective cup parts 111 and 112 may be designed to decrease the divergence of the light emitted from the light emitting mesa 101. For example, the angle of the inside wall of the reflective cup 111 relative to a vertical axis perpendicular to the semiconductor substrate 110 may be from at least 5 degrees to at most 75 degrees. In another example, the angle of the inside wall of the reflective cup 111 relative to a vertical axis perpendicular to the semiconductor substrate 110 may be from at least 10 degrees to at most 50 degrees.

In some embodiments, the inside wall of the reflective cup may be curved, wavy, multiline or a combination thereof. Detailed structures of the inside wall of the reflective cup would be further described below with some exemplary embodiments in FIGS. 2A-2C.

In some embodiments, the reflective cup may comprise metal. In some embodiments, the reflective cup may comprise dielectric material such as silicon oxide. In some embodiments, the reflective cup may comprise photosensitive dielectric material. In some embodiments, the photosensitive dielectric material may comprise SU-8, photosensitive polyimide (PSPI), or Benzocyclobutene (BCB). In other embodiments, the reflective cup may comprise photoresist material.

In some exemplary embodiments, a light emitting mesa 101 may include a conductive electrode layer 115 as a covering layer at the top of the light emitting mesa 101. In some embodiments, a light emitting mesa 101 includes a light emitting layer 120. In general, an LED light emitting layer includes a PN junction/diode with a p-type region/layer and an n-type region/layer, and an active layer between the p-type region/layer and n-type region/layer.

The conductive electrode layer may be electrically connected with the reflective cup including reflective cup parts 111 and 112, and may further electrically connected with the light emitting layer, such as light emitting layer 120 of the light emitting mesa 101. In one example, as shown in FIG. 1A, the conductive electrode layer 115 may be electrically connected to the reflective cup parts 111 and 112 at the bottom of each of the reflective cup parts 111 and 112 respectively. In another example, not shown in FIG. 1A, the conductive electrode layer 115 may be electrically connected to the reflective cup parts 111 and 112 at the top of each of the reflective cup parts 111 and 112 respectively. The conductive electrode layer may cover the light emitting layer 120 and further be electrically connected with the light emitting layer 120 at the top thereof. In another example, the conductive electrode layer 115 may be electrically connected to the reflective cup parts 111 and 112 at the inside walls, such as 113 and 114, of each of the reflective cup parts 111 and 112 respectively. In some embodiments, the conductive electrode layer 115 may be formed between the light emitting layer 120 and the micro-lens 102. In some embodiments, the conductive electrode layer 115 may be formed between the spacer 108 and the light emitting layer 120. In some embodiments, the conductive electrode layer 115 may be made of materials such as graphene, Indium Tin Oxide (ITO), Aluminum-Doped Zinc Oxide (AZO), or Fluorine doped Tin Oxide (FTO), or any combinations thereof. In some embodiments, the conductive electrode layer 115 may be transparent and some of the light emitted from the light emitting layer 120 may pass through the conductive electrode layer 115.

In some exemplary embodiment, the light emitting mesa 101 may further comprise one or more metal bonding layer (e.g., metal bonding layer 116) formed on the semiconductor substrate 110. The metal bonding layer may be electrically connected with the light emitting mesa 101. For example, as shown in FIG. 1A, the light emitting mesa 101 may comprise the metal bonding layer 116 at the bottom of the light emitting mesa 101. The metal bonding layer 116 may be formed on the semiconductor substrate 110. The metal bonding layer 116 may be further formed at the bottom of the light emitting mesa 101 and electrically connected with the light emitting layer 120. In some embodiments, the metal bonding layer 116 has an oblique side surface. The oblique side surface may enhance easy connections for different connectors to the LED light emitting layers, prevent disconnections of those connectors because of sharp angles, and enhance the overall stability of the device. In some embodiments, the metal bonding layer 116 can also be used as a reflector to reflect light emitted from the LED layers above.

In some embodiments, the metal bonding layer 116 is electrically connected to both a driver circuit on the semiconductor substrate 110 and the light emitting layer 120 above the metal bonding layer 116, acting like a P-electrode. In some embodiments, the thickness of the metal bonding layer 116 is about 0.1 micron to about 3 microns. In other embodiments, the thickness of a metal bonding layer 116 is about 0.3 µm. The metal bonding layer 116 may include ohmic contact layers, and metal bonding layers. In some embodiments, two metal layers may be included in the metal bonding layer 116. One of the metal layers may be deposited the layer above the metal bonding layer within the light emitting structure 100. A counterpart bonding metal layer may be also deposited on the semiconductor substrate 110.

In some embodiments, compositions for the metal bonding layer 116 include Au—Au bonding, Au—Sn bonding, Au—In bonding, Ti—Ti bonding, Cu—Cu bonding, or a mixture thereof. For example, if Au—Au bonding is selected, the two layers of Au respectively need a Cr coating as an adhesive layer, and Pt coating as an anti-diffusion layer. And the Pt coating is between the Au layer and the Cr layer. The Cr and Pt layers are positioned on the top and bottom of the two bonded Au layers. In some embodiments, when the thicknesses of the two Au layers are about the same, under a high pressure and a high temperature, the mutual diffusion of Au on both layers bond the two layers together. Eutectic bonding, thermal compression bonding, and transient liquid phase (TLP) bonding are example techniques that may be used.

In some exemplary embodiments, the light emitting structure 100 may further include some isolation structures such as 118 between the light emitting mesas, such as the light emitting mesa 101, on the substrate 110. The isolation structure 118 is formed on the substrate 110. In some embodiments, the isolation structure 118 is thinner than the bonding layer 116. In some embodiments, the isolation structure 118 is made of dielectric materials, such as SiO2. In some embodiments, the dielectric materials of the isolation structure 118 can be inorganic or organic materials.

In some exemplary embodiments, the light emitting structure 100 may further include an insulation layer 117 on the surface of the light emitting layer 120, and on the surfaces of the isolation structures 118 and the bonding layer 116. In some embodiments, the conductive electrode layer 115 is then formed on the surface of the insulation layer 117. In some embodiments, the insulation layer 117 is made of dielectric materials, such as SiO2. In some embodiments, the dielectric materials of the insulation layer 117 can be inorganic or organic materials.

FIGS. 2A-2C each illustrate a cross-sectional view of some exemplary embodiments of the reflective cups, which may correspond to the reflective cup parts 111 and/or 112 in FIG. 1A, according to some embodiments. In some embodiments, as shown in FIG. 2A, the reflective cup 201 may comprise an inside wall 201a facing the light emitting mesa 101. The inside wall 201a may be curved so as to reflect some of the light emitted from the light emitting mesa 101 upwardly. In some embodiments, as shown in FIG. 2B, the inside wall of the reflective cup 202 may be multiline which includes the sub-inside walls 202A, 202B and 202C. The sub-inside walls 202A, 202B and 202C face towards the light emitting mesa 101 so that some of the light emitted from the light emitting mesa may be reflected by the sub-inside walls 202A, 202B and 202C upwardly. Each of the sub-inside walls may also adjust the focus for the light emitted (especially horizontally) in a different pattern. In some embodiments, steepness (the angle of the inside wall of the reflective cup relative to a vertical axis perpendicular to the semiconductor substrate 110) of each of the sub-inside walls (relative to the bottom of the reflective cup 202) from bottom to top of the reflective cup 202 may become greater. In other embodiments, the steepness of each of the sub-inside walls (relative to the bottom of the reflective cup 202) from bottom to top of the reflective cup 202 may become smaller. In other embodiments, steepness of each of the sub-inside walls (relative to the bottom of the reflective cup 202) from bottom to top of the reflective cup 202 may be randomly selected.

Yet in some embodiments, as shown in FIG. 2C, the inside wall of the reflective cup 203 may be stair-shaped. The reflective cup 203 may include one or more stair structures (e.g., stair structures 203-1, 203-2 and 203-3). Each of the one or more stair structures may comprise a sub-inside wall (e.g., sub-inside walls 203a, 203b and 203c, respectively). Similar to the reflective cup 202 mentioned above, the reflective cup 203 can also reflect some of the light emitted from the light emitting mesa upwardly, and adjust the focus for the light emitted (especially horizontally) in a different pattern, for example, by changing each of the sub-inside walls' steepness and height.

In some embodiments, the reflective cup can be fabricated by a combination of deposition, photo-lithography and etching processes. In some embodiments, the reflective cup may be fabricated by other suitable methods. In one example, the reflective cup may be fabricated by the steps: 1) PSPI is formed into the reflective cup shape by photolithography process; 2) a metal layer with high reflectivity (Pt, Rh, Al, Au, Ag), TiO2/SiO2 stacked layer (Distributed Bragg Reflector (DBR)), or any other layer with total reflection property (ODR) is deposited on the whole surface by vapor deposition; and 3) the reflective layer is shaded by a photoresist while the reflective layer on the other region is etched, whereby the light emitting area is exposed into air. In another example, the reflective cup may be fabricated by the steps: 1) an isolation layer (SiO2, SiN or SU8) which is thicker than the light emitting structure is deposited or spinned on the light emitting structure; 2) using the photoresist as a mask, the reflective cup shape is etched in the isolation layer; 3) a metal layer with high reflectivity (Pt, Rh, Al, Au, Ag), TiO2/SiO2 stacked layer (DBR), or any other layer with total reflection property (ODR) is deposited on the whole surface by vapor deposition; and 4) the reflective layer is shaded by a photoresist while the reflective layer on the other region is etched, whereby the light emitting area is exposed.

In some embodiments, the reflective cup may further include one or more reflective coatings. The one or more reflective coatings may be disposed on one or more inside walls of the reflective cup, e.g., the inside walls 113, 114, and 201a, the sub-inside walls 202A, 202B and 202C, and the sub-inside walls 203a, 203b and 203c. The bottom of each of the one or more reflective coatings does not contact the light emitting mesa, e.g., the light emitting mesa 101 as described in FIG. 1A (not shown in FIG. 2). The one or more reflective coatings can reflect light emitted from the light emitting mesa and therefore enhance the brightness and luminous efficacy of micro-LED panels or displays. For example, the light emitted from the light emitting mesa may arrive at the one or more reflective coatings and may be reflected upward by the one or more reflective coatings.

In some embodiments, the one or more reflective coatings, together with the reflective cup, can utilize reflection direction and/or reflection intensity of the light emitted from the light emitting mesa. For example, the sub-inside walls 203a, 203b and 203c may be inclined at a certain angle, and therefore the one or more reflective coatings disposed on the sub-inside walls 203a, 203b and 203c are inclined at the same angle as the sub-inside walls 203a, 203b and 203c. When the light emitted from the light emitting mesa arrives at the one or more reflective coatings, the light emitted from the light emitting mesa would be reflected by the one or more reflective coatings in accordance with the angle of the sub-inside walls 203a, 203b and 203c.

Materials of the one or more reflective coatings may be highly reflective with a reflectivity greater than 60%, 70% or 80%, and therefore most of the light emitted from the light emitting mesa can be reflected. In some embodiments, the one or more reflective coatings may comprise one or more metallic conductive materials with high reflectivity. In these embodiments, the one or more metallic conductive materials may comprise one or more of aluminum, gold or silver. In other some embodiments, the one or more reflective coatings can be multi-layered. To be more specific, the one or more reflective coatings may comprise a stack of one or more reflective material layers and one or more dielectric material layers. For example, the one or more reflective coatings may comprise one reflective material layer and one dielectric material layer. In some other embodiments, the one or more reflective coatings may comprise two reflective material layers and one dielectric material layer positioned between the two reflective material layers. Yet in some other embodiments, the one or more reflective coatings may comprise two dielectric material layers and one reflective material layer positioned between the two dielectric material layers. In some embodiments, the multi-layered structure may comprise two or more metal layers, which may comprise one or more of TiAu, CrAl or TiWAg.

In some embodiments, the one or more reflective coatings may be multi-layered Omni-Directional Reflector (ODR), which comprises a metal layer and a Transparent and Conductive Oxides (TCO) layer. For example, the multilayered structure may comprise a dielectric material layer, a metal layer and a TCO layer. In some embodiments, the one or more reflective coatings may comprise two or more dielectric material layers, which are disposed alternately to form a DBR. For example, the one or more reflective coatings may comprise a dielectric material layer, a metal layer and a transparent dielectric layer. The transparent dielectric layer may comprise one or more of $SiO_2$, $Si_3N_4$, $Al_2O_3$, or $TiO_2$. The one or more reflective coatings may further comprise a dielectric material layer, a TCO and a DBR. In other embodiments, the one or more reflective coatings may comprise one or more metallic conductive materials with high reflection. In these embodiments, the one or more metallic conductive materials may comprise one or more of aluminum, gold or silver.

In some embodiments, the one or more reflective coatings can be conductive, and then the one or more reflective coatings may also perform functions as electrical contacts to the light emitting structure 100. For example, the light emitting mesa 101 may be electrically connected with the one or more reflective coatings. The one or more reflective coatings may be patterned to not block light emitted from the light emitting mesa. The one or more reflective coatings may then also function as the common electrode for the LED device and/or the LEDs on a display panel.

Figure 3:
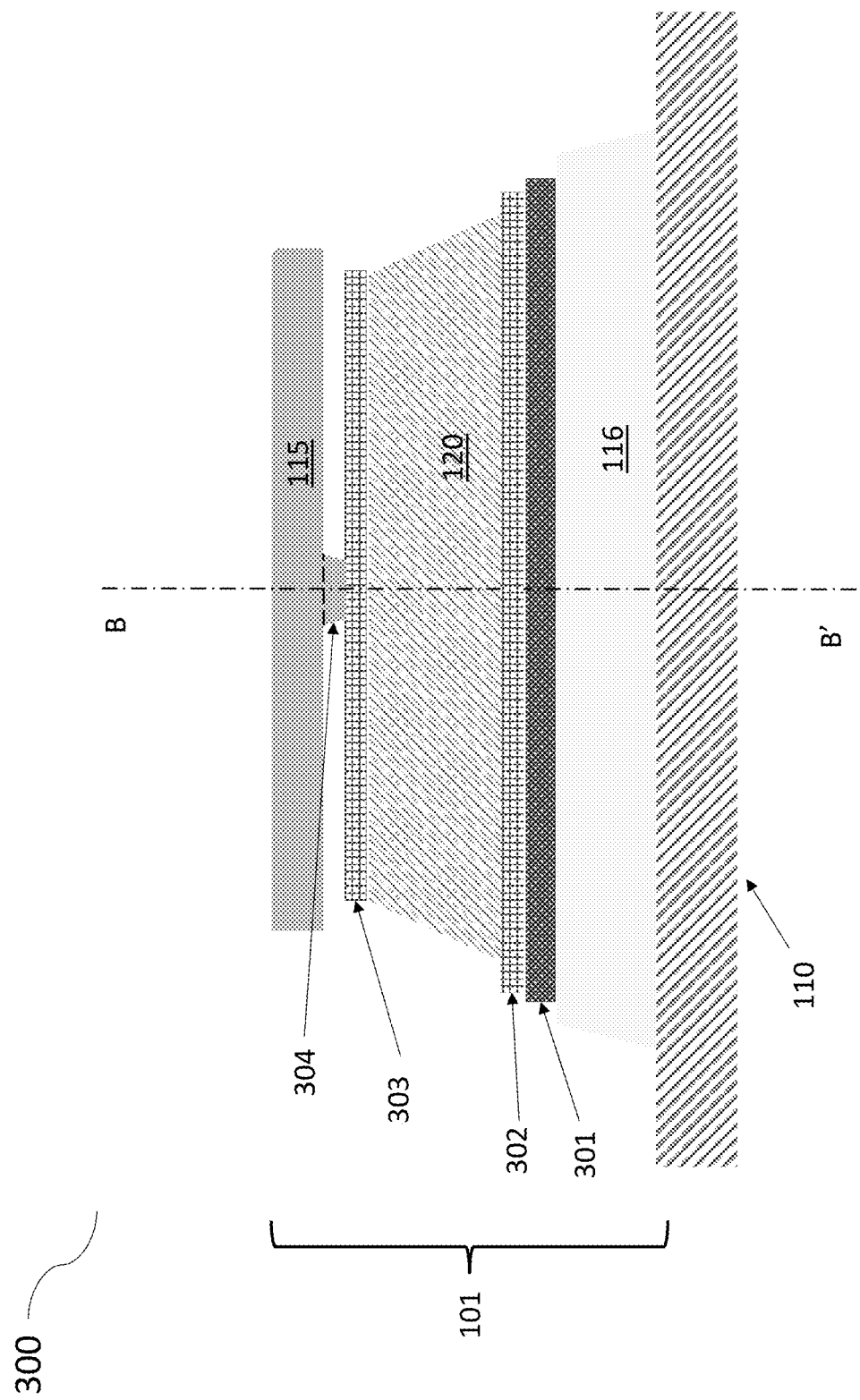
FIG. 3 illustrates a cross-sectional view of an exemplary structure of the light emitting mesa on the substrate in FIG. 1A, in accordance with some embodiments.

FIG. 3 illustrates a cross-sectional view 300 of an exemplary structure of the light emitting mesa 101 on the substrate 110 in FIG. 1A, in accordance with some embodiments. As described in FIG. 1A, the light emitting mesa 101 may include at least one light emitting layer (e.g., light emitting layer 120), a bottom bonding layer (e.g., bottom bonding layer 116) at the bottom of the light emitting layer 120 and bonded with the semiconductor substrate 110. In some embodiments, the light emitting mesa 101 includes a top electrode layer (e.g., top electrode layer 115) covering the light emitting layer 120 and electrically connected with the at least one reflective cup (e.g., the reflective cup parts 111 and/or 112) as described in FIG. 1A. In some embodiments, the at least one reflective cup (e.g., the reflective cup parts 111 or 112) may be electrically connected with the semiconductor substrate 110. For example, as shown in FIG. 3, the light emitting mesa 101 may include the light emitting layer 120, the bottom bonding layer 116 at a bottom of the light emitting layer 120 and bonded with the semiconductor substrate 110, and the top electrode layer 115 covering the light emitting layer 120 and electrically connected with the at least one reflective cup 111 and/or 112 (as described in FIGS. 1-2, not shown in FIG. 3).

In some embodiments, the light emitting layer 120 may emit green, blue or red light. The light emitted from the light emitting layer 120 may pass through and/or around the top electrode layer 115 and arrive at the micro-lens 102 (as described in FIG. 1A, not shown in FIG. 3). The light emitted from the light emitting layer 120 may also arrive at the at least one reflective cup 111 and/or 112 and be reflected upwardly to the micro-lens 102 or/and another lens (not shown in FIG. 3). In some embodiments, the light emitting mesa 101 may comprises two or more light emitting layers emitting distinct colors. The two or more light emitting layers may be stacked vertically or arranged in parallel in the same level. For example, the light emitting layer emitting green light may be disposed on the light emitting layer emitting red light; or the light emitting layer emitting green light may be arranged parallel to the light emitting layer emitting red light in the horizontal direction. In some embodiments, the light emitting structure 100 may include two or more light emitting mesas. In some embodiments, each of the light emitting mesas may include at least a light emitting layer that emits a distinct color. When two light emitting mesas are within the light emitting structure 100, two colors and the combinations of the two colors can be emitted from the light emitting structure 100. When three light emitting mesas are within the light emitting structure 100, three colors and the combinations of the three colors can be emitted from the light emitting structure 100.

In some embodiments, the light emitting layer such as 301 may include many epitaxial sub-layers with different compositions. Examples of the LED epitaxial layers may include III-V nitride, III-V arsenide, III-V phosphide, and III-V antimonide epitaxial structures. Examples of micro-LEDs may include GaN based UV/blue/green micro LEDs, AlInGaP based red/orange micro LEDs, and GaAs or InP based infrared (IR) micro LEDs.

In some embodiments, the bottom bonding layer 116 can be a metal layer or a conductive transparent layer, such as an ITO layer, which is formed at the bottom of the light emitting layer 120 to improve conductivity and transparency. In some embodiments, when there are more than one light emitting layers within the light emitting mesa, the light emitting layers are bonded together by a respective bonding layer in between. The light emitted from the light emitting layers may pass through the bonding layers above the current light emitting layer and be reflected by the bonding layers beneath the current light emitting layer. In some embodiments, the bottom bonding layer 116 is bonded with the semiconductor substrate 110.

In some embodiments, the top electrode layer 115 can be a metal layer or a conductive transparent layer, such as an ITO layer, that is formed on the light emitting layer 120 to improve conductivity and transparency. In addition, in some embodiments, there are additional conductive layers at the bottom and top of each of the light emitting layer, such as conductive layer 302 at the bottom of the light emitting layer 120, and conductive layer 303 at the top of the light emitting layer 120. Each of the conductive layers are electrically connected with either the top electrode layer or the IC circuit within the substrate. The top electrode layer 115 may be electrically connected with another circuit or component. In some embodiments, there may be a contact pad 304, as shown in FIG. 3, positioned between the top electrode layer 115 and the conductive layer 303. The contact pad 304 may be made of materials such as graphene, ITO, TCO, AZO, or FTO, or any combinations thereof. In some embodiments, the conductive layer 303 may be electrically connected with the at least one reflective cup via the conductive electrode layer 115 (as described in FIG. 1A).

In some embodiments, a reflective layer, such as reflective layer 301, may be positioned above the bottom bonding layer 116 and at bottom of each light emitting layer, such as light emitting layer 120. In some embodiments, a reflective layer, such as reflective layer 301, may be positioned below the conductive layer, such as conductive layer 302, at the bottom of each light emitting layer, such as light emitting layer 120. The reflective layer may improve light transmission efficiency. For example, the light emitted from the light emitting layer 120 may be reflected by the reflective layer 301. In some embodiments, the materials of the reflective layer may have a high reflectivity, especially to the light emitted by the light emitting layer(s) above the current reflective layer. For example, the reflectivity of the reflective layer is above 60%. In another example, the reflectivity of the reflective layer is above 70%. In yet another example, the reflectivity of the reflective layer is above 80%. In some embodiments, the material of the reflective layer may be metal selected from one or more of Rh, Al, Ag, and Au. In some embodiments, the reflective layer may include at least two sublayers with different refractive index. Each of the sublayers also has a high reflectivity such as above 60%, 70% or 80%. In some embodiments, the reflective layer may include a DBR structure. For example, the reflective layer may be formed from multiple layers of alternating or different materials with varying refractive index. In some instances, each layer boundary of the DBR structure causes a partial reflection of an optical wave. The reflective layer can be used to reflect some selected wavelengths. In some embodiments, the reflective layer may be made of multiple layers, e.g., at least two layers, of SiO2 and Ti3O5, respectively. By varying the thicknesses and numbers of layers of SiO2 and Ti3O5 respectively, selective reflection or transmission of light at different wavelengths can be formed.

In some embodiments, the at least one reflective cup may be electrically connected with the semiconductor substrate. For example, through a top electrode layer.

Figure 4:
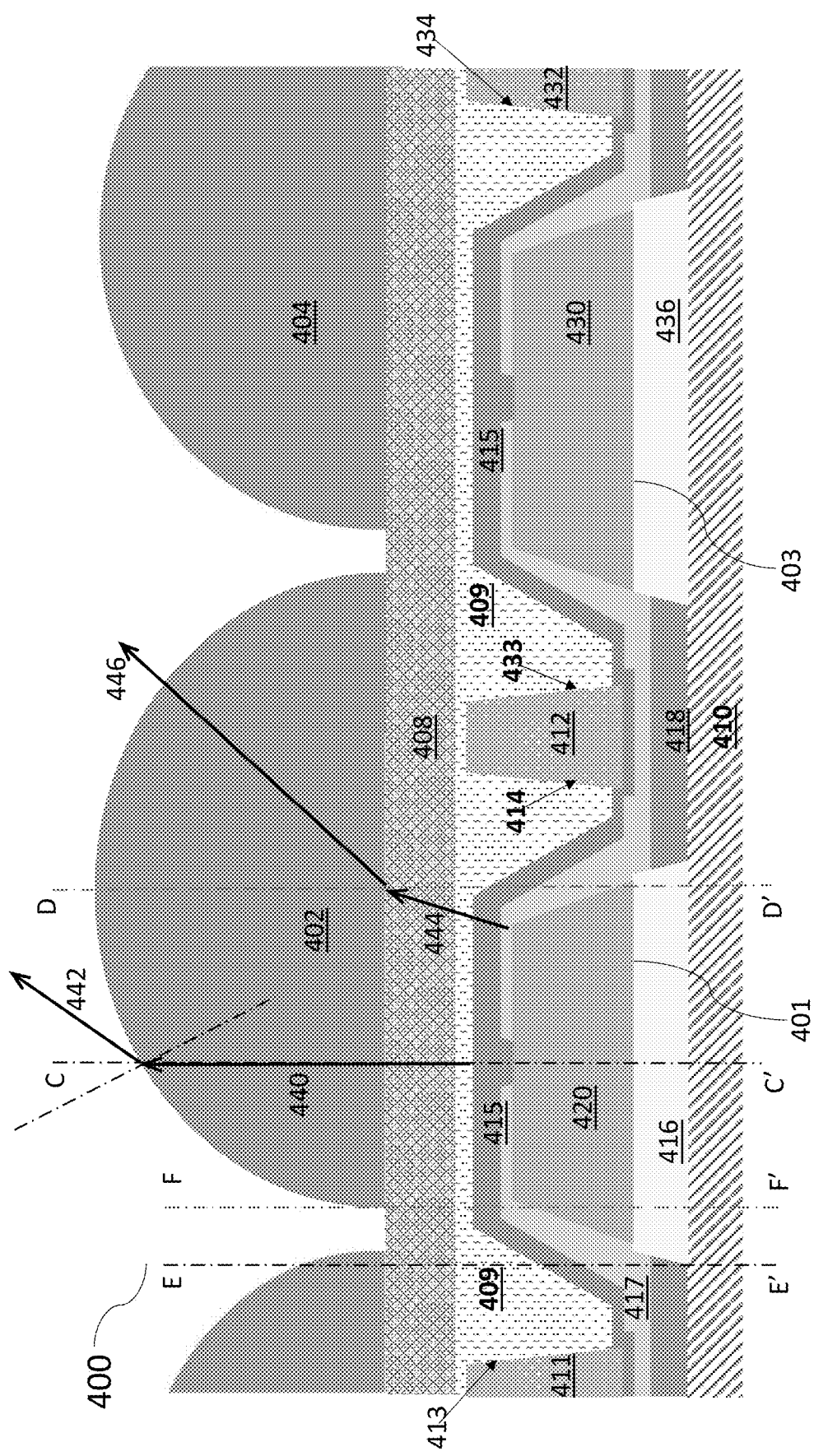
FIG. 4 illustrates a cross-sectional view of an exemplary light emitting structure with an array of micro-lenses and light emitting mesas, according to some embodiments.

FIG. 4 illustrates a cross-sectional view of an exemplary light emitting structure 400 with an array of micro-lenses and light emitting mesas, according to some embodiments. In some exemplary embodiments, a light emitting structure comprises a first light emitting mesa. For example, the light emitting structure 400 comprises a first light emitting mesa 401, as shown in FIG. 4. In some embodiments, the first light emitting mesa 401 has the same or similar dimension, shape, structure, composition, positioning and fabrication (including the reflective cup and other related structures, such as an optional spacer) as the light emitting mesa 101 and related structures described in FIG. 1A. The first light emitting mesa 401 may include an LED or a micro-LED and light may be emitted from the first light emitting mesa 401. The first light emitting mesa 401 may have a top surface and a bottom surface. In some embodiments, the diameter or width of the top surface of the first light emitting mesa 401 and the diameter or width of the bottom surface of the first light emitting mesa 401 may be in the range similar as described above with reference to FIG. 1A.

In some exemplary embodiments, the light emitting structure 400 further comprises a first micro-lens. As shown in FIG. 4, the light emitting structure 400 comprises a first micro-lens 402 formed on the first light emitting mesa 401. In some embodiments, the first micro-lens 402 may have the same or similar dimension, shape, structure, composition, positioning and fabrication as the micro-lens 102 described in FIG. 1A. In some embodiments, the first micro-lens 402 may be co-axially aligned to the first light emitting mesa 401 along the C-C' direction (not shown in FIG. 4), and be positioned above the first light emitting mesa 401. The axis C-C' as shown in FIG. 4 refers to the central axis of the first light emitting mesa 401, and the axis D-D' as shown in FIG. 4 refers to the central axis of the first micro-lens 402. In these embodiments with co-axially aligned center axes (not shown in FIG. 4), all of the light emitted from the first light emitting mesa 401 can directly arrive at and pass through the first micro-lens 402. Therefore, the divergence can be reduced and the useable viewing angle can be decreased to the extent that displays and panels using the single pixel LED devices may be seen by a user's view perpendicular to surfaces of the displays and panels. This, in turn, can reduce power waste and increase brightness and/or better protect user privacy in public areas. In another example, a part of the light emitted from the first light emitting mesa 401 can directly arrive at and pass through the first micro-lens 402, and another part of the light emitted from the light emitting center can pass around or bypass the micro-lens 402. Thus, the brightness from the first light emitting mesa 401 can be adjusted.

Yet in another example, the central axis of the first micro-lens 402 is off-axially stacked on the central axis of the first light emitting mesa 401 as shown in FIG. 4. In other words, the central axis D-D' of the first micro-lens 402 is not coaxially aligned with, does not overlap or coincide with the central axis C-C' of the first light emitting mesa 401, as shown in FIG. 4. In some embodiments, an offset distance between the central axis D-D' of the first micro-lens 402 and the central axis C-C' of the first light emitting mesa 401 is not more than 4.5 μm. In this example, the vertical light array 440 from the center of the light emitting mesa 401 is redirected by the micro-lens as the light array 442 which is at an angle to the vertical light array 440. The light array 444 from the edge of the light emitting mesa 401 toward the center of the micro-lens 402 is redirected by the micro-lens as the light array 446 which is at a greater angle to the axis perpendicular to the substrate 410 relative to that of the light array 444. In this embodiment, the divergence can be reduced and the usable viewing angle can be decreased to the extent that displays and panels using the single pixel LED devices may be seen by a user's view at only certain degrees to surfaces of the displays and panels. This can also reduce power waste, increase brightness and/properly protect user privacy in public areas.

Figure 5:
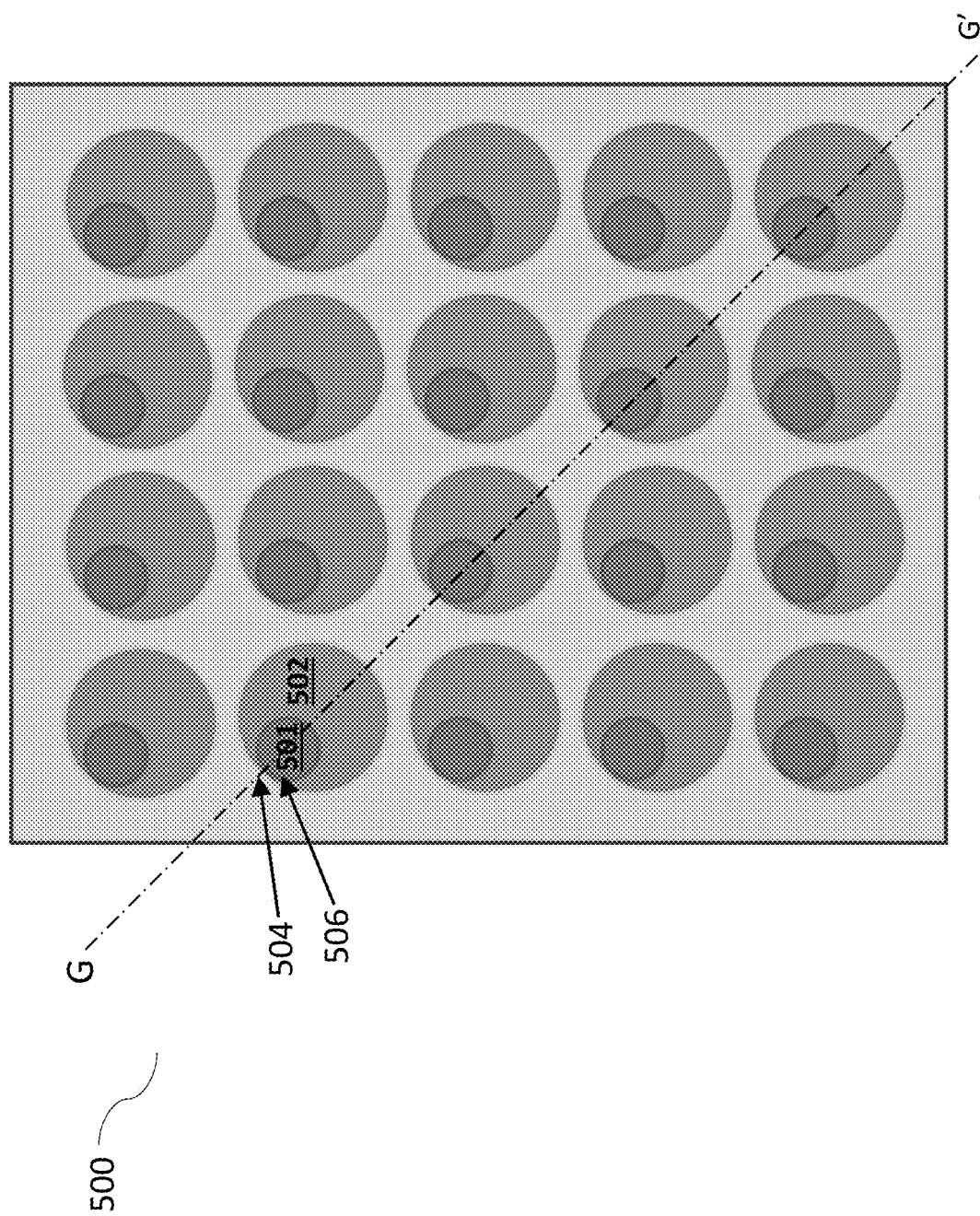
FIG. 5 is a top view of a light emitting structure array system of off-axially arranged light emitting mesas and micro-lenses, according to some embodiments.

In FIG. 4, the light emitting structure includes multiple light emitting mesas distributed in an array. For example, FIG. 5 is a top view of a light emitting structure array system 500 of off-axially arranged light emitting mesas and micro-lenses, according to some embodiments. The shape of the array can be a matrix, a circle, a rectangle, a square, a hexagon, or another shape. In the array, one micro-lens is arranged above each of the light emitting mesas respectively. A light emitting mesa 501, and a micro-lens 502 on top of the light emitting mesa 501 are included in the array of off-axially arranged light emitting mesas and micro-lenses. In some embodiments, an edge of the first light emitting mesa is near an edge of the first micro-lens, for example, an offset distance between an edge of a bottom surface of the first light emitting mesa and an edge of a bottom surface of the first micro-lens is within 30% of a diameter of the bottom surface of the first micro-lens. For example, as shown in FIG. 4, the line E-E' refers to the vertical line passing through the farthest point of the edge of the bottom surface of the first light emitting mesa 401 (farthest point 504 of the first light emitting mesa 501 in the cross-sectional view along G-G' in FIG. 5). Analogously, the line F-F' refers to the vertical line passing through the farthest point of the edge of the bottom surface of the first micro-lens 402 (farthest point 506 of the first micro-lens 502 in the cross-sectional view along G-G' in FIG. 5). The offset distance between the edge of the bottom surface of the first light emitting mesa 401 and the edge of the bottom surface of the first micro-lens 402 refers to the offset distance between the line E-E' and the line F-F'. In some embodiments, as shown in FIG. 5, the offset distance between the edge of the bottom surface of the first light emitting mesa 401 and the edge of the bottom surface of the first micro-lens 402 is zero, for example 504 and 506 are the same point. In some embodiments, as shown in FIG. 4, the offset distance between the edge 504 of the bottom surface of the first light emitting mesa 401/501 and the edge 506 of the bottom surface of the first micro-lens 402/502 is very small, for example, the offset distance between the line E-E' and the line F-F' may be within 30% of the diameter of the bottom surface of the first micro-lens 402. In some embodiments, the offset distance between the line E-E' and the line F-F' may be more than 30% but less than 50% of the diameter of the bottom surface of the first micro-lens 402. In some embodiments, the offset distance between the line E-E' and the line F-F' may be more than 50% of the diameter of the bottom surface of the first micro-lens 402.

In some embodiments, the bottom surface of the first micro-lens 402 covers a position of the central axis C-C' of the first light emitting mesa 401. In other words, the central axis C-C' of the first light emitting mesa 401 intersects with the bottom surface of the first micro-lens 402, as shown in FIG. 4.

In some embodiments, the structure of the first micro-lens 402 may include one element with one plane surface and one convex surface. For example, as shown in FIG. 4, the structure of the first micro-lens 402 may be hemisphere. Other structures of the first micro-lens 402 may also be other structures/shapes similar as described above with the reference to FIG. 1A. In some embodiments, the first micro-lens 402 may further include a reflective part which can adjust the light path. The reflective part may be similar to the reflective part as explained above.

In some embodiments, the material of the first micro-lens 402 comprises inorganic or organic materials. For example, the material of the first micro-lens 402 may comprise silicon oxide. Other materials of the first micro-lens 402 and methods of manufacturing may be the same or similar to the materials and manufacturing of the micro-lens 102 as explained above with reference to FIG. 1A.

In some embodiments, the light emitting structure 400 further comprises a second light emitting mesa, and a second micro-lens formed above the second light emitting mesa. For example, as shown in FIG. 4, the light emitting mesa 400 comprises a second light emitting mesa 403 and a second micro-lens 404 formed above the second light emitting mesa 403. In some embodiments, the second light emitting mesa 403 may be similar to the first light emitting mesa 401 as described above and the second micro-lens 404 may be similar to the first micro-lens 402 as described above. In some embodiments, the second light emitting mesa 403 may be adjacent to the first light emitting mesa 401. For example, as shown in FIG. 4, the second light emitting mesa 403 is adjacent to the first light emitting mesa 401 at the same horizontal level. In another example, the second light emitting mesa 403 may be adjacent to the first light emitting mesa 401 at a higher or lower horizontal level.

In some embodiments, the structure of the second micro-lens 404 may include one element with one plane surface and one convex surface. For example, as shown in FIG. 4, the structure of the second micro-lens 404 may be hemisphere. Other structures of the second micro-lens 404 may also be other structures/shapes similar as described above with reference to FIG. 1A. In some embodiments, the second micro-lens 404 may further include a reflective part which can adjust the light path. The reflective part may be similar to the reflective part as explained above.

In some embodiments, the offset between the central axis of the first micro-lens 402 to the central axis of the first light emitting mesa 401 is the same as the offset between the central axis of the second micro-lens 404 to the central axis of the second light emitting mesa 403. In some embodiments, the offset between the central axis of the first micro-lens 402 to the central axis of the first light emitting mesa 401 is not the same as the offset between the central axis of the second micro-lens 404 to the central axis of the second light emitting mesa 403. As shown in FIG. 5, in some embodiments, the relative positions of each micro-lens, such as 502, to each corresponding light emitting mesa, such as 501, are the same within the light emitting structure array system 500. For example, the offset distance of the central axis of a micro-lens relative to the central axis of a corresponding light emitting mesa (such as the distance between line D-D' and line C-C' as shown in FIG. 4) is the same across all the light emitting mesa and micro-lens pairs on the light emitting structure array system 500. This way, all the light emitted from the light emitting mesa and micro-lens pairs on the light emitting structure array system 500 are directed in the same angle or similar angle range toward a user or a device.

Figure 6:
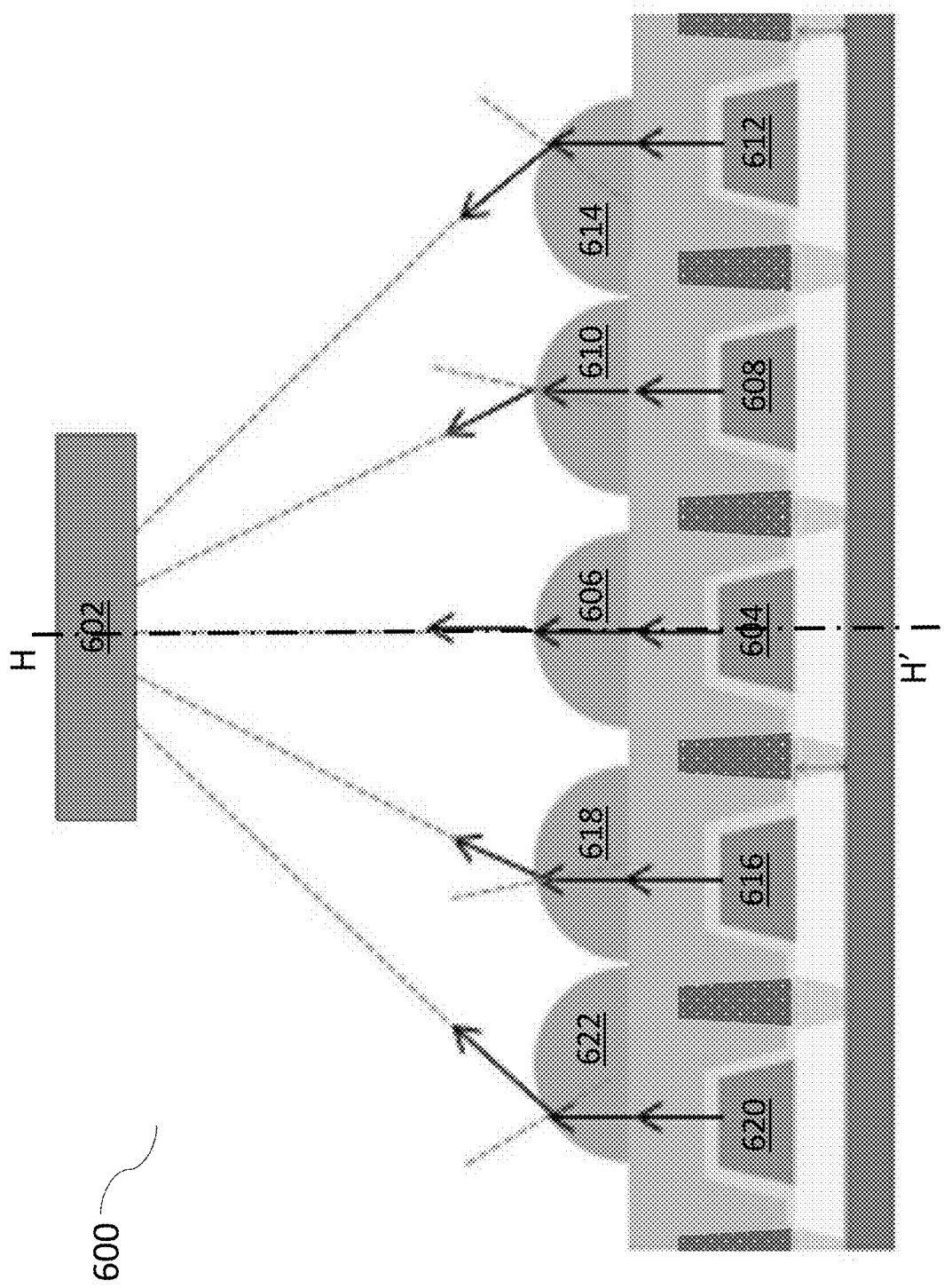
FIG. 6 illustrates a cross-sectional view of a light emitting structure array system with a sensor located at a center position above the light emitting structure array system, according to some embodiments.

FIG. 6 illustrates a cross-sectional view of a light emitting structure array system 600 with a sensor 602 located at a center position above the light emitting structure array system 600, according to some embodiments. The light emitting structure array system 600 includes one or more light emitting mesas, such as 604, 608, 612, 616, and 620, and one or more micro-lenses, such as 606, 610, 614, 618, and 622, each of which can be similar as described in any one of FIGS. 1-5. In some embodiments, the emitting light rays from the one or more light emitting mesas through the one or more micro-lenses are converted together into the sensor 602. In some embodiments, the sensor 602 (or the central axis of the sensor 602) is arranged at a location that is at a central axis H-H' of the light emitting structure array system 600.

In some embodiments, the offset distances of the micro-lens relative to the corresponding light emitting mesa are different within the light emitting structure array system 600. In some embodiments, the offset distance of the micro-lens relative to the light emitting mesa is decided by the position of the sensor and the position of the micro-lens relative to the sensor. In some embodiments, as shown in FIG. 6, the offset distance of the central axis of a micro-lens relative to the central axis of a corresponding light emitting mesa (such as the distance between line D-D' and line C-C' as shown in FIG. 4), becomes larger from the center of the light emitting structure array system where the sensor 602 is located, to the edge of the light emitting structure array system 600. In other words, the offset distance of the central axis of a first micro-lens, such as 610, relative to the central axis of a first light emitting mesa, such as 608, is smaller than the offset distance of the central axis of a second micro-lens, such as 614, relative to the central axis of the second light emitting mesa, such as 612, when the first micro-lens and the first light emitting mesa are both closer in distance to the sensor 602 than both of the second micro-lens and the second light emitting mesa to the same sensor 602. In some embodiments, the offset distance of the central axis of a micro-lens, such as 606, relative to the central axis of a corresponding light emitting mesa, such as 604, is zero, when both of the central axis micro-lens and the central axis of the light emitting mesa are coaxially aligned with the central axis of the sensor 602. In some embodiments, the offset distance range for the micro-lens and light emitting mesa pairs on the light emitting structure array system 600 is not more than 4.5 µm.

In some embodiments, the offset distances of the central axis of a respective micro-lens relative to the central axis of a respective corresponding light emitting mesa are symmetric around the central axis of the light emitting structure array system 600, where the sensor 602 is located. For example, the offset distance of the central axis of the micro-lens 610 relative to the central axis of a corresponding light emitting mesa 608, and the offset distance of the central axis of the micro-lens 618 relative to the central axis of a corresponding light emitting mesa 616, are the same. The offset distance of the central axis of the micro-lens 614 relative to the central axis of a corresponding light emitting mesa 612, and the offset distance of the central axis of the micro-lens 622 relative to the central axis of a corresponding light emitting mesa 620, are the same. In some embodiments, on the right of the central axis of the sensor, the micro-lens is shifted to the left relative to the corresponding light emitting mesa beneath the micro-lens (see, e.g., micro-lens 610 and 614 in FIG. 6). In some embodiments, on the left of the central axis of the sensor, the micro-lens is shifted to the right relative to the corresponding light emitting mesa beneath the micro-lens (see, e.g., micro-lens 618 and 622 in FIG. 6).

The light emitting structure array system 600 as shown in FIG. 6 can direct light emitted from each of the light emitting mesas toward the sensor 602 at a center location. For example, the light emitted from the light emitting mesa 604 at its central axis at the center of the light emitting structure array system 600 does not change its direction after passing through the micro-lens 606. The light emitted from the light emitting mesa 608 at its central axis changes its direction toward the sensor 602 after passing through the micro-lens 610. The light emitted from the light emitting mesa 612 at its central axis changes its direction toward the sensor 602 after passing through the micro-lens 614. The angle of the light emitted from the micro-lens located toward the edge of the light emitting structure array system 600 relative to a vertical axis perpendicular to the surface of the substrate is larger than the angle of the light emitted from the micro-lens located toward the center of the light emitting structure array system 600 relative to a vertical axis perpendicular to the surface of the substrate. For example, the angle of the light emitted from the micro-lens 614 located toward the edge of the light emitting structure array system 600 relative to a vertical axis perpendicular to the surface of the substrate is larger than the angle of the light emitted from the micro-lens 610 located toward the center of the light emitting structure array system 600 relative to a vertical axis perpendicular to the surface of the substrate.

Figure 7:
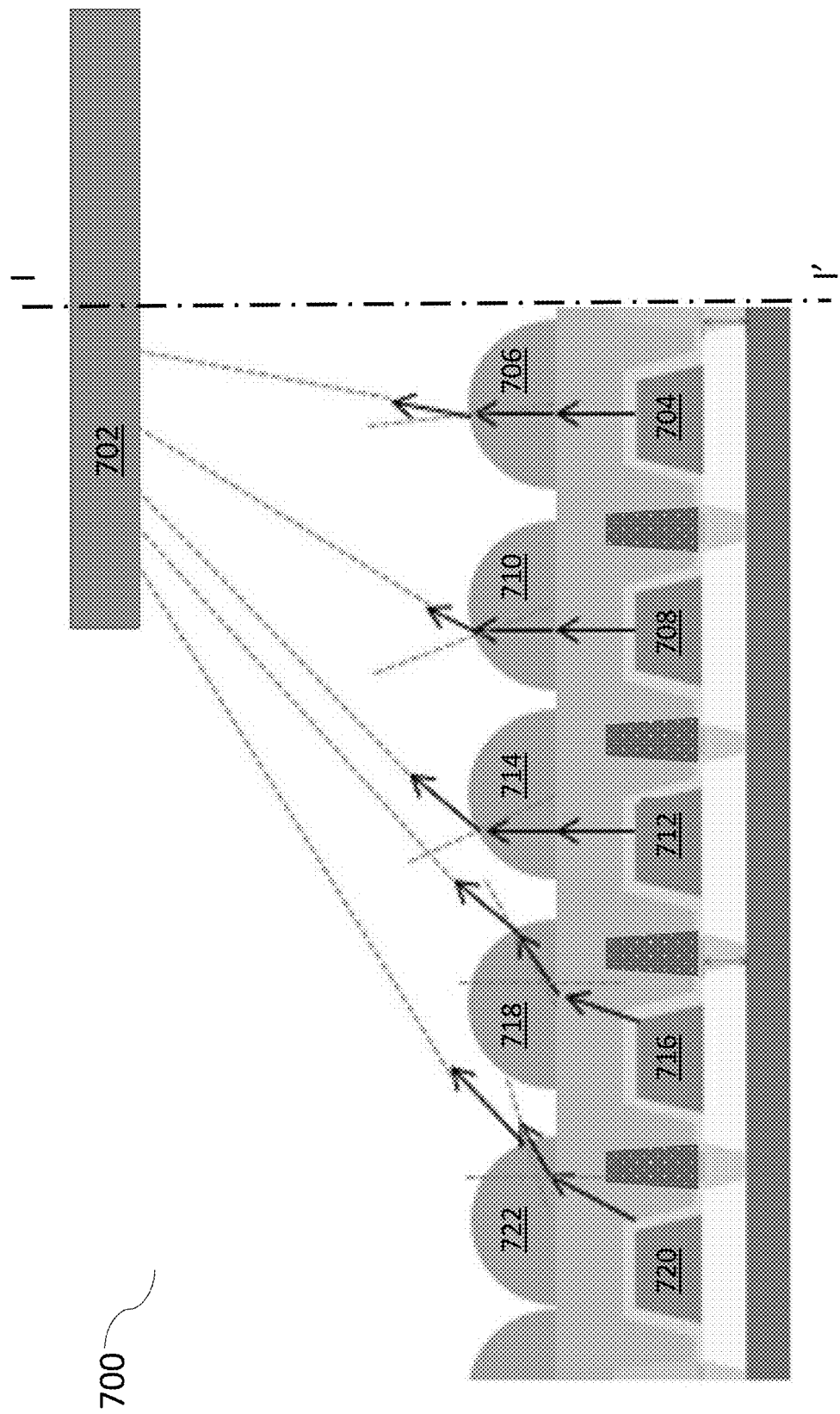
FIG. 7 illustrates a cross-sectional view of a light emitting structure array system with a sensor located at a side or non-central position above the light emitting structure array system, according to some embodiments.

FIG. 7 illustrates a cross-sectional view of a light emitting structure array system 700 with a sensor 702 located at a side or non-central position above the light emitting structure array system 700, according to some embodiments. The light emitting structure array system 700 includes one or more light emitting mesas, such as 704, 708, 712, 716, and 720, and one or more micro-lenses, such as 706, 710, 714, 718, and 722, each of which can be similar as described in any one of FIGS. 1-5. In some embodiments, the emitting light rays from the one or more light emitting mesas through the one or more micro-lenses are converted together into the sensor 702. In some embodiments, the sensor 702 (or the central axis of the sensor 702) is arranged at a location that is not at a central axis of the light emitting structure array system 700. For example, a central axis I-I' of the sensor 702 is passing through a side of the light emitting structure array system 700.

In some embodiments, the offset distances of the micro-lens relative to the corresponding light emitting mesa are different within the light emitting structure array system 700. In some embodiments, the offset distance of the micro-lens relative to the light emitting mesa is decided by the position of the sensor and the position of the micro-lens relative to the sensor. In some embodiments, as shown in FIG. 7, the offset distance of the central axis of a micro-lens relative to the central axis of a corresponding light emitting mesa (such as the distance between line D-D' and line C-C' as shown in FIG. 4), becomes larger for each micro-lens-mesa pair as the position progresses from a central axis I-I' of the sensor 702, to an edge of the light emitting structure array system 700, i.e., progressing from central axis I-I' in a leftward horizontal direction in FIG. 7. In other words, the offset distance of the central axis of a first micro-lens, such as 706, relative to the central axis of a first light emitting mesa, such as 704, is smaller than the offset distance of the central axis of a second micro-lens, such as 710, relative to the central axis of the second light emitting mesa, such as 708, when the first micro-lens and the first light emitting mesa are both closer in distance to the sensor 702 than both of the second micro-lens and the second light emitting mesa to the same sensor 702. In some embodiments, not shown in FIG. 7, the offset distance of the central axis of a micro-lens, relative to the central axis of a corresponding light emitting mesa, is zero, when both of the central axis micro-lens and the central axis of the light emitting mesa are coaxially aligned with the central axis of the sensor 702. In some embodiments, the offset distance range for the micro-lens and light emitting mesa pairs on the light emitting structure array system 700 is not more than 4.5 µm.

In some embodiments, not shown in FIG. 7, the offset distances of the central axis of a respective micro-lens relative to the central axis of a respective corresponding light emitting mesa are symmetric around the central axis of the sensor 702. In some embodiments, on the right of the central axis of the sensor, the micro-lens is shifted to the left relative to the corresponding light emitting mesa beneath the micro-lens. In some embodiments, on the left of the central axis of the sensor, the micro-lens is shifted to the right relative to the corresponding light emitting mesa beneath the micro-lens.

The light emitting structure array system 700 as shown in FIG. 7 can direct light emitted from each of the light emitting mesas toward the sensor 702 at a non-central location. For example, the light emitted from the light emitting mesa 708 at its central axis changes its direction toward the sensor 702 after passing through the micro-lens 710. The light emitted from the light emitting mesa 712 at its central axis changes its direction toward the sensor 702 after passing through the micro-lens 714. The angle of the light emitted from the micro-lens located farther from the central axis of the sensor 702 relative to a vertical axis perpendicular to the surface of the substrate is larger than the angle of the light emitted from the micro-lens located nearer to the central axis of the sensor 702 relative to a vertical axis perpendicular to the surface of the substrate. For example, the angle of the light emitted from the micro-lens 714 located farther from the central axis of the sensor 702 relative to a vertical axis perpendicular to the surface of the substrate is larger than the angle of the light emitted from the micro-lens 710 located nearer to the central axis of the sensor 702 relative to a vertical axis perpendicular to the surface of the substrate.

When the offset distances of the micro-lens relative to the corresponding light emitting mesas are the same, the light emitted out of the micro-lens array are in parallel and forms an irradiation plane. When the offset distances of the micro-lens relative to the corresponding light emitting mesas are different, the light emitted out of the micro-lens array can focus on a point but not a plane.

Figure 8:
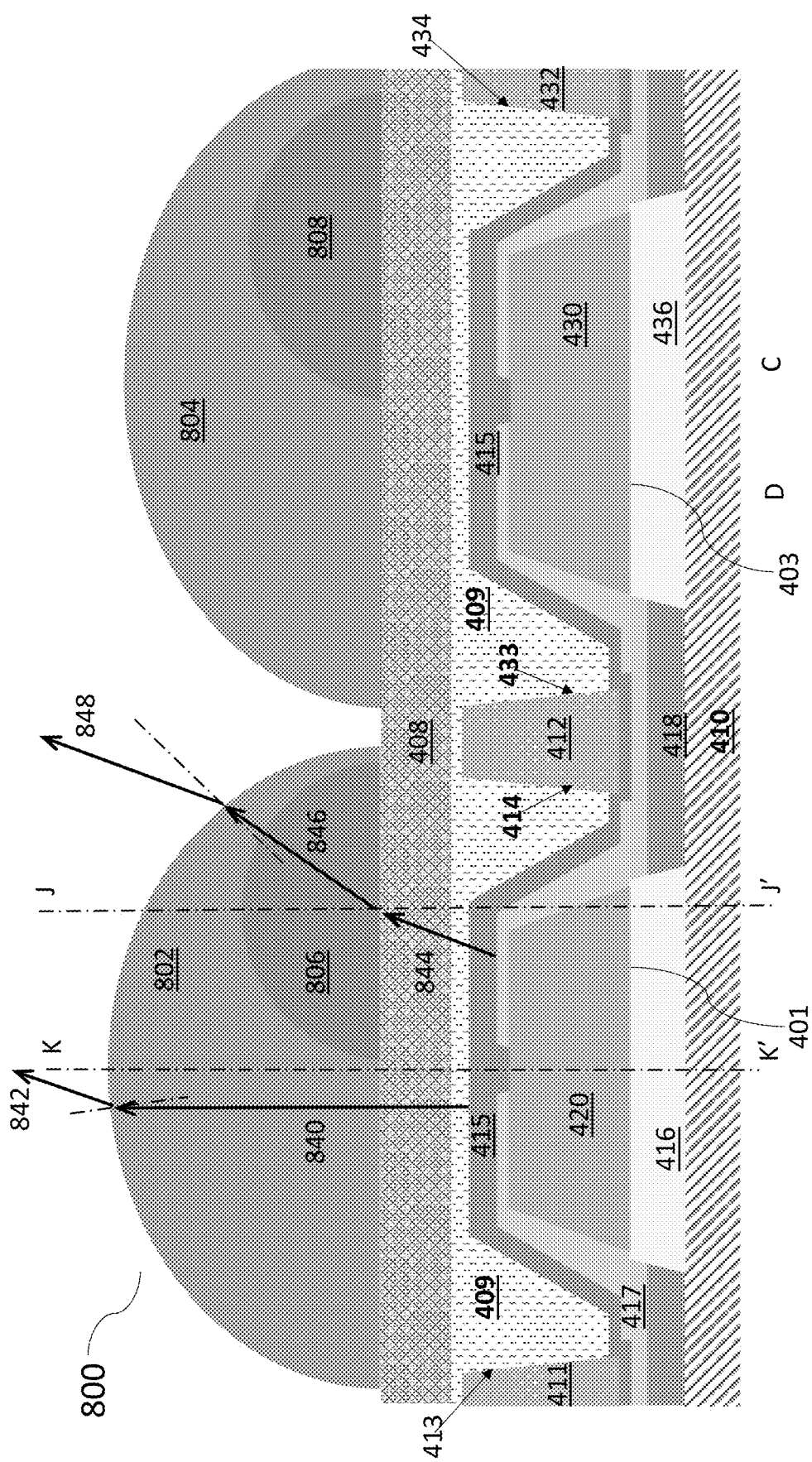
FIG. 8 illustrates a cross-sectional view of an exemplary light emitting structure having a small micro-lens within a big micro-lens, wherein the lateral dimension of the small micro-lens is smaller than that of the big micro-lens, according to some embodiments.

FIG. 8 illustrates a cross-sectional view of an exemplary light emitting structure 800 having a small micro-lens within a big micro-lens, wherein the lateral dimension of the small micro-lens is smaller than that of the big micro-lens, according to some embodiments. The big micro-lens and light emitting mesa pair (including related reflective cups, and optional spacers) array structure, dimension, shape, fabrication, and material, is the same or similar to the light emitting structure described in any one of FIGS. 1-7. The material, shape, and fabrication of the small micro-lens is similar to the big micro-lens as described above in FIGS. 1-7. In some embodiments, within the same micro-lens group and light emitting mesa pair, the light emitting structure 800 includes a small micro-lens, such as 806 or 808, and a big micro-lens, such as 802 or 804. The small micro-lens, such as 806 or 808, is formed on the light emitting mesa, such as 401 or 403. The big micro-lens is formed on the light emitting mesa, such as 401 or 403, and covers the small micro-lens, such as 806 or 808. The diameter of the big micro-lens, such as 802, is larger than the diameter of the small micro-lens, such as 806, so as to improve the light extraction efficiency.

In some embodiments, as shown in FIG. 8, the central axis J-J' of the small micro-lens 806 is shifted from the central axis K-K' of the light emitting mesa 401 to change the light direction, while the central axis of the big micro-lens 802 is coaxially aligned with (or the same as) the central axis K-K' of the light emitting mesa 401. In some embodiments, the offset distance between the central axis of the small micro-lens 806 and the central axis of the light emitting mesa 401 is not more than 9 μm, preferably not more than 1.5 μm.

In some embodiments, the edge of the small micro-lens 806 does not need to cover the central axis of the light emitting mesa 401, as shown in FIG. 8, while the edge of the big micro-lens 802 covers the central axis of the light emitting mesa 401, also as described above in FIG. 4. In other words, the central axis K-K' of the light emitting mesa 401 does not need to intersect with the bottom surface of the small micro-lens 806, while the central axis K-K' of the light emitting mesa 401 intersects with the bottom surface of the big micro-lens 802. In some other embodiments, not shown in FIG. 8, both the edges of the small micro-lens 806 and big micro-lens 802 cover the central axis of the light emitting mesa 401. In other words, the central axis K-K' of the light emitting mesa 401 intersects with the bottom surface of the small micro-lens 806, and the central axis K-K' of the light emitting mesa 401 intersects with the bottom surface of the big micro-lens 802.

In some embodiments, the light ray 840 emitted from the light emitting mesa 401 is redirected as 842 out of the big micro-lens 802. The light ray 844 emitting from the light emitting mesa 401 is redirected as 846 while it travels through the small micro-lens 806 and as 848 out of the big micro-lens 802. The addition of the small micro-lens within the big micro-lens can further direct and adjust the light within a certain portion of the LED pixel structure to a certain angle. For example, in FIG. 8, the light rays from the big micro-lens are more focused in certain directions after exiting.

FIGS. 9A-9D illustrate some exemplary simulation results for the light exiting from the big micro-lens from the light emitting structure 800 shown in FIG. 8, according to some embodiments. FIGS. 9A-9D show the change of the exiting light intensity from the light emitting structure 800 as the offset distance between the central axis K-K' of the light emitting mesa, such as 401, and the central axis J-J' of the small micro-lens, such as 806, changes, while the central axis of the big micro-lens, such as 802 is coaxially aligned with (or the same as) the central axis K-K' of the light emitting mesa, such as 401. The exiting light intensity was measured in a vertical plane that passes the vertical central axis of the light emitting mesa, such as the central axis K-K' of the light emitting mesa 401. X and Y denote the offset distances in micrometers on a horizontal plane parallel to the substrate 410 in the two orthogonal directions: X direction and Y direction. In this example, the largest horizontal dimension (such as the bottom surface) of the light emitting mesa, such 401, is 8 μm. The largest horizontal dimension (such as the bottom surface) of the small micro-lens, such as 806, is 18 μm. The largest horizontal dimension of the big micro-lens (such as the bottom surface), such as 802, is 36 μm. FIGS. 9A-9D also show the change of the exiting light intensity from the light emitting structure 800 as the angle of the exiting light ray relative to an axis perpendicular to the substrate 410 (exiting angle θ represented in degrees) changes.

Figure 9A:
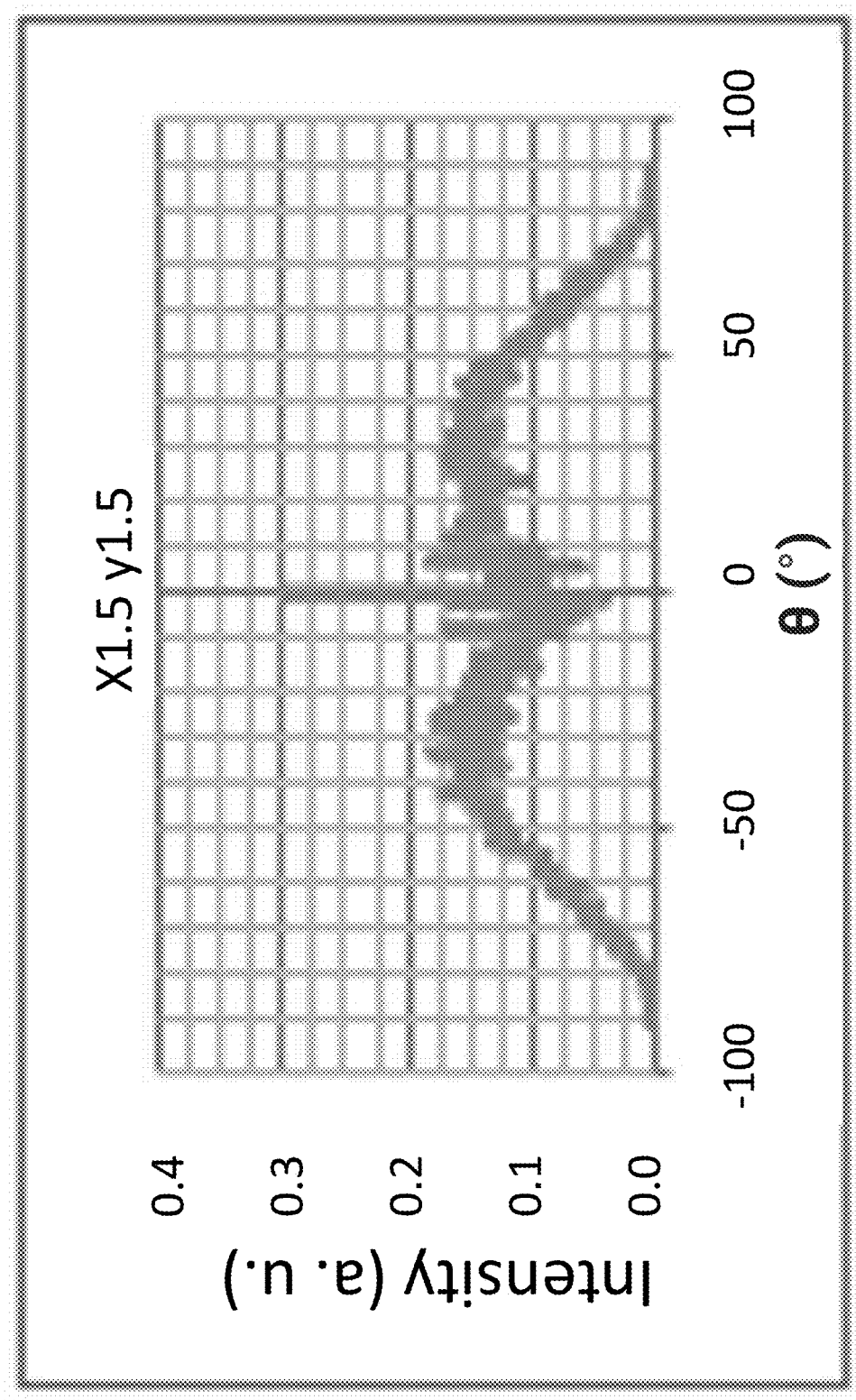
FIGS. 9A-9D illustrate some exemplary simulation results for the light exiting from the big micro-lens from the light emitting structure shown in FIG. 8, according to some embodiments.

For example, in FIG. 9A, when the offset distance between the central axis of the light emitting mesa and the central axis of the small micro-lens in the X direction is 1.5 μm, and in the Y direction is 1.5 μm, the maximum normalized exiting light intensity at 0 degree exiting angle is about 0.3 a.u. There are two other secondary peak normalized exiting light intensities at around +30 and −30 degree exiting angles. The secondary peak intensity is about 0.15 a.u. When the absolute value of the exiting angle is larger than 30 degrees, the light intensity gradually decreases to zero as the absolute value of the exiting angle becomes bigger. When the absolute value of the exiting angle is smaller than 30 degrees, the light intensity gradually decreases as the absolute value of the exiting angle becomes smaller with a minimum intensity value at about 0.05 a.u. near 0 degree exiting angle.

Figure 9B:
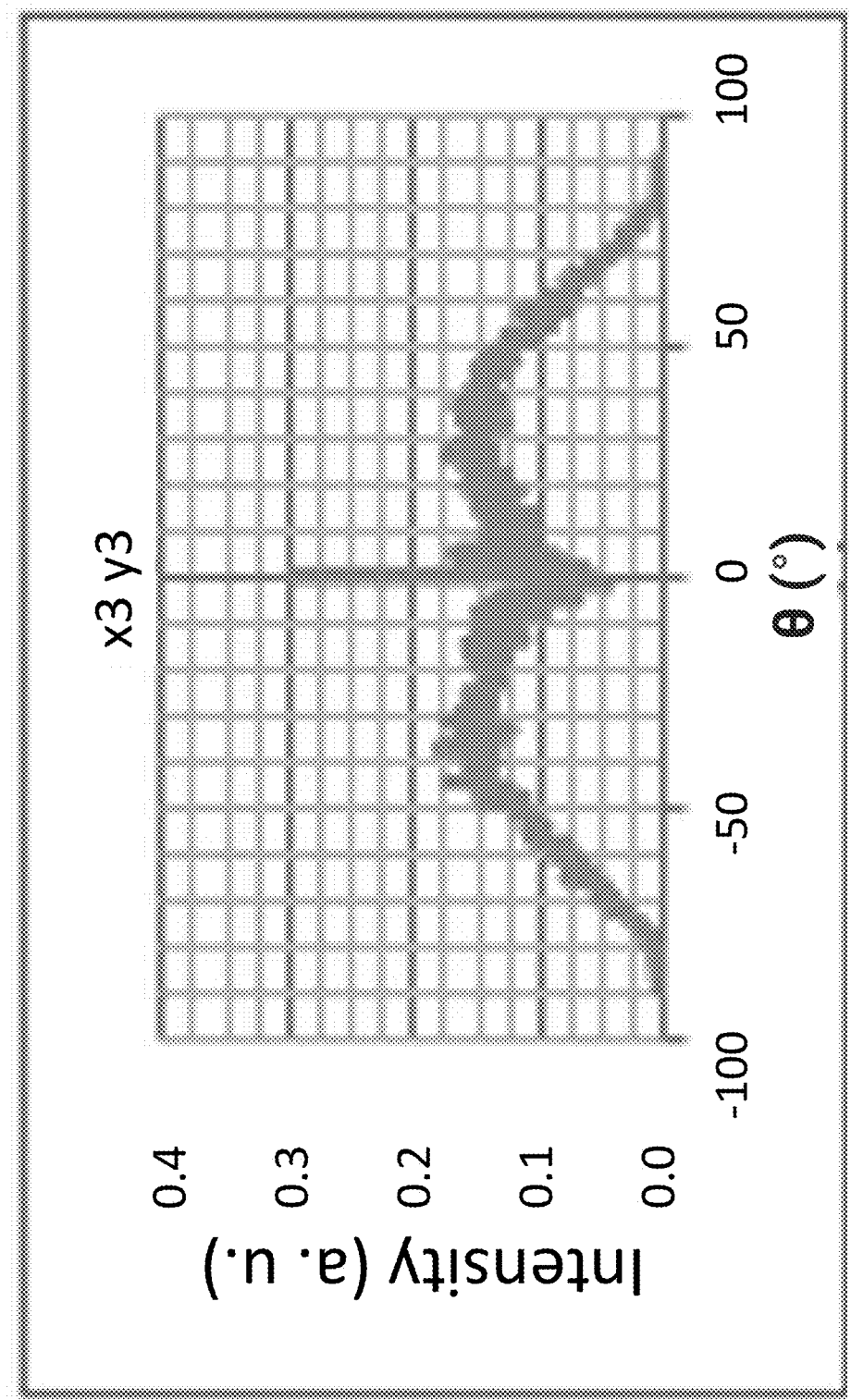

For example, in FIG. 9B, when the offset distance between the central axis of the light emitting mesa and the central axis of the small micro-lens in the X direction is 3 μm, and in the Y direction is 3 μm, the maximum normalized exiting light intensity at 0 degree exiting angle is about 0.3 a.u. There are two other secondary peak normalized exiting light intensities at around +35 and −35 degree exiting angles. The secondary peak intensity is about 0.16 a.u. When the absolute value of the exiting angle is larger than 35 degrees, the light intensity gradually decreases to zero as the absolute value of the exiting angle becomes bigger. When the absolute value of the exiting angle is smaller than 35 degrees, the light intensity gradually decreases as the absolute value of the exiting angle becomes smaller with a minimum intensity value at about 0.05 a.u. near 0 degree exiting angle.

Figure 9C:
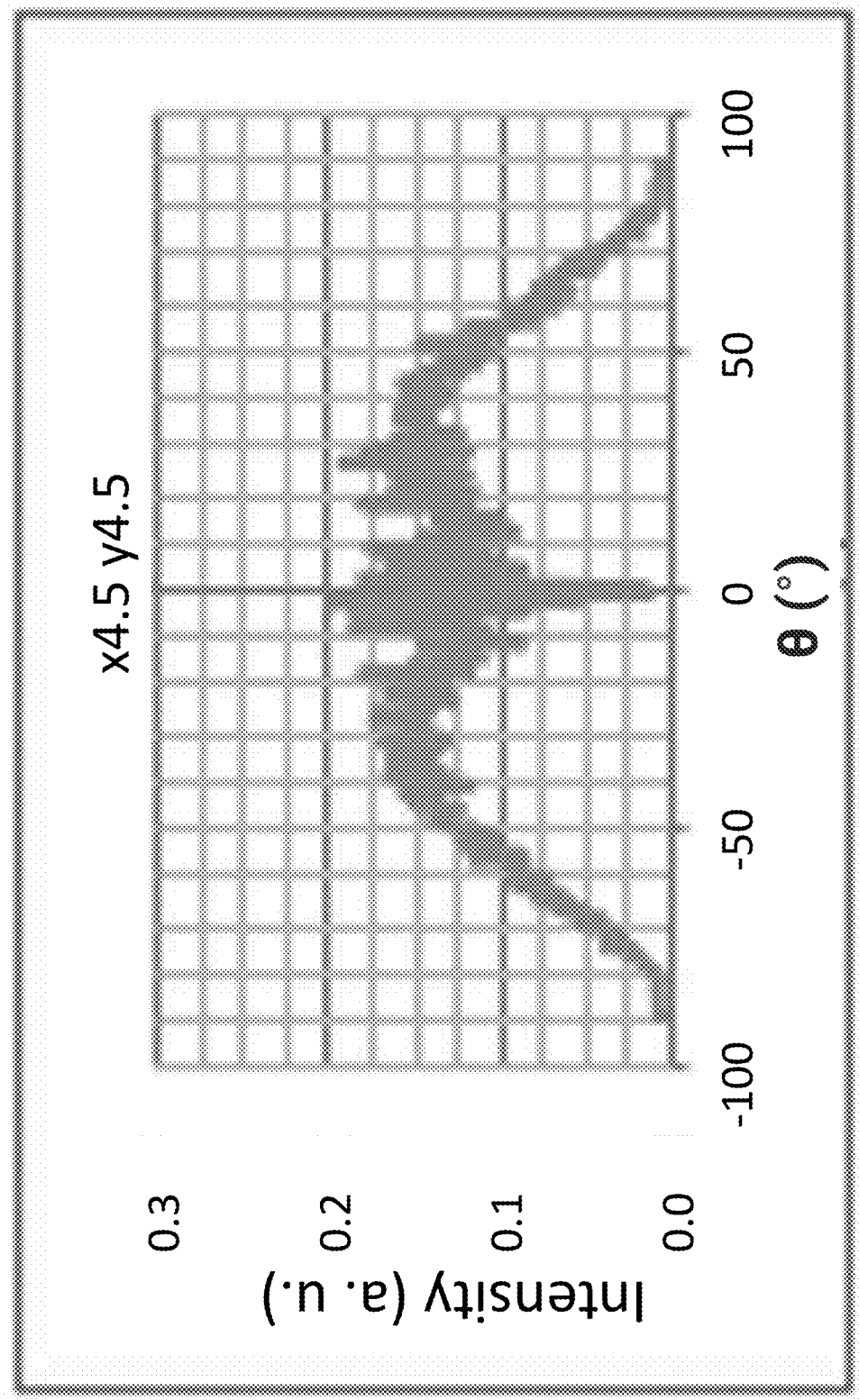

For example, in FIG. 9C, when the offset distance between the central axis of the light emitting mesa and the central axis of the small micro-lens in the X direction is 4.5 μm, and in the Y direction is 4.5 μm, the maximum normalized exiting light intensity at 0 degree exiting angle is about 0.2 a.u. There are two other secondary peak normalized exiting light intensities at around +30 and −30 degree exiting angles. The secondary peak intensity is about 0.16 a.u. When the absolute value of the exiting angle is larger than 30 degrees, the light intensity gradually decreases to zero as the absolute value of the exiting angle becomes bigger. When the absolute value of the exiting angle is smaller than 30 degrees, the light intensity gradually decreases as the absolute value of the exiting angle becomes smaller with a minimum intensity value at about 0.01 a.u. near 0 degree exiting angle.

Figure 9D:
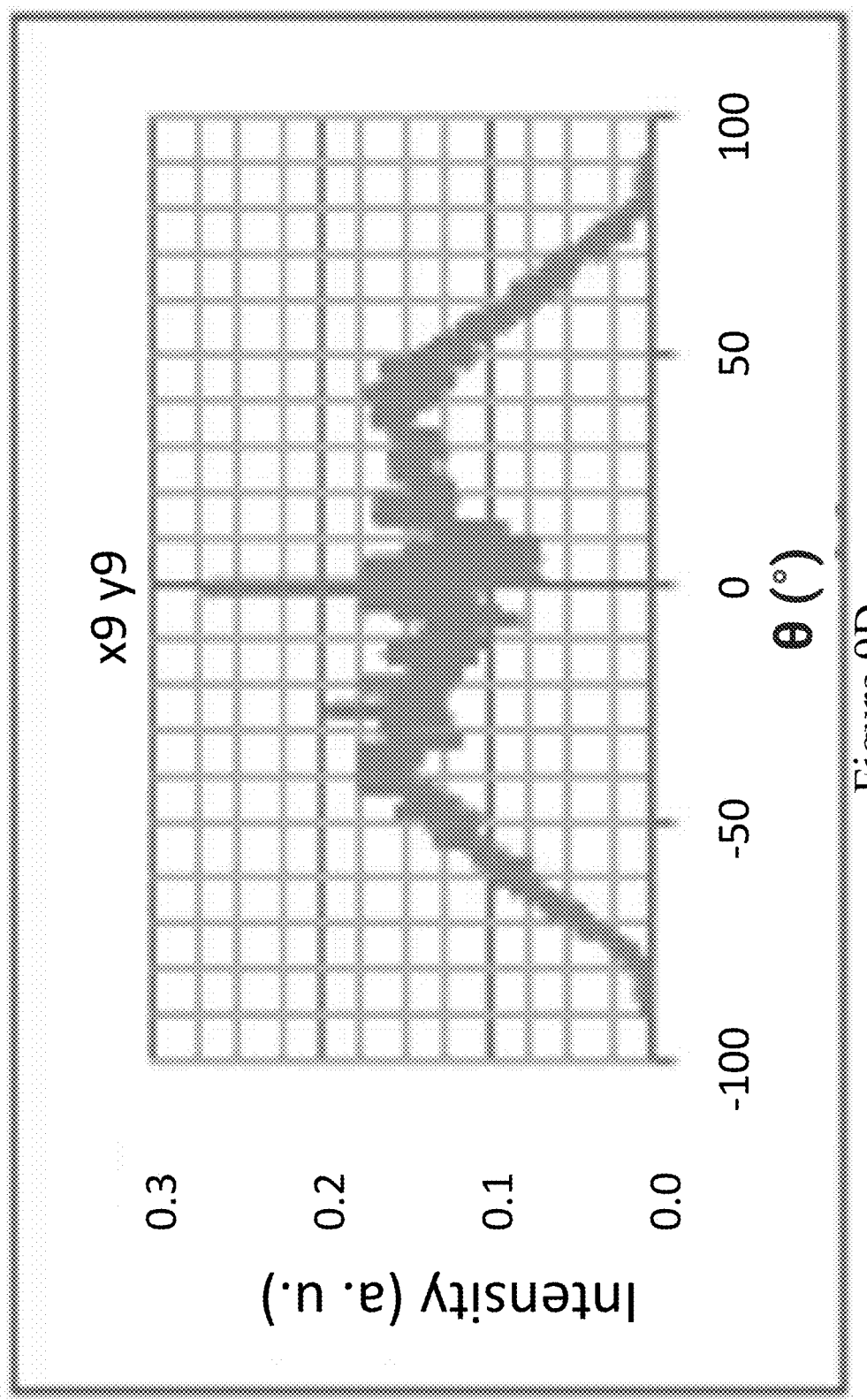

For example, in FIG. 9D, when the offset distance between the central axis of the light emitting mesa and the central axis of the small micro-lens in the X direction is 9 μm, and in the Y direction is 9 μm, the maximum normalized exiting light intensity at 0 degree exiting angle is about 0.275 a.u. There are two other secondary peak normalized exiting light intensities at around +40 and −40 degree exiting angles. The secondary peak intensity is about 0.16 a.u. When the absolute value of the exiting angle is larger than 40 degrees, the light intensity gradually decreases to zero as the absolute value of the exiting angle becomes bigger. When the absolute value of the exiting angle is smaller than 40 degrees, the light intensity gradually decreases as the absolute value of the exiting angle becomes smaller with a minimum intensity value at about 0.075 a.u. near 0 degree exiting angle.

Figure 10:
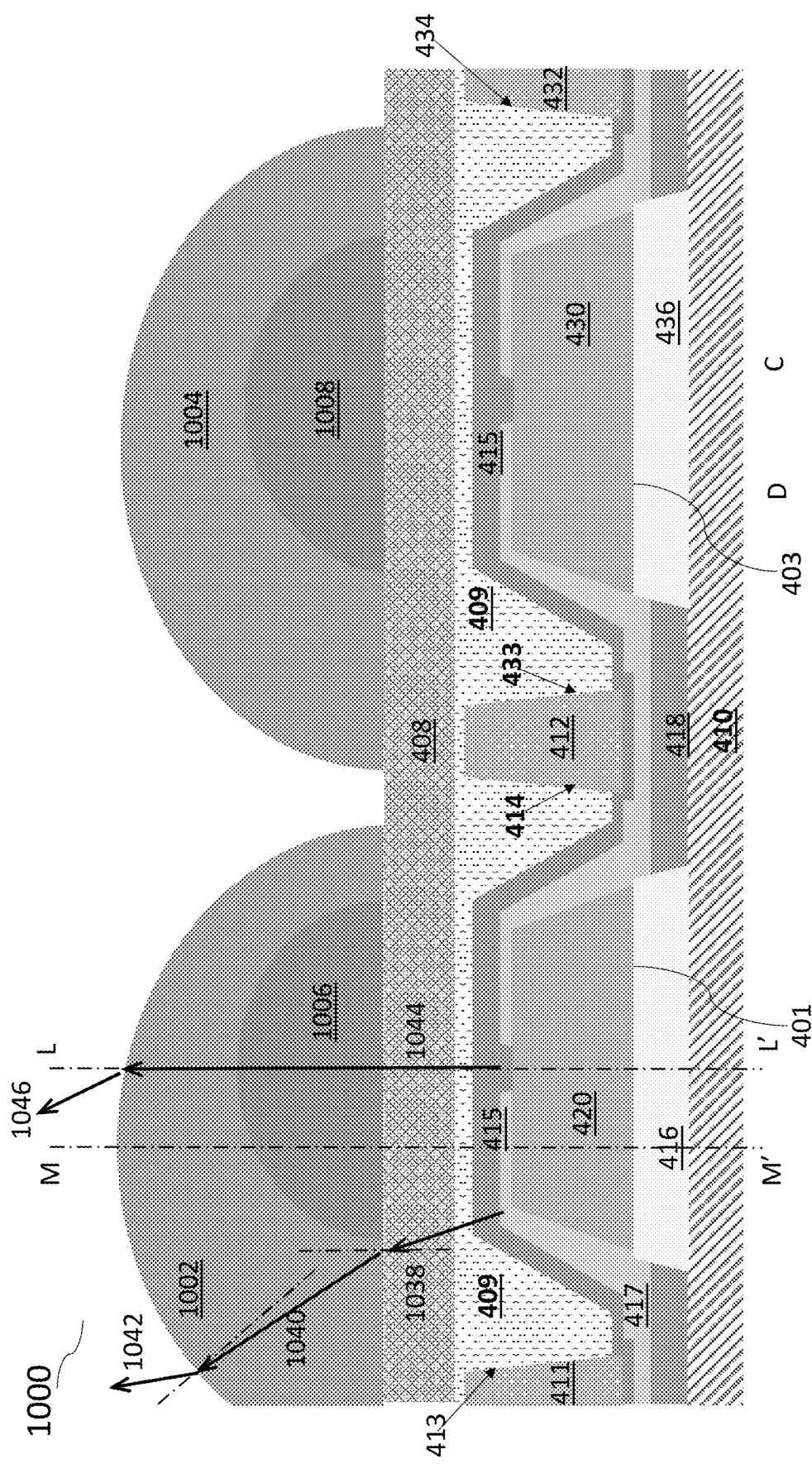
FIG. 10 illustrates a cross-sectional view of an exemplary light emitting structure having a small micro-lens within a big micro-lens, wherein the lateral dimension of the small micro-lens is smaller than that of the big micro-lens, according to some embodiments.

FIG. 10 illustrates a cross-sectional view of an exemplary light emitting structure 1000 having a small micro-lens within a big micro-lens, wherein the lateral dimension of the small micro-lens is smaller than that of the big micro-lens, according to some embodiments. The big micro-lens and light emitting mesa pair (including related reflective cups, and optional spacers) array structure, dimension, shape, fabrication, and material, is the same or similar to the light emitting structure described in any one of FIGS. 1-7. The material, shape, and fabrication of the small micro-lens is similar to the big micro-lens as described above in FIGS. 1-7. In some embodiments, within the same micro-lens group and light emitting mesa pair, the light emitting structure 1000 includes a small micro-lens, such as 1006 or 1008, and a big micro-lens, such as 1002 or 1004. The small micro-lens, such as 1006 or 1008, is formed on the light emitting mesa, such as 401 or 403. The big micro-lens is formed on the light emitting mesa, such as 401 or 403, and covers the small micro-lens, such as 1006 or 1008. The diameter of the big micro-lens, such as 1002, is larger than the diameter of the small micro-lens, such as 1006, so as to improve the light extraction efficiency.

In some embodiments, as shown in FIG. 10, the central axis M-M' of the big micro-lens 1002 is shifted from the central axis L-L' of the light emitting mesa 401 to change the light direction, while the central axis of the small micro-lens 1006 is coaxially aligned with (or the same as) the central axis L-L' of the light emitting mesa 401. Preferably, the offset distance between the central axis of the big micro-lens 1002 and the central axis of the light emitting mesa 401 is not more than 12 μm, in some embodiments, is not more than 1.5 μm.

In some embodiments, the edge of the small micro-lens 1006 covers the central axis of the light emitting mesa 401, as shown in FIG. 10, and the edge of the big micro-lens 1002 covers the central axis of the light emitting mesa 401, also as described above in FIG. 4. In other words, the central axis L-L' of the light emitting mesa 401 intersects with the bottom surface of the small micro-lens 1006, and the central axis L-L' of the light emitting mesa 401 intersects with the bottom surface of the big micro-lens 1002.

In some embodiments, the light ray 1038 emitting from the light emitting mesa 401 is redirected as 1040 while it travels through the big micro-lens 1002 and as 1042 out of the big micro-lens 1002. The light ray 1044 emitted from the light emitting mesa 401 travels through the small micro-lens 1006 and is then redirected as 1046 out of the big micro-lens 1002. The addition of the small micro-lens within the big micro-lens can further direct and adjust the light within a certain portion of the LED pixel structure to a certain angle. For example, in FIG. 10, the light rays from the big micro-lens are more focused in certain directions after exiting.

FIGS. 11A-11E illustrate some exemplary simulation results for the light exiting from the big micro-lens from the light emitting structure 1000 shown in FIG. 10, according to some embodiments. FIGS. 11A-11E show the change of the exiting light intensity from the light emitting structure 1100 as the offset distance between the central axis L-L' of the light emitting mesa, such as 401, and the central axis J-J' of the big micro-lens, such as 1002, changes, while the central axis of the small micro-lens, such as 1006 is coaxially aligned with (or the same as) the central axis L-L' of the light emitting mesa, such as 401. The exiting light intensity was measured in a vertical plane that passes the vertical central axis of the light emitting mesa, such as the central axis L-L' of the light emitting mesa 401. X and Y denote the offset distances in micrometers on a horizontal plane parallel to the substrate 410 in the two orthogonal directions: X direction and Y direction. In this example, the largest horizontal dimension (such as the bottom surface) of the light emitting mesa, such 401, is 8 μm. The largest horizontal dimension (such as the bottom surface) of the small micro-lens, such as 1006, is 18 μm. The largest horizontal dimension of the big micro-lens (such as the bottom surface), such as 1002, is 36 μm. FIGS. 11A-11E also show the change of the exiting light intensity from the light emitting structure 1000 as the angle of the exiting light ray relative to an axis perpendicular to the substrate 410 (exiting angle θ represented in degrees) changes.

Figure 11A:
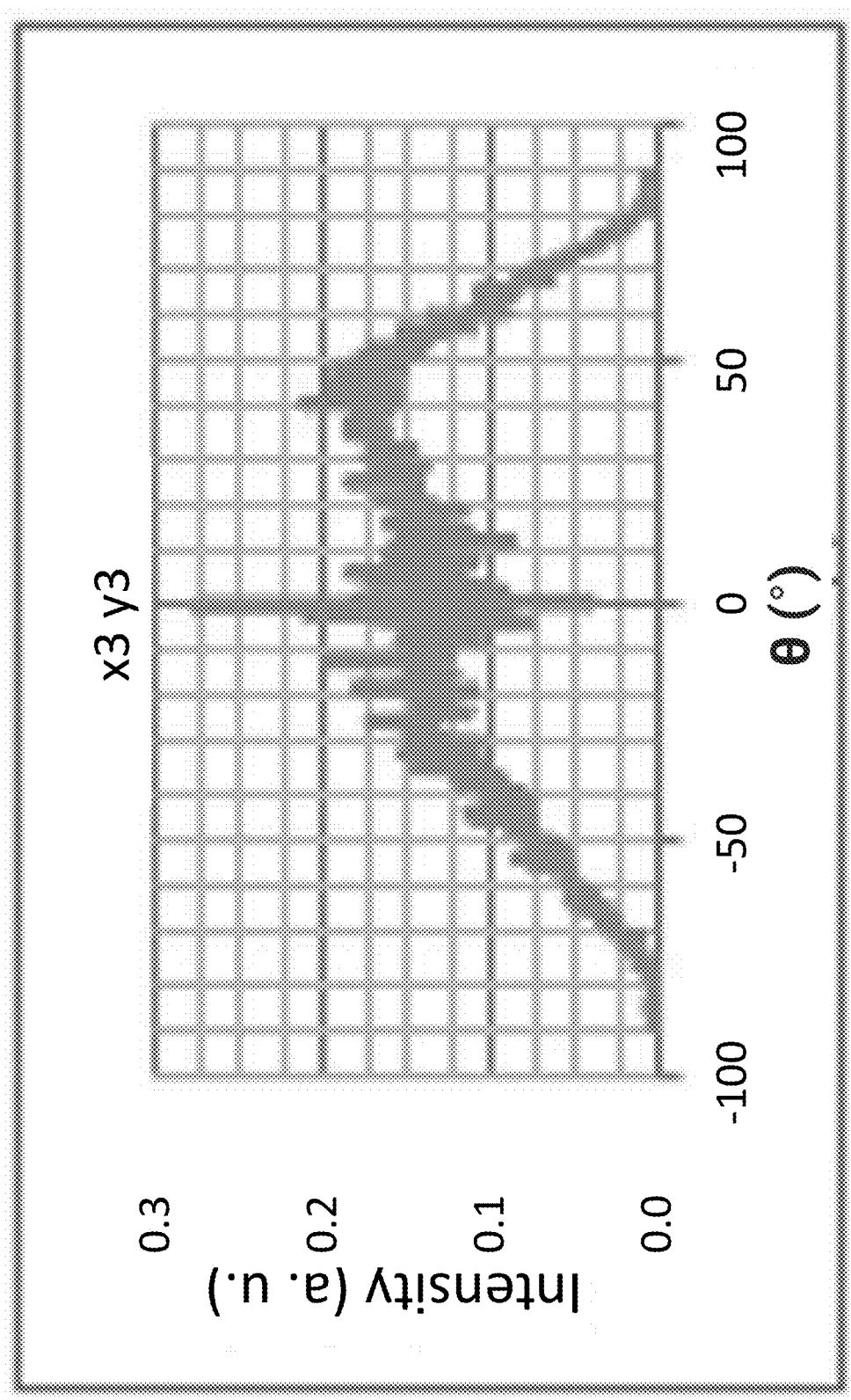
FIGS. 11A-11E illustrate some exemplary simulation results for the light exiting from the big micro-lens from the light emitting structure shown in FIG. 10, according to some embodiments.

For example, in FIG. 11A, when the offset distance between the central axis of the light emitting mesa and the central axis of the big micro-lens in the X direction is 3 µm, and in the Y direction is 3 µm, the maximum normalized exiting light intensity at 0 degree exiting angle is about 0.28 a.u. There is one secondary peak normalized exiting light intensity at around +40 degree exiting angle and the secondary peak intensity is about 0.175 a.u. When the value of the exiting angle is larger than 40 degrees, the light intensity gradually decreases to zero as the value of the exiting angle becomes bigger. When the value of the exiting angle is smaller than 40 degrees and larger than 0 degree, the light intensity gradually decreases as the value of the existing angle becomes smaller with a minimum intensity value at about 0.05 a.u. near 0 degree exiting angle. When the value of the exiting angle is smaller than 0 degree, the light intensity stays stable till around −30 degrees, and then gradually decreases to zero as the value of the exiting angle becomes smaller.

Figure 11B:
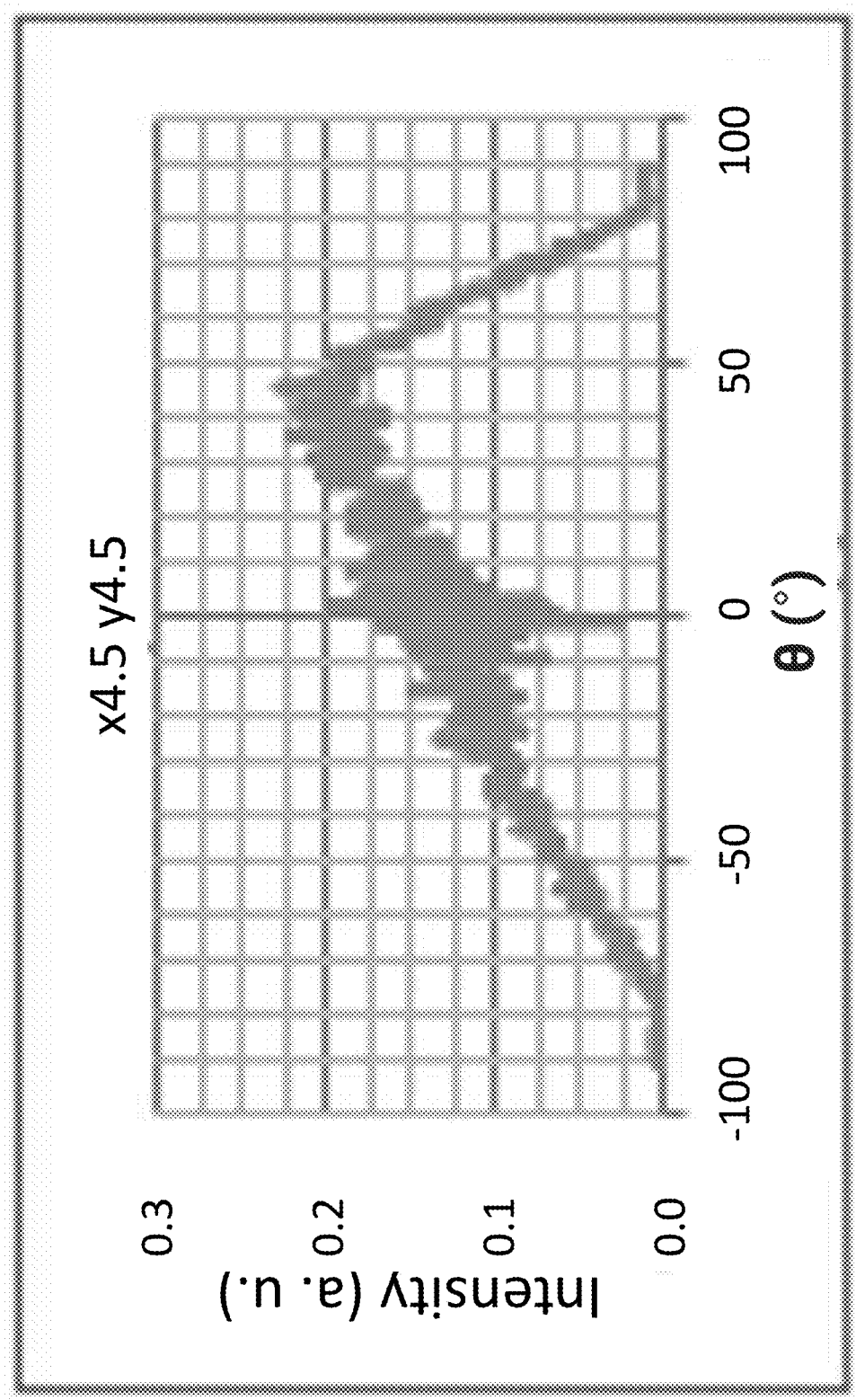

For example, in FIG. 11B, when the offset distance between the central axis of the light emitting mesa and the central axis of the big micro-lens in the X direction is 4.5 µm, and in the Y direction is 4.5 µm, the maximum normalized exiting light intensity at 0 degree exiting angle is about 0.2 a.u. There is one peak normalized exiting light intensity at around +45 degree exiting angle and the peak intensity is about 0.2 a.u. When the value of the exiting angle is larger than 45 degrees, the light intensity gradually decreases to zero as the value of the exiting angle becomes bigger. When the value of the exiting angle is smaller than 45 degrees and larger than 0 degree, the light intensity gradually decreases as the value of the existing angle becomes smaller with a minimum intensity value at about 0.025 a.u. near 0 degree exiting angle. When the value of the exiting angle is smaller than 0 degree, the light intensity gradually decreases to zero as the value of the exiting angle becomes smaller.

Figure 11C:
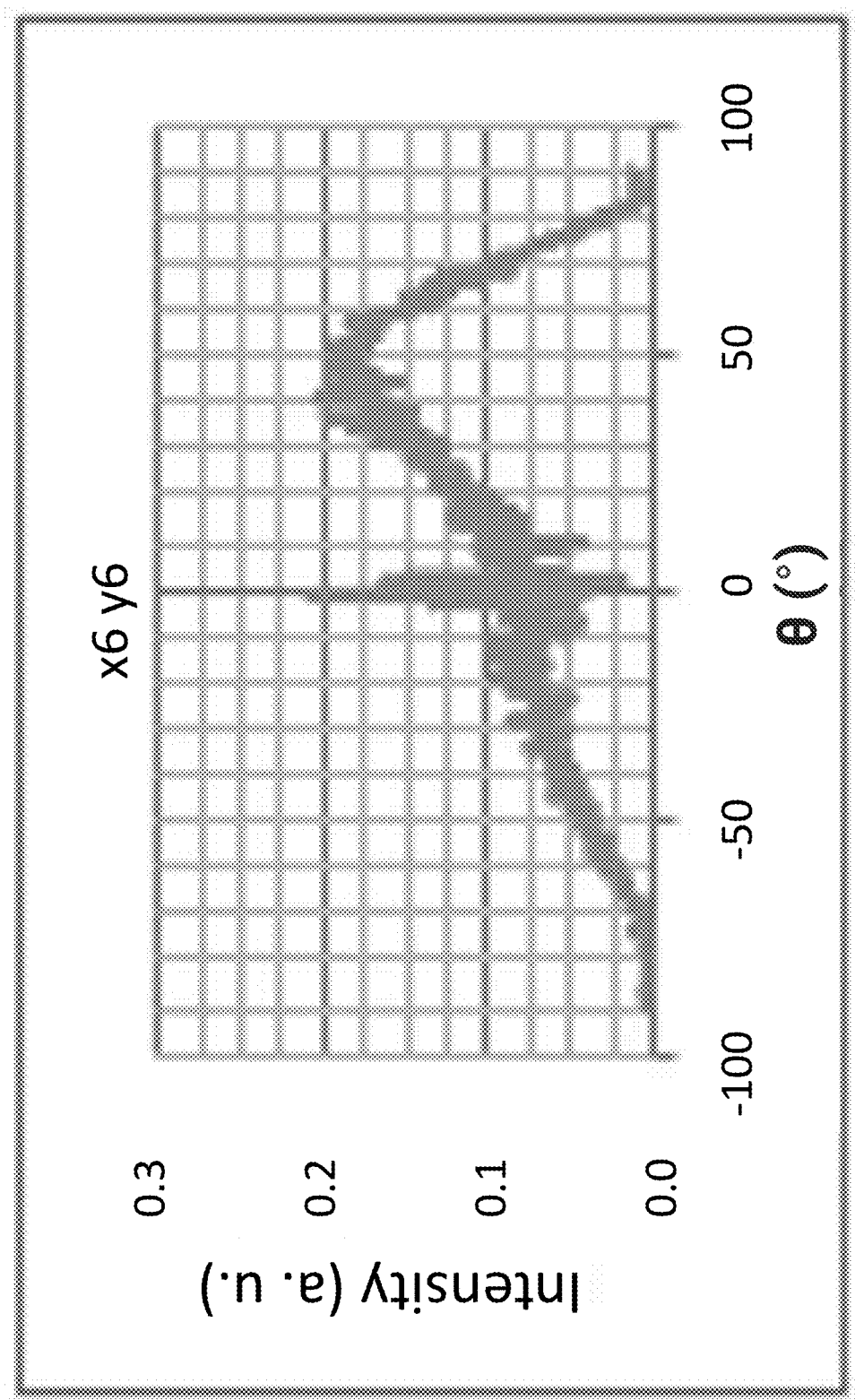

For example, in FIG. 11C, when the offset distance between the central axis of the light emitting mesa and the central axis of the big micro-lens in the X direction is 6 µm, and in the Y direction is 6 µm, the maximum normalized exiting light intensity at 0 degree exiting angle is about 0.21 a.u. There is a secondary peak normalized exiting light intensity at around +50 degree exiting angle and the secondary peak intensity is about 0.18 a.u. When the value of the exiting angle is larger than 50 degrees, the light intensity gradually decreases to zero as the value of the exiting angle becomes bigger. When the value of the exiting angle is smaller than 50 degrees and larger than 0 degree, the light intensity gradually decreases as the value of the existing angle becomes smaller with a minimum intensity value at about 0.025 a.u. near 0 degree exiting angle. When the value of the exiting angle is smaller than 0 degree, the light intensity stays stable till around −20 degrees, and then gradually decreases to zero as the value of the exiting angle becomes smaller.

Figure 11D:
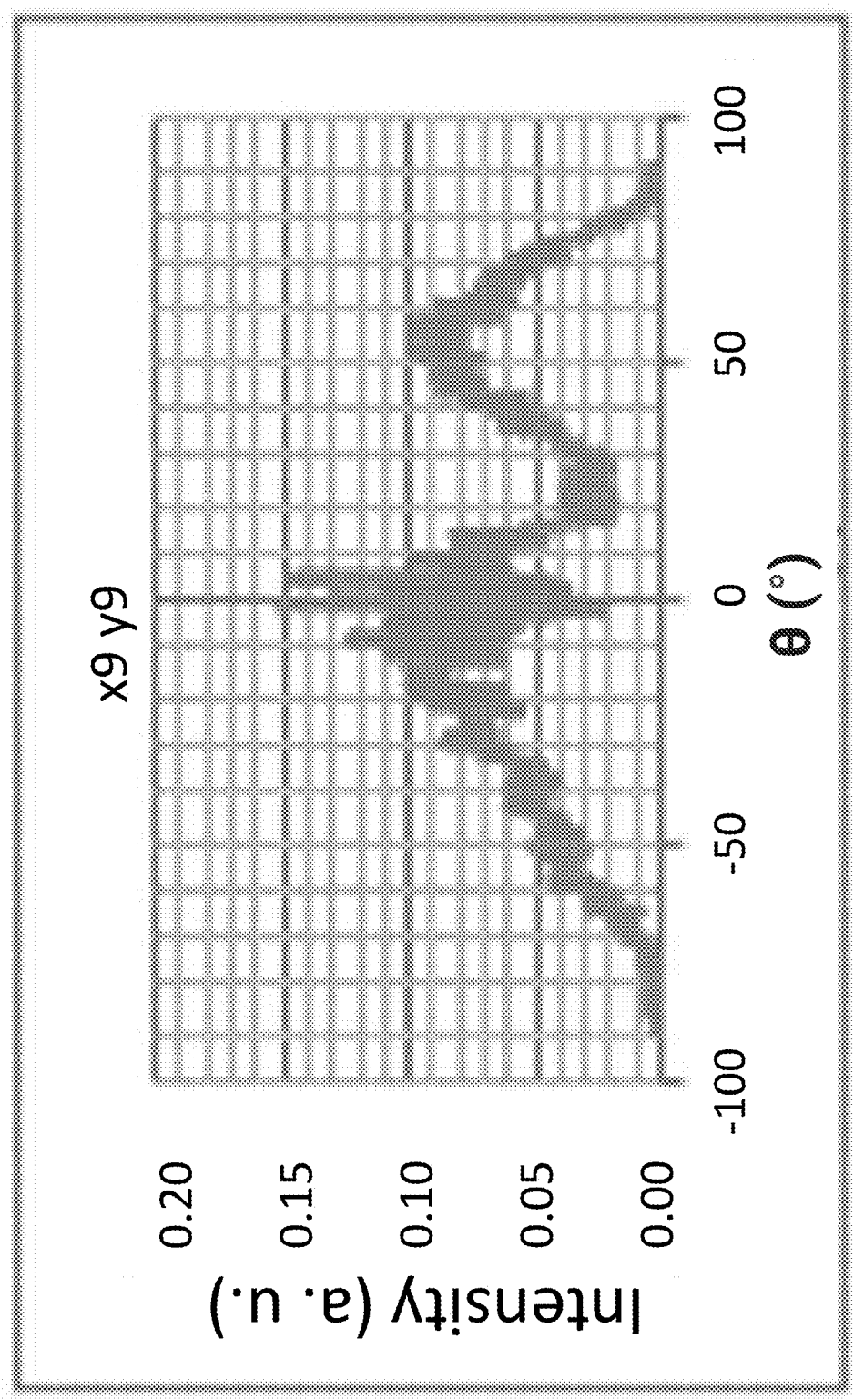

For example, in FIG. 11D, when the offset distance between the central axis of the light emitting mesa and the central axis of the big micro-lens in the X direction is 9 µm, and in the Y direction is 9 µm, the maximum normalized exiting light intensity at 0 degree exiting angle is about 0.15 a.u. There is a secondary peak normalized exiting light intensity at around +55 degree exiting angle and the secondary peak intensity is about 0.09 a.u. When the value of the exiting angle is larger than 55 degrees, the light intensity gradually decreases to zero as the value of the exiting angle becomes bigger. When the value of the exiting angle is smaller than 55 degrees and larger than 0 degree, the light intensity gradually decreases as the value of the existing angle becomes smaller with a minimum intensity value at about 0.03 a.u. near 25 degrees and the light intensity gradually increases as the value of the existing angle becomes smaller. When the value of the exiting angle is smaller than 0 degree, the light intensity stays stable till around −20 degrees, and then gradually decreases to zero as the value of the exiting angle becomes smaller.

Figure 11E:
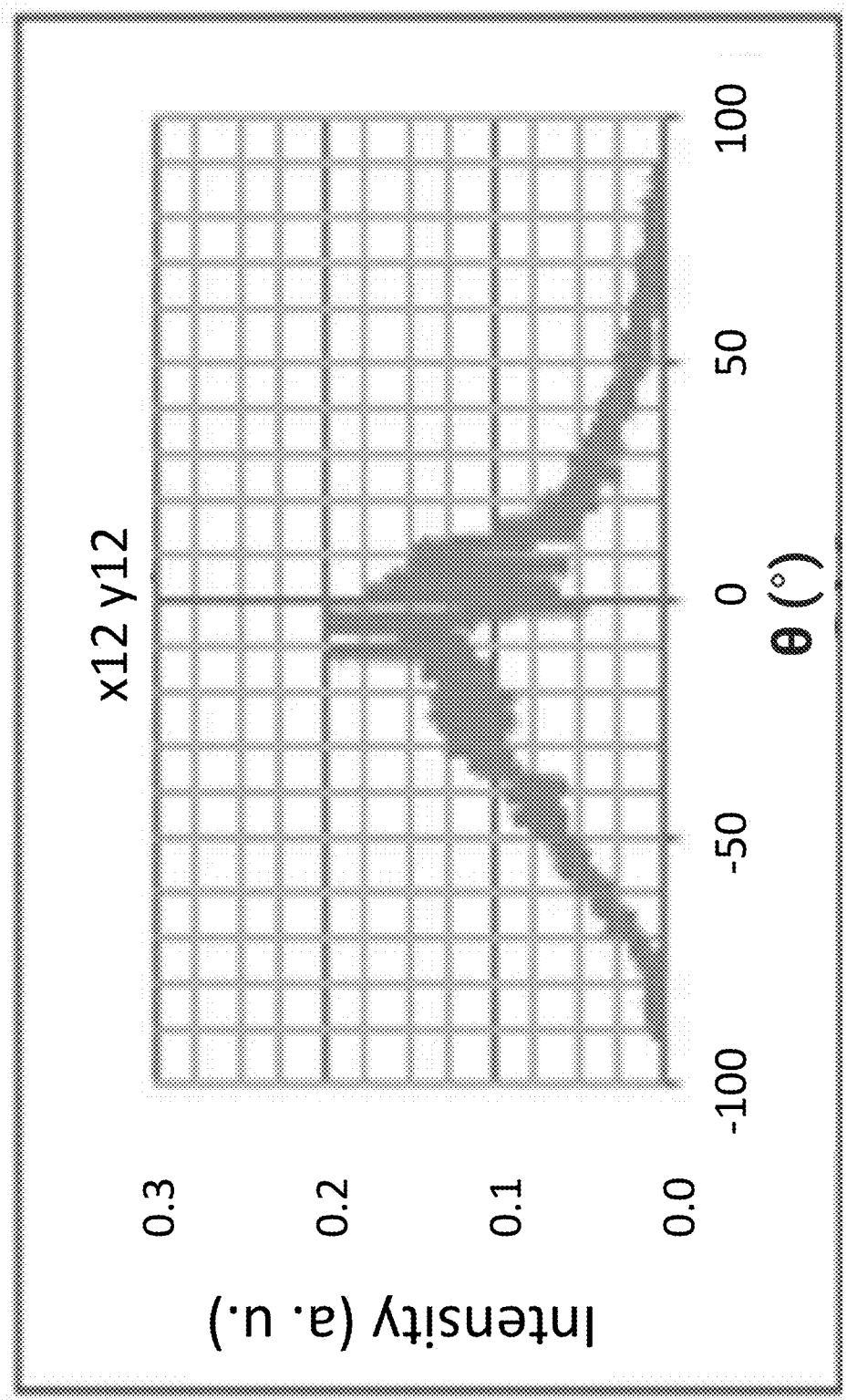

For example, in FIG. 11E, when the offset distance between the central axis of the light emitting mesa and the central axis of the big micro-lens in the X direction is 12 µm, and in the Y direction is 12 µm, the maximum normalized exiting light intensity at 0 degree exiting angle is about 0.2 a.u. When the value of the exiting angle is smaller than 0 degree, the light intensity gradually decreases to zero as the value of the exiting angle becomes smaller. When the value of the exiting angle is bigger than 0 degree, the light intensity gradually decreases to zero as the value of the exiting angle becomes bigger.

Figure 12:
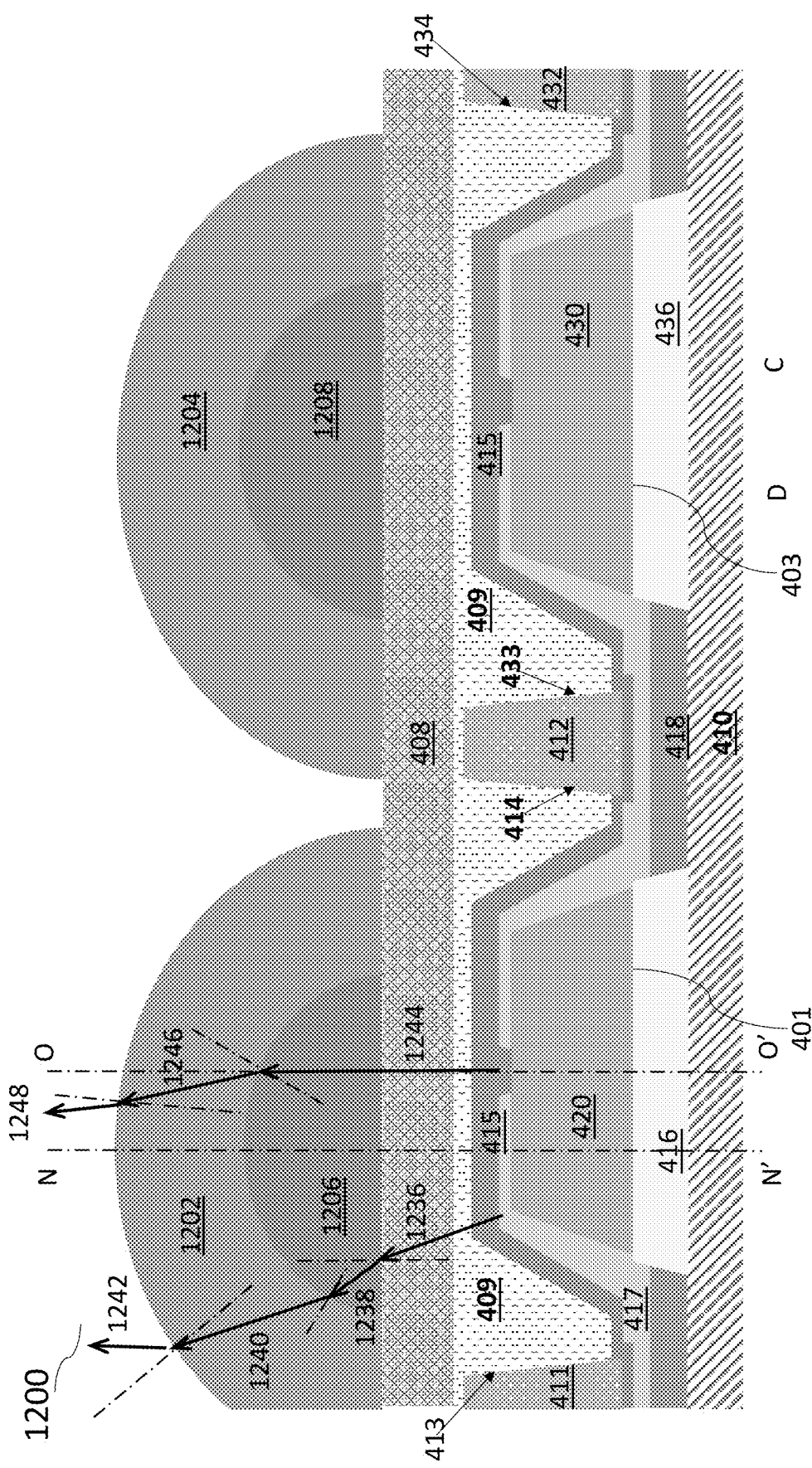
FIG. 12 illustrates a cross-sectional view of an exemplary light emitting structure having a small micro-lens within a big micro-lens, wherein the lateral dimension of the small micro-lens is smaller than that of the big micro-lens, according to some embodiments.

FIG. 12 illustrates a cross-sectional view of an exemplary light emitting structure 1200 having a small micro-lens within a big micro-lens, wherein the lateral dimension of the small micro-lens is smaller than that of the big micro-lens, according to some embodiments. The big micro-lens and light emitting mesa pair (including related reflective cups, and optional spacers) array structure, dimension, shape, fabrication, and material, is the same or similar to the light emitting structure described in any one of FIGS. 1-7. The material, shape, and fabrication of the small micro-lens is similar to the big micro-lens as described above in FIGS. 1-7. In some embodiments, within the same micro-lens group and light emitting mesa pair, the light emitting structure 1200 includes a small micro-lens, such as 1206 or 1208, and a big micro-lens, such as 1202 or 1204. The small micro-lens, such as 1206 or 1208, is formed on the light emitting mesa, such as 401 or 403. The big micro-lens is formed on the light emitting mesa, such as 401 or 403, and covers the small micro-lens, such as 1206 or 1208. The diameter of the big micro-lens, such as 1202, is larger than the diameter of the small micro-lens, such as 1206, so as to improve the light extraction efficiency.

In some embodiments, as shown in FIG. 12, the central axis N-N' of the small micro-lens 1206 and the central axis of the big micro-lens 1202 shift from the central axis O-O' of the light emitting mesa 401 to change the light direction, while the central axis of the small micro-lens 1206 is coaxially aligned with (or the same as) the central axis of the big micro-lens 1202. Preferably, the offset distance between the central axis of the big micro-lens 1202 and the central axis of the light emitting mesa 401 is not more than 12 µm.

In some embodiments, the edge of the small micro-lens 1206 covers the central axis of the light emitting mesa 401, as shown in FIG. 12, and the edge of the big micro-lens 1202 covers the central axis of the light emitting mesa 401, also as described above in FIG. 4. In other words, the central axis O-O' of the light emitting mesa 401 intersects with the bottom surface of the small micro-lens 1206, and the central axis O-O' of the light emitting mesa 401 intersects with the bottom surface of the big micro-lens 1202.

In some embodiments, the light ray 1236 emitting from the light emitting mesa 401 is redirected as 1238 while it travels through the small micro-lens 1206, is then redirected as 1240 while it travels through the big micro-lens 1202 and as 1242 out of the big micro-lens 1202. The light ray 1244 emitted from the light emitting mesa 401 travels through the small micro-lens 1206, is then redirected as 1246 while it travels through the big micro-lens 1202, and as 1248 out of the big micro-lens 1202. The addition of the small micro-lens within the big micro-lens can further direct and adjust the light within a certain portion of the LED pixel structure to a certain angle especially when the first and the big micro-lenses have different refractive indices. For example, in FIG. 12, the light rays from the big micro-lens are more focused in certain directions around the light emitting mesa after exiting.

Figure 13:
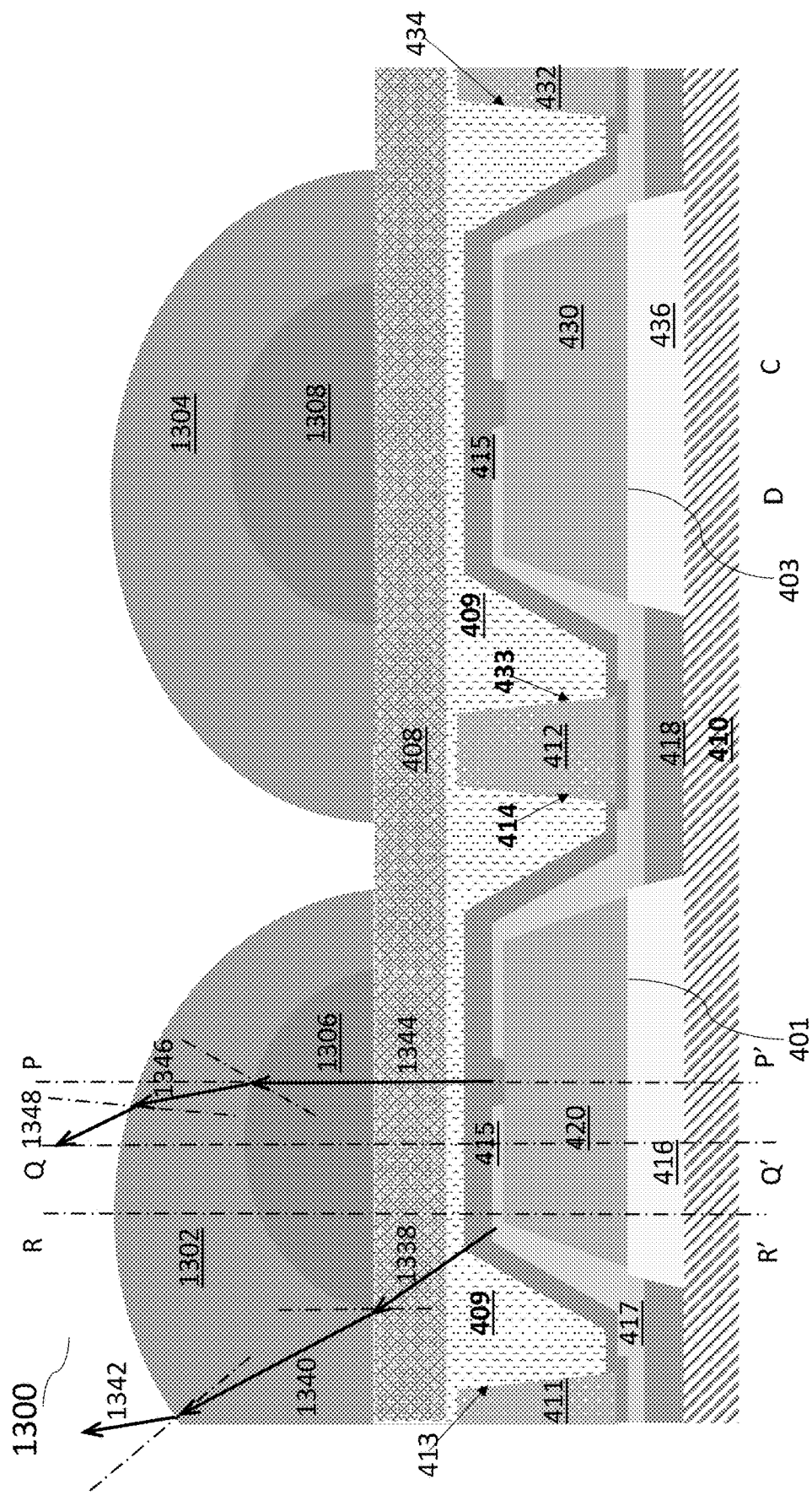
FIG. 13 illustrates a cross-sectional view of an exemplary light emitting structure having a small micro-lens within a big micro-lens, wherein the lateral dimension of the small micro-lens is smaller than that of the big micro-lens, according to some embodiments.

FIG. 13 illustrates a cross-sectional view of an exemplary light emitting structure 1300 having a small micro-lens within a big micro-lens, wherein the lateral dimension of the small micro-lens is smaller than that of the big micro-lens, according to some embodiments. The big micro-lens and light emitting mesa pair (including related reflective cups, and optional spacers) array structure, dimension, shape, fabrication, and material, is the same or similar to the light emitting structure described in any one of FIGS. 1-7. The material, shape, and fabrication of the small micro-lens is similar to the big micro-lens as described above in FIGS. 1-7. In some embodiments, within the same micro-lens group and light emitting mesa pair, the light emitting structure 1300 includes a small micro-lens, such as 1306 or 1308, and a big micro-lens, such as 1302 or 1304. The small micro-lens, such as 1306 or 1308, is formed on the light emitting mesa, such as 401 or 403. The big micro-lens is formed on the light emitting mesa, such as 401 or 403, and covers the small micro-lens, such as 1306 or 1308. The diameter of the big micro-lens, such as 1302, is larger than the diameter of the small micro-lens, such as 1306, so as to improve the light extraction efficiency.

In some embodiments, as shown in FIG. 13, the central axis Q-Q' of the small micro-lens 1306 and the central axis R-R' of the big micro-lens 1302 shift from the central axis P-P' of the light emitting mesa 401 to change the light direction, while the central axis of the small micro-lens 1306 is not coaxially aligned with (or not the same as) the central axis of the big micro-lens 1302. Preferably, the offset distance between the central axis Q-Q' of the small micro-lens 1306 and the central axis R-R' of the big micro-lens 1302 is not more than 6 µm and is not less than 4.5 µm. In some embodiments, the central axis of the big micro-lens 1302 and the central axis of the light emitting mesa 401 is not more than 12 µm. Furthermore, the positions of the small micro-lens relative to the big micro-lens for a respective micro-lens group and light emitting mesa pair can be different within the same display panel to obtain various light directions and light angles.

In some embodiments, the edge of the small micro-lens 1306 covers the central axis P-P' of the light emitting mesa 401, as shown in FIG. 13, and the edge of the big micro-lens 1302 covers the central axis P-P' of the light emitting mesa 401, also as described above in FIG. 4. In other words, the central axis P-P' of the light emitting mesa 401 intersects with the bottom surface of the small micro-lens 1306, and the central axis P-P' of the light emitting mesa 401 intersects with the bottom surface of the second micro-lens 1302. In another embodiments, only the edge of the small micro-lens 1306 covers the central axis P-P' of the light emitting mesa 401.

In some embodiments, the light ray 1338 emitting from the light emitting mesa 401 is redirected as 1340 while it travels through the big micro-lens 1302 and as 1342 out of the big micro-lens 1302. The light ray 1344 emitted from the light emitting mesa 401 travels through the small micro-lens 1306, is then redirected as 1346 while it travels through the big micro-lens 1302, and as 1348 out of the big micro-lens 1302. The addition of the small micro-lens within the big micro-lens can further direct and adjust the light within a certain portion of the LED pixel structure to a certain angle especially when the first and the big micro-lenses have different refractive indices. For example, in FIG. 13, the light rays from the big micro-lens are more focused in certain directions around the light emitting mesa after exiting.

Figure 14A:
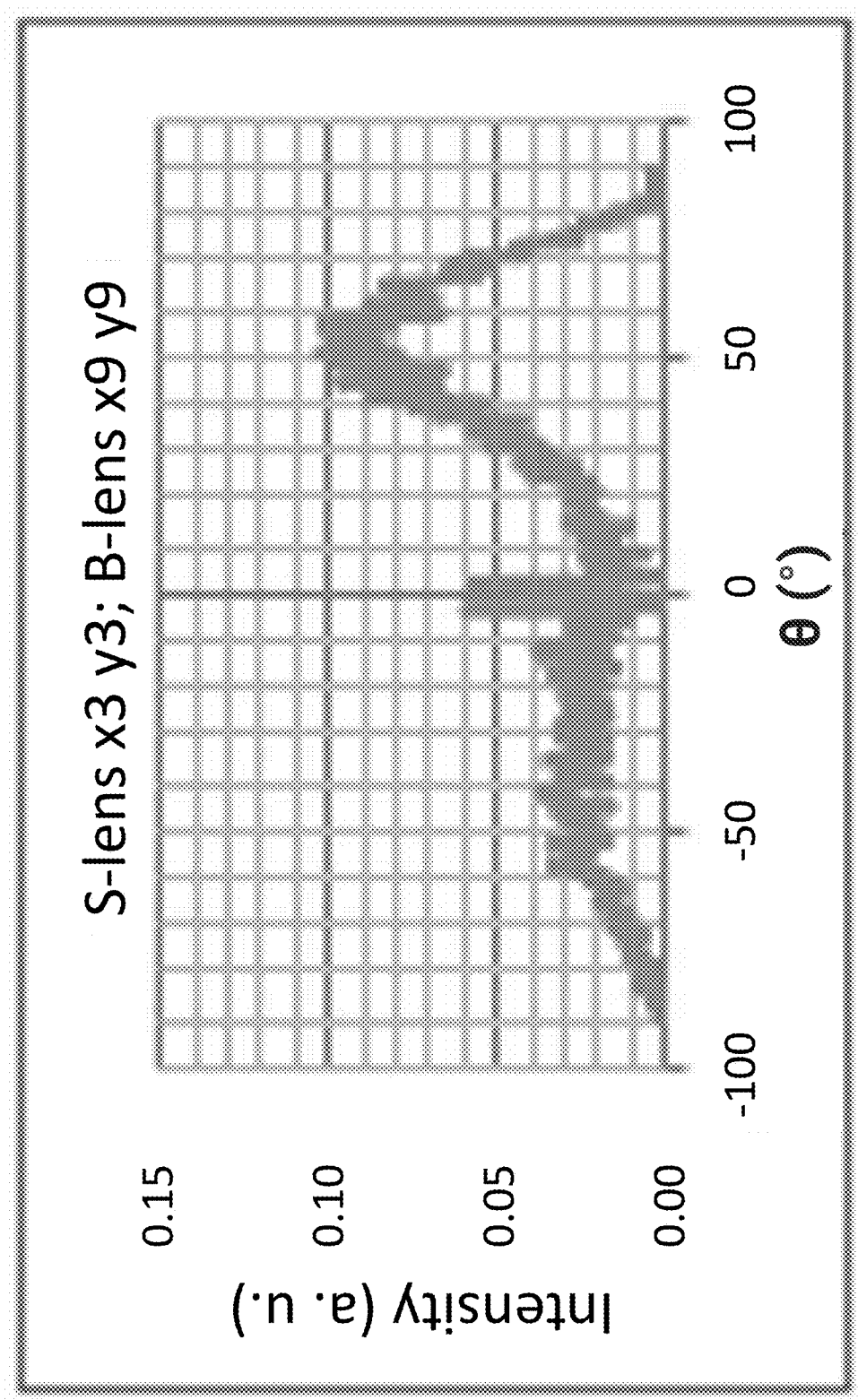
FIGS. 14A-14B illustrate some exemplary simulation results for the light exiting from the big micro-lens from the light emitting structure shown in FIG. 13, according to some embodiments.
Figure 14B:
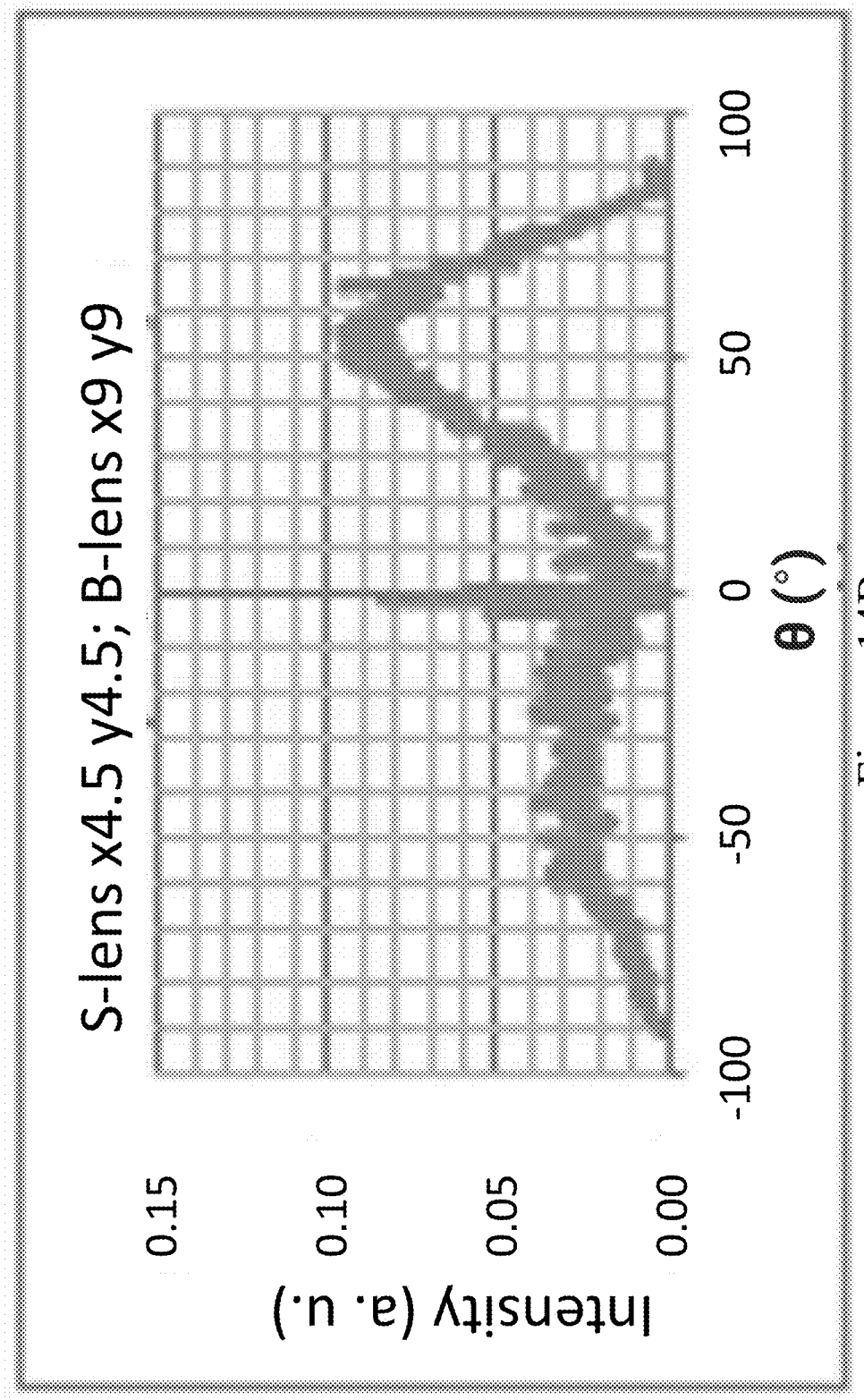

FIGS. 14A-14B illustrate some exemplary simulation results for the light exiting from the big micro-lens from the light emitting structure 1300 shown in FIG. 13, according to some embodiments. FIGS. 14A-14B show the change of the exiting light intensity from the light emitting structure 1300 as the offset distance between the central axis P-P' of the light emitting mesa, such as 401, and the central axis Q-Q' of the small micro-lens, such as 1306, and the offset distance between the central axis P-P' of the light emitting mesa, such as 401, and the central axis R-R' of the big micro-lens, such as 1302, both changes. The exiting light intensity was measured in a vertical plane that passes the vertical central axis of the light emitting mesa, such as the central axis P-P' of the light emitting mesa 401. X and Y denote the offset distances in micrometers on a horizontal plane parallel to the substrate 410 in the two orthogonal directions: X direction and Y direction. In this example, the largest horizontal dimension (such as the bottom surface) of the light emitting mesa, such 401, is 8 µm. The largest horizontal dimension (such as the bottom surface) of the small micro-lens, such as 1306, is 18 µm. The largest horizontal dimension of the big micro-lens (such as the bottom surface), such as 1302, is 36 µm. FIGS. 14A-14B also show the change of the exiting light intensity from the light emitting structure 1300 as the angle of the exiting light ray relative to an axis perpendicular to the substrate 410 (exiting angle θ represented in degrees) changes.

For example, in FIG. 14A, when the offset distance between the central axis of the light emitting mesa and the central axis of the small micro-lens in the X direction is 3 µm, and in the Y direction is 3 µm, and the offset distance between the central axis of the light emitting mesa and the central axis of the big micro-lens in the X direction is 9 µm, and in the Y direction is 9 µm, the maximum normalized exiting light intensity at 0 degree exiting angle is about 0.06 a.u. There is a peak normalized exiting light intensity at around +55 degree exiting angle and the peak intensity is about 0.095 a.u. When the value of the exiting angle is larger than +55 degrees, the light intensity gradually decreases to zero as the value of the exiting angle becomes bigger. When the value of the exiting angle is smaller than 55 degrees and larger than 0 degree, the light intensity gradually decreases as the value of the existing angle becomes smaller with a minimum intensity value at about 0.015 a.u. near 0 degree exiting angle. When the value of the exiting angle is smaller than 0 degree, the light intensity stays stable at 0.025 a.u. till around −55 degrees, and then gradually decreases to zero as the value of the exiting angle becomes smaller.

For example, in FIG. 14B, when the offset distance between the central axis of the light emitting mesa and the central axis of the small micro-lens in the X direction is 4.5 µm, and in the Y direction is 4.5 µm, and the offset distance between the central axis of the light emitting mesa and the central axis of the big micro-lens in the X direction is 9 µm, and in the Y direction is 9 µm, the maximum normalized exiting light intensity at 0 degree exiting angle is about 0.08 a.u. There is a peak normalized exiting light intensity at around +55 degree exiting angle and the peak intensity is about 0.09 a.u. When the value of the exiting angle is larger than +55 degrees, the light intensity gradually decreases to zero as the value of the exiting angle becomes bigger. When the value of the exiting angle is smaller than +55 degrees and larger than 0 degree, the light intensity gradually decreases as the value of the existing angle becomes smaller with a minimum intensity value at about 0.015 a.u. near 0 degree exiting angle. When the value of the exiting angle is smaller than 0 degree, the light intensity stays stable at 0.025 a.u. till around −55 degrees, and then gradually decreases to zero as the value of the exiting angle becomes smaller.

In some embodiments of FIGS. 8-13, preferably, the edge of the big micro-lens covers the central axis of the light emitting mesa, thereby avoiding the light extraction efficiency reduction. In some embodiments of FIGS. 8-13, the material of the small micro-lens is different from the material of the big micro-lens, for example, the big micro-lens and the small micro-lens has different refractive indices with different optical properties. In some embodiments of FIGS. 8-13, the material of the small micro-lens is the same as the material of the big micro-lens to avoid light loss at the interfaces.

Figure 15:
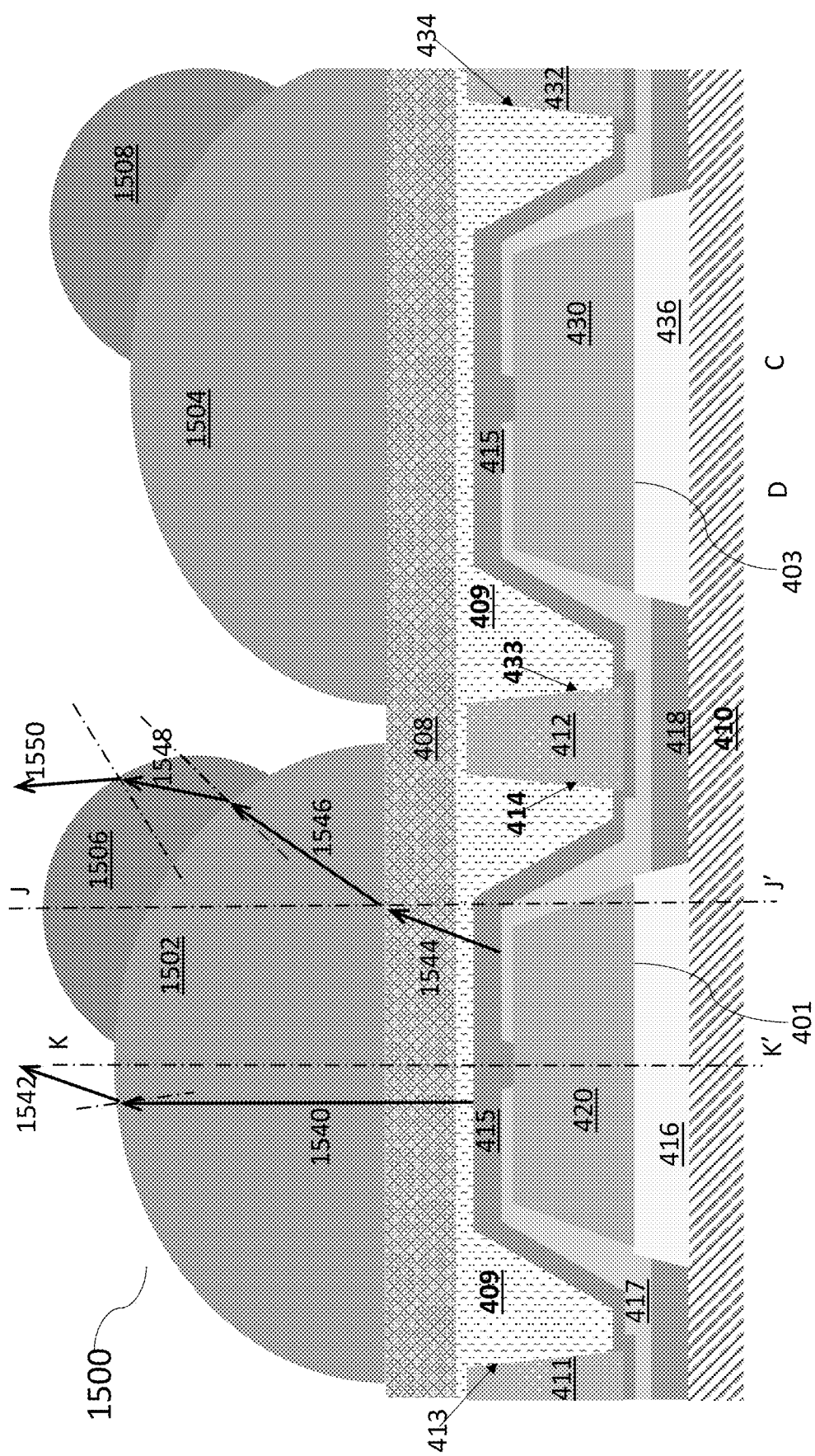
FIG. 15 illustrates a cross-sectional view of an exemplary light emitting structure having a small micro-lens above a big micro-lens (or the small micro-lens located farther on the light emitting path of the light emitting structure relative to the big micro-lens), wherein the lateral dimension of the small micro-lens is smaller than that of the big micro-lens, according to some embodiments.

FIG. 15 illustrates a cross-sectional view of an exemplary light emitting structure 1500 having a small micro-lens above a big micro-lens (or the small micro-lens located farther on the light emitting path of the light emitting structure relative to the big micro-lens), wherein the lateral dimension of the small micro-lens is smaller than that of the big micro-lens, according to some embodiments. The big micro-lens and light emitting mesa pair (including related reflective cups, and optional spacers) array structure, dimension, shape, fabrication, and material, is the same or similar to the light emitting structure described in any one of FIGS. 1-7. The material, shape, and fabrication of the small micro-lens is similar to the big micro-lens as described above in FIGS. 1-7. In some embodiments, within the same micro-lens group and light emitting mesa pair, the light emitting structure 1500 includes a small micro-lens, such as 1506 or 1508, and a big micro-lens, such as 1502 or 1504. The big micro-lens, such as 1502 or 1504, is formed on the light emitting mesa, such as 401 or 403. The small micro-lens is formed above the big micro-lens, such as 1502 or 1504, and covers a portion of the surface of the big micro-lens but does not cover the whole surface of the big micro-lens. The diameter of the big micro-lens, such as 1502, is larger than the diameter of the small micro-lens, such as 1506, so as to improve the light extraction efficiency. In some embodiments as shown in FIG. 15, the small micro-lens, such as 1506 is formed directly on the big micro-lens, such as 1502, in a way that the top surface of the big micro-lens is intact (with its original shape, such as a hemisphere) and the bottom surface of the small micro-lens conforms to the shape of the surface of the big micro-lens. In some embodiments, the overall shape of the small micro-lens is a hemisphere with the bottom surface confirms to the shape of a portion of the top surface of the big micro-lens.

In some embodiments, as shown in FIG. 15, the central axis of the small micro-lens 1506 is defined as the axis perpendicular to the surface of the substrate 410 that passes through the center of the complete spherical shape or other shape that forms the small micro-lens (as an incomplete spherical shape or other shape). In some embodiments, the central axis J-J' of the small micro-lens 1506 is shifted from the central axis K-K' of the light emitting mesa 401 to change the light direction, while the central axis of the big micro-lens 1502 is coaxially aligned with (or the same as) the central axis K-K' of the light emitting mesa 401. In some embodiments, the offset distance between the central axis of the small micro-lens 1506 and the central axis of the light emitting mesa 401 is not more than 9 μm, preferably not more than 1.5 μm.

In some embodiments, the edge of the small micro-lens 1506 does not need to cover the central axis of the light emitting mesa 401, as shown in FIG. 15, while the edge of the big micro-lens 1502 covers the central axis of the light emitting mesa 401, also as described above in FIG. 4. In other words, the central axis K-K' of the light emitting mesa 401 does not need to intersect with the bottom surface of the small micro-lens 1506, while the central axis K-K' of the light emitting mesa 401 intersects with the bottom surface of the big micro-lens 1502. In some other embodiments, not shown in FIG. 15, both the edges of the small micro-lens 1506 and big micro-lens 1502 cover the central axis of the light emitting mesa 401. In other words, the central axis K-K' of the light emitting mesa 401 intersects with the bottom surface of the small micro-lens 1506, and the central axis K-K' of the light emitting mesa 401 intersects with the bottom surface of the big micro-lens 1502.

In some embodiments, the light ray 1540 emitted from the light emitting mesa 401 is redirected as 1542 out of the big micro-lens 1502. The light ray 1544 emitting from the light emitting mesa 401 is redirected as 1546 while it travels through the big micro-lens 1502, is then redirected as 1548 while it travels through the small micro-lens 1506, and as 1550 out of the small micro-lens 1506. The addition of the small micro-lens above the big micro-lens can further direct and adjust the light within a certain portion of the LED pixel structure to a certain angle. For example, in FIG. 15, the light rays from the big micro-lens are more focused in certain directions after exiting.

In some embodiments, the simulation results for the light exiting from the big micro-lens and small micro-lens from the light emitting structure 1500 shown in FIG. 15, are very similar to the situations as shown in FIGS. 9A-9D, when the small micro-lens is within the big micro-lens embodiments as shown in FIG. 8. For example, the exiting light intensity from the light emitting structure 1500 changes as the offset distance between the central axis K-K' of the light emitting mesa, such as 401, and the central axis J-J' of the small micro-lens, such as 1506, changes, while the central axis of the big micro-lens, such as 1502 is coaxially aligned with (or the same as) the central axis K-K' of the light emitting mesa, such as 401. The exiting light intensity was measured in a vertical plane that passes the vertical central axis of the light emitting mesa, such as the central axis K-K' of the light emitting mesa 401. X and Y denote the offset distances in micrometers on a horizontal plane parallel to the substrate 410 in the two orthogonal directions: X direction and Y direction. In this example, the largest horizontal dimension (such as the bottom surface) of the light emitting mesa, such 401, is 8 μm. The largest horizontal dimension of the small micro-lens, such as 1506, is 18 μm. The largest horizontal dimension of the big micro-lens (such as the bottom surface), such as 1502, is 36 μm. The exiting light intensity from the light emitting structure 1500 also changes as the angle of the exiting light ray relative to an axis perpendicular to the substrate 410 (exiting angle θ represented in degrees) changes.

Figure 16:
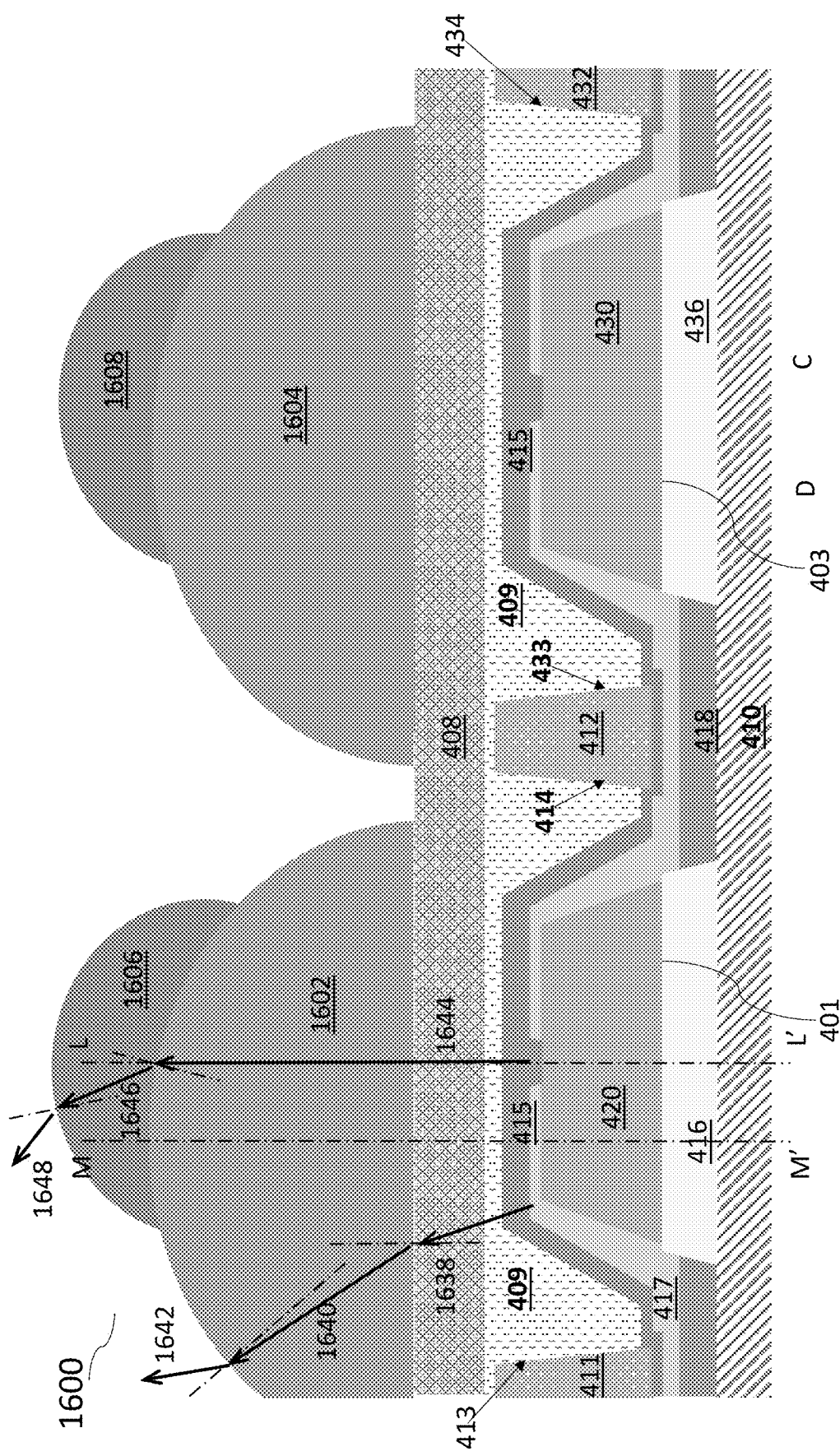
FIG. 16 illustrates a cross-sectional view of an exemplary light emitting structure having a small micro-lens above a big micro-lens (or the small micro-lens located farther on the light emitting path of the light emitting structure relative to the big micro-lens), wherein the lateral dimension of the small micro-lens is smaller than that of the big micro-lens, according to some embodiments.

FIG. 16 illustrates a cross-sectional view of an exemplary light emitting structure 1600 having a small micro-lens above a big micro-lens (or the small micro-lens located farther on the light emitting path of the light emitting structure relative to the big micro-lens), wherein the lateral dimension of the small micro-lens is smaller than that of the big micro-lens, according to some embodiments. The big micro-lens and light emitting mesa pair (including related reflective cups, and optional spacers) array structure, dimension, shape, fabrication, and material, is the same or similar to the light emitting structure described in any one of FIGS. 1-7. The material, shape, and fabrication of the small micro-lens is similar to the big micro-lens as described above in FIGS. 1-7. In some embodiments, within the same micro-lens group and light emitting mesa pair, the light emitting structure 1600 includes a small micro-lens, such as 1606 or 1608, and a big micro-lens, such as 1602 or 1604. The big micro-lens, such as 1602 or 1604, is formed on the light emitting mesa, such as 401 or 403. The small micro-lens is formed above the big micro-lens, such as 1602 or 1604, and covers a portion of the surface of the big micro-lens but does not cover the whole surface of the big micro-lens. The diameter of the big micro-lens, such as 1602, is larger than the diameter of the small micro-lens, such as 1606, so as to improve the light extraction efficiency. In some embodiments as shown in FIG. 16, the small micro-lens, such as 1606 is formed directly on the big micro-lens, such as 1602, in a way that the top surface of the big micro-lens is intact (with its original shape, such as a hemisphere) and the bottom surface of the small micro-lens conforms to the shape of the surface of the big micro-lens. In some embodiments, the overall shape of the small micro-lens is a hemisphere with the bottom surface confirms to the shape of a portion of the top surface of the big micro-lens.

In some embodiments, as shown in FIG. 16, the central axis of the small micro-lens 1606 is defined as the axis perpendicular to the surface of the substrate 410 that passes through the center of the complete spherical shape or other shape that forms the small micro-lens (as an incomplete spherical shape or other shape). In some embodiments, as shown in FIG. 16, the central axis M-M' of the big micro-lens 1602 is shifted from the central axis L-L' of the light emitting mesa 401 to change the light direction, while the central axis of the small micro-lens 1606 is coaxially aligned with (or the same as) the central axis L-L' of the light emitting mesa 401. Preferably, the offset distance between the central axis of the big micro-lens 1602 and the central axis of the light emitting mesa 401 is not more than 12 μm. In some embodiments, the offset distance between the central axis of the big micro-lens 1602 and the central axis of the light emitting mesa 401 is not more than 1.5 μm.

In some embodiments, the edge of the small micro-lens 1606 covers the central axis of the light emitting mesa 401, as shown in FIG. 16, and the edge of the big micro-lens 1602 covers the central axis of the light emitting mesa 401, also as described above in FIG. 4. In other words, the central axis L-L' of the light emitting mesa 401 intersects with the bottom surface of the small micro-lens 1606, and the central axis L-L' of the light emitting mesa 401 intersects with the bottom surface of the big micro-lens 1602.

In some embodiments, the light ray 1638 emitted from the light emitting mesa 401 is redirected as 1640 while it travels through the big micro-lens 1602, and is then redirected as 1642 out of the big micro-lens 1602. The light ray 1644 emitting from the light emitting mesa 401 travels through the big micro-lens 1602, is redirected as 1646 while it travels through the small micro-lens 1606, and is then redirected as 1648 out of the small micro-lens 1606. The addition of the small micro-lens above the big micro-lens can further direct and adjust the light within a certain portion of the LED pixel structure to a certain angle. For example, in FIG. 16, the light rays from the big micro-lens are more focused in certain directions after exiting.

In some embodiments, the simulation results for the light exiting from the big micro-lens and small micro-lens from the light emitting structure 1600 shown in FIG. 16, are very similar to the situations as shown in FIGS. 11A-11E, when the small micro-lens is within the big micro-lens embodiments as shown in FIG. 10.

Figure 17:
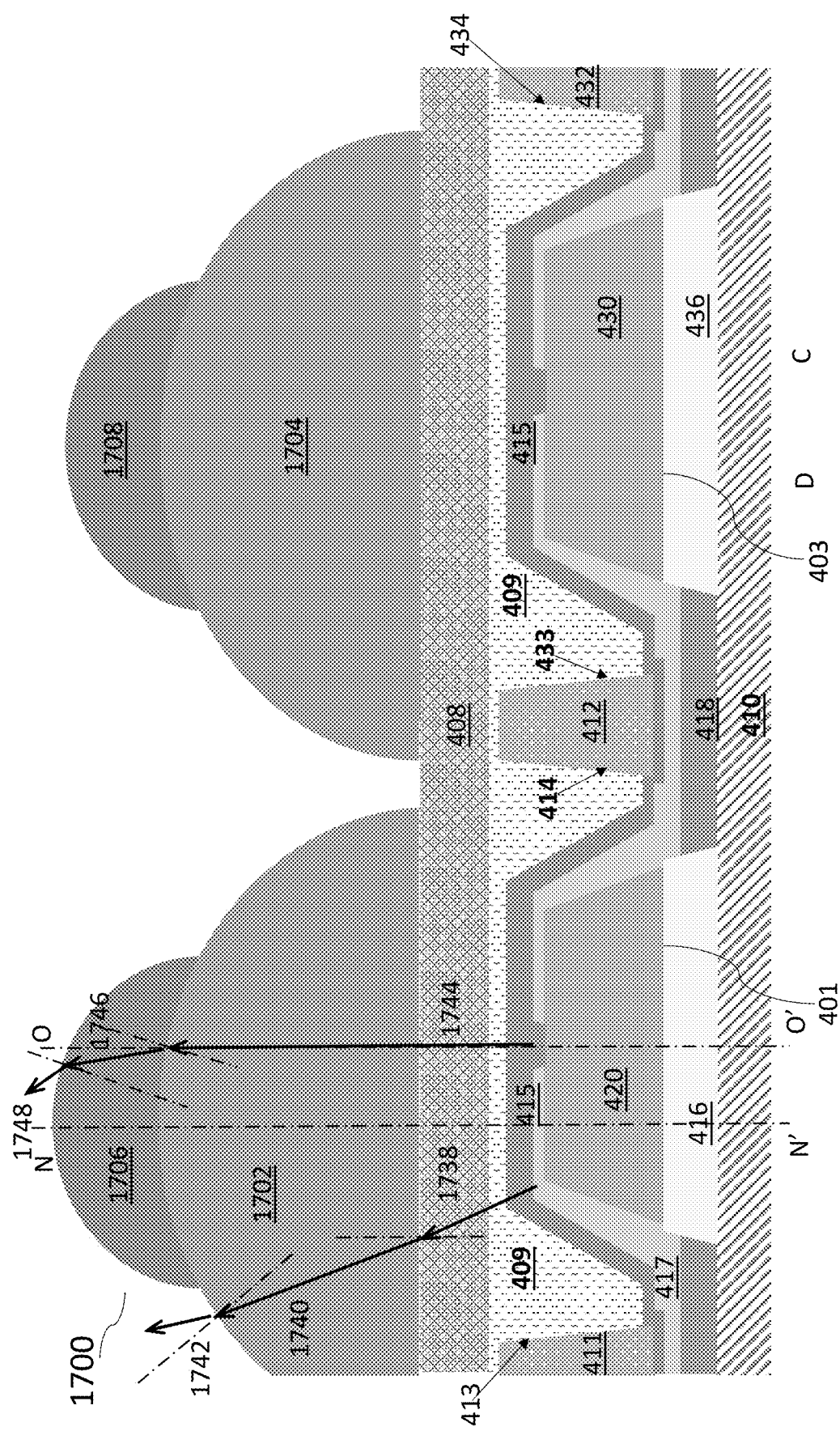
FIG. 17 illustrates a cross-sectional view of an exemplary light emitting structure having a small micro-lens above a big micro-lens (or the small micro-lens located farther on the light emitting path of the light emitting structure relative to the big micro-lens), wherein the lateral dimension of the small micro-lens is smaller than that of the big micro-lens, according to some embodiments.

FIG. 17 illustrates a cross-sectional view of an exemplary light emitting structure 1700 having a small micro-lens above a big micro-lens (or the small micro-lens located farther on the light emitting path of the light emitting structure relative to the big micro-lens), wherein the lateral dimension of the small micro-lens is smaller than that of the big micro-lens, according to some embodiments. The big micro-lens and light emitting mesa pair (including related reflective cups, and optional spacers) array structure, dimension, shape, fabrication, and material, is the same or similar to the light emitting structure described in any one of FIGS. 1-7. The material, shape, and fabrication of the small micro-lens is similar to the big micro-lens as described above in FIGS. 1-7. In some embodiments, within the same micro-lens group and light emitting mesa pair, the light emitting structure 1700 includes a small micro-lens, such as 1706 or 1708, and a big micro-lens, such as 1702 or 1704. The big micro-lens, such as 1702 or 1704, is formed on the light emitting mesa, such as 401 or 403. The small micro-lens is formed above the big micro-lens, such as 1702 or 1704, and covers a portion of the surface of the big micro-lens but does not cover the whole surface of the big micro-lens. The diameter of the big micro-lens, such as 1702, is larger than the diameter of the small micro-lens, such as 1706, so as to improve the light extraction efficiency. In some embodiments as shown in FIG. 17, the small micro-lens, such as 1706 is formed directly on the big micro-lens, such as 1702, in a way that the top surface of the big micro-lens is intact (with its original shape, such as a hemisphere) and the bottom surface of the small micro-lens conforms to the shape of the surface of the big micro-lens. In some embodiments, the overall shape of the small micro-lens is a hemisphere with the bottom surface confirms to the shape of a portion of the top surface of the big micro-lens.

In some embodiments, as shown in FIG. 17, the central axis of the small micro-lens 1706 is defined as the axis perpendicular to the surface of the substrate 410 that passes through the center of the complete spherical shape or other shape that forms the small micro-lens (as an incomplete spherical shape or other shape). In some embodiments, as shown in FIG. 17, the central axis N-N' of the small micro-lens 1706 and the central axis of the big micro-lens 1702 shift from the central axis O-O' of the light emitting mesa 401 to change the light direction, while the central axis of the small micro-lens 1706 is coaxially aligned with (or the same as) the central axis of the big micro-lens 1702. Preferably, the offset distance between the central axis of the big micro-lens 1702 and the central axis of the light emitting mesa 401 is not more than 12 μm.

In some embodiments, the edge of the small micro-lens 1706 covers the central axis of the light emitting mesa 401, as shown in FIG. 17, and the edge of the big micro-lens 1702 covers the central axis of the light emitting mesa 401, also as described above in FIG. 4. In other words, the central axis O-O' of the light emitting mesa 401 intersects with the bottom surface of the small micro-lens 1706, and the central axis O-O' of the light emitting mesa 401 intersects with the bottom surface of the big micro-lens 1702.

In some embodiments, the light ray 1738 emitting from the light emitting mesa 401 is redirected as 1740 while it travels through the big micro-lens 1702 and as 1742 out of the big micro-lens 1702. The light ray 1744 emitted from the light emitting mesa 401 travels through the big micro-lens 1702, is then redirected as 1746 while it travels through the small micro-lens 1706, and as 1748 out of the small micro-lens 1706. The addition of the small micro-lens above the big micro-lens can further direct and adjust the light within a certain portion of the LED pixel structure to a certain angle. For example, in FIG. 17, the light rays from the big micro-lens are more focused in certain directions around the light emitting mesa after exiting.

Figure 18:
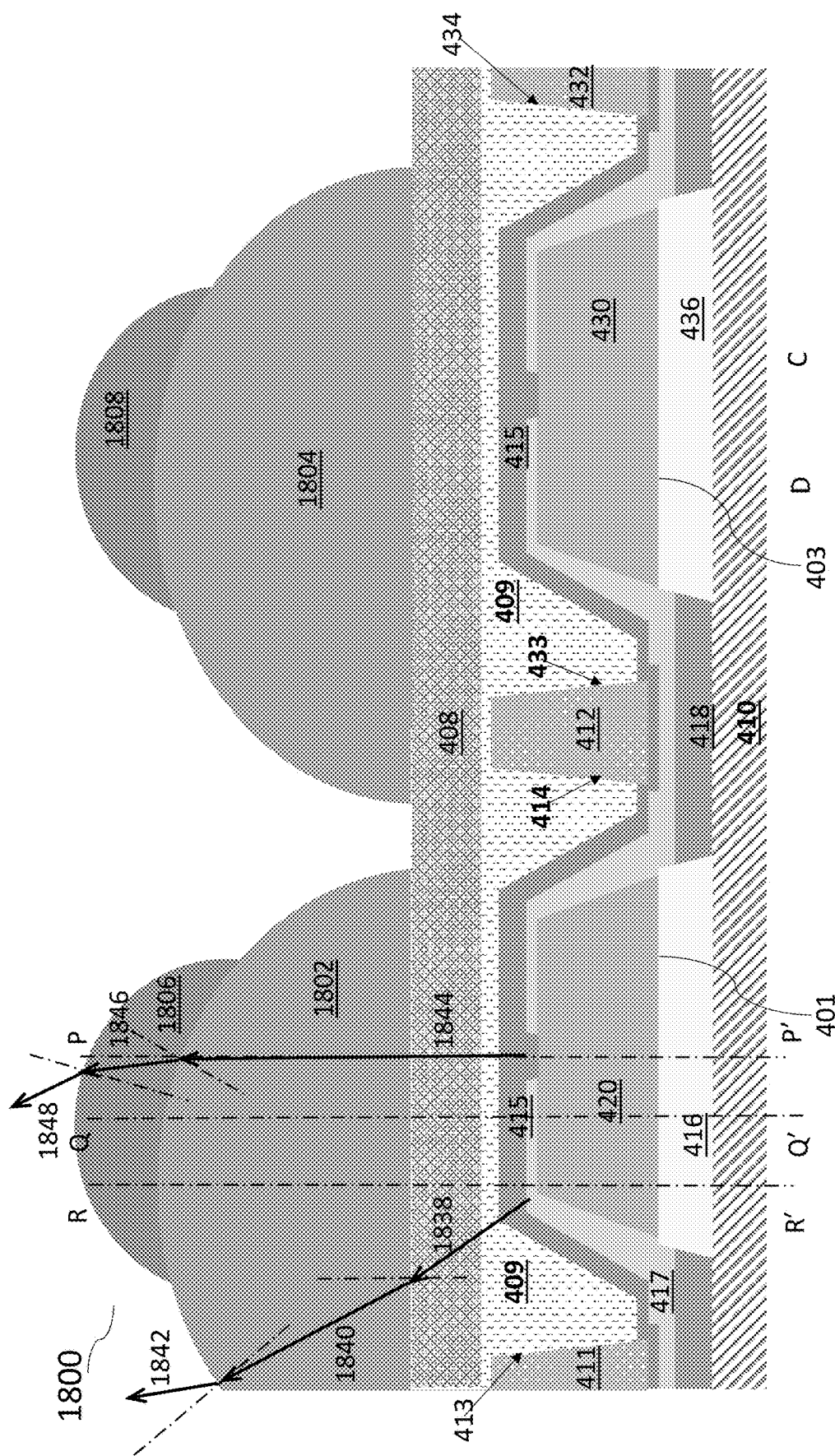
FIG. 18 illustrates a cross-sectional view of an exemplary light emitting structure having a small micro-lens above a big micro-lens (or the small micro-lens located farther on the light emitting path of the light emitting structure relative to the big micro-lens), wherein the lateral dimension of the small micro-lens is smaller than that of the big micro-lens, according to some embodiments.

FIG. 18 illustrates a cross-sectional view of an exemplary light emitting structure 1800 having a small micro-lens above a big micro-lens (or the small micro-lens located farther on the light emitting path of the light emitting structure relative to the big micro-lens), wherein the lateral dimension of the small micro-lens is smaller than that of the big micro-lens, according to some embodiments. The big micro-lens and light emitting mesa pair (including related reflective cups, and optional spacers) array structure, dimension, shape, fabrication, and material, is the same or similar to the light emitting structure described in any one of FIGS. 1-7. The material, shape, and fabrication of the small micro-lens is similar to the big micro-lens as described above in FIGS. 1-7. In some embodiments, within the same micro-lens group and light emitting mesa pair, the light emitting structure 1800 includes a small micro-lens, such as 1806 or 1808, and a big micro-lens, such as 1802 or 1804. The big micro-lens, such as 1802 or 1804, is formed on the light emitting mesa, such as 401 or 403. The small micro-lens is formed above the big micro-lens, such as 1802 or 1804, and covers a portion of the surface of the big micro-lens but does not cover the whole surface of the big micro-lens. The diameter of the big micro-lens, such as 1802, is larger than the diameter of the small micro-lens, such as 1806, so as to improve the light extraction efficiency. In some embodiments as shown in FIG. 18, the small micro-lens, such as 1806 is formed directly on the big micro-lens, such as 1802, in a way that the top surface of the big micro-lens is intact (with its original shape, such as a hemisphere) and the bottom surface of the small micro-lens conforms to the shape of the surface of the big micro-lens. In some embodiments, the overall shape of the small micro-lens is a hemisphere with the bottom surface confirms to the shape of a portion of the top surface of the big micro-lens.

In some embodiments, as shown in FIG. 18, the central axis of the small micro-lens 1806 is defined as the axis perpendicular to the surface of the substrate 410 that passes through the center of the complete spherical shape or other shape that forms the small micro-lens (as an incomplete spherical shape or other shape). In some embodiments, as shown in FIG. 18, the central axis Q-Q' of the small micro-lens 1806 and the central axis R-R' of the big micro-lens 1802 shift from the central axis P-P' of the light emitting mesa 401 to change the light direction, while the central axis of the small micro-lens 1806 is not coaxially aligned with (or not the same as) the central axis of the big micro-lens 1802. Preferably, the offset distance between the central axis Q-Q' of the small micro-lens 1806 and the central axis R-R' of the big micro-lens 1802 is not more than 6 µm and is not less than 4.5 µm. In some embodiments, the central axis of the big micro-lens 1802 and the central axis of the light emitting mesa 401 is not more than 12 µm. Furthermore, the positions of the small micro-lens relative to the big micro-lens for a respective micro-lens group and light emitting mesa pair can be different within the same display panel to obtain various light directions and light angles.

In some embodiments, the edge of the small micro-lens 1806 covers the central axis P-P' of the light emitting mesa 401, as shown in FIG. 18, and the edge of the big micro-lens 1802 covers the central axis of the light emitting mesa 401, also as described above in FIG. 4. In other words, the central axis P-P' of the light emitting mesa 401 intersects with the bottom surface of the small micro-lens 1806, and the central axis P-P' of the light emitting mesa 401 intersects with the bottom surface of the second micro-lens 1802. In another embodiments, only the edge of the big micro-lens 1802 covers the central axis P-P' of the light emitting mesa 401.

In some embodiments, the light ray 1838 emitting from the light emitting mesa 401 is redirected as 1840 while it travels through the big micro-lens 1802 and as 1842 out of the big micro-lens 1802. The light ray 1844 emitted from the light emitting mesa 401 travels through the big micro-lens 1802, is then redirected as 1846 while it travels through the small micro-lens 1806, and as 1848 out of the small micro-lens 1806. The addition of the small micro-lens above the big micro-lens can further direct and adjust the light within a certain portion of the LED pixel structure to a certain angle. For example, in FIG. 18, the light rays from the big micro-lens are more focused in certain directions around the light emitting mesa after exiting.

In some embodiments, the simulation results for the light exiting from the big micro-lens and small micro-lens from the light emitting structure 1800 shown in FIG. 18, are very similar to the situations as shown in FIGS. 14A-14B, when the small micro-lens is within the big micro-lens embodiments as shown in FIG. 13.

In some embodiments of FIGS. 15-18, preferably, the edge of the big micro-lens covers the central axis of the light emitting mesa, thereby avoiding the light extraction efficiency reduction. In some preferred embodiments of FIGS. 15-18, the material of the small micro-lens is the same as the material of the big micro-lens to avoid light loss at the interfaces. In some embodiments of FIGS. 15-18, the material of the small micro-lens is different from the material of the big micro-lens, for example, the big micro-lens and the small micro-lens has different refractive indices with different optical properties.

Figure 19:
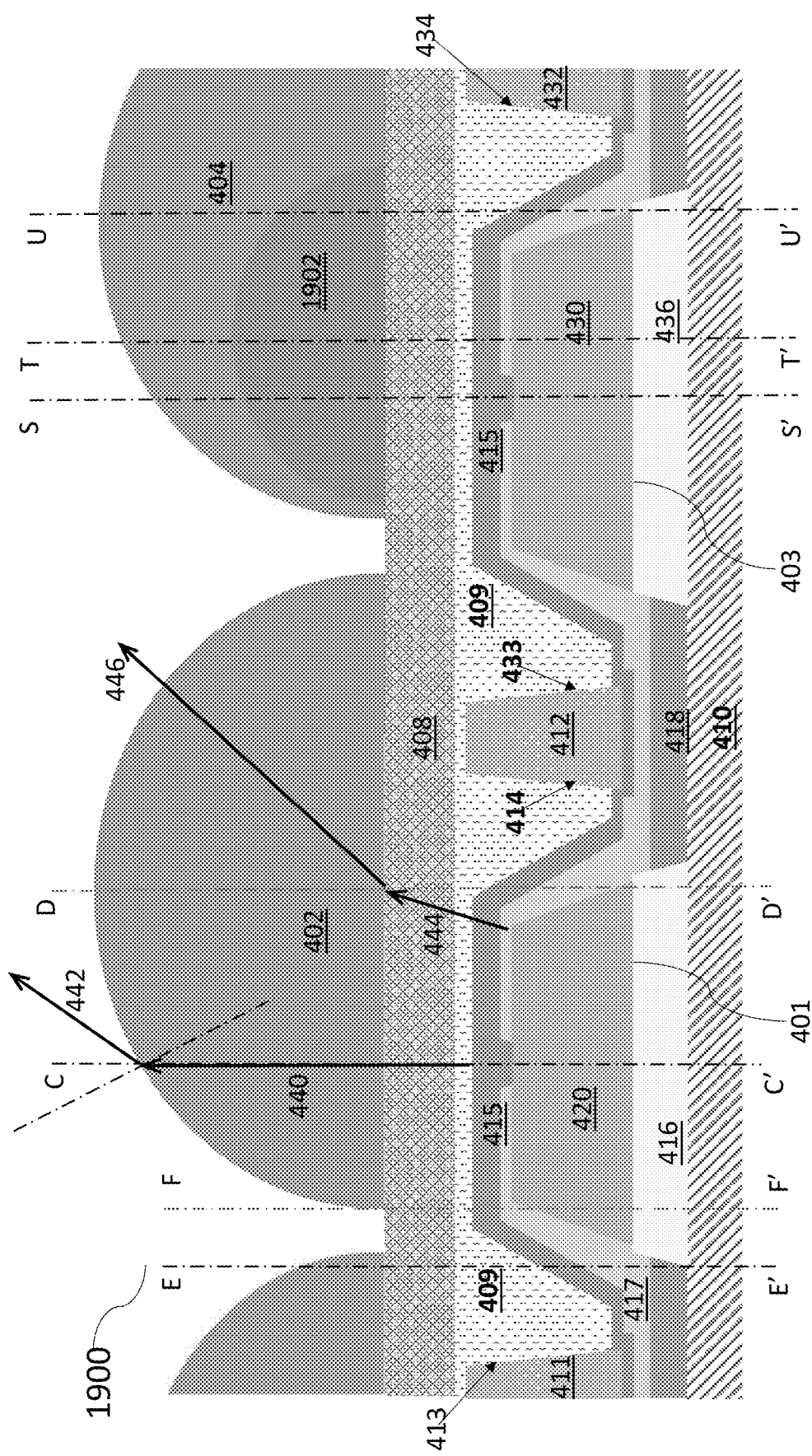
FIG. 19 illustrates a cross-sectional view of an exemplary light emitting structure having at least two micro-lens and light emitting mesa pairs, and at least one of the pairs has a small micro-lens within a big micro-lens, wherein the lateral dimension of the small micro-lens is smaller than that of the big micro-lens, according to some embodiments.

FIG. 19 illustrates a cross-sectional view of an exemplary light emitting structure 1900 having at least two micro-lens and light emitting mesa pairs, and at least one of the pairs has a small micro-lens within a big micro-lens, wherein the lateral dimension of the small micro-lens is smaller than that of the big micro-lens, according to some embodiments. The big micro-lens and light emitting mesa pair (including related reflective cups, and optional spacers) array structure, dimension, shape, fabrication, and material, is the same or similar to the light emitting structure described in any one of FIGS. 1-7, especially in FIG. 4. The material, shape, and fabrication of the small micro-lens is similar to the big micro-lens as described above in FIGS. 1-7. The light emitting structure 1900 includes a first pair of big micro-lens 402 and light emitting mesa 401. The light emitting structure 1900 includes a second pair of big micro-lens 404 and light emitting mesa 403, and a small micro-lens 1902 within the big micro-lens 404.

Similar as shown above in any one of FIGS. 8, 10, 12, and 13, within the same micro-lens group and light emitting mesa pair, the light emitting structure 1900 includes a small micro-lens, such as 1902, and a big micro-lens, such as 404. The small micro-lens, such as 1902 is formed on the light emitting mesa, such as 403, and within the big micro-lens, such as 404. The big micro-lens, such as 404, is formed on the light emitting mesa, such as 403, and covers the small micro-lens, such as 1902. The diameter of the big micro-lens, such as 404, is larger than the diameter of the small micro-lens, such as 1902, so as to improve the light extraction efficiency.

Within the same micro-lens group and light emitting mesa pair of the light emitting structure 1900, the relative positions and offset distances between the central axis S-S' of the light emitting mesa 403, the central axis T-T' of the small micro-lens 1902, and the central axis U-U' of the big micro-lens 404 is the same or similar as described in above in any one of FIGS. 8, 10, 12, and 13.

In some embodiments, in FIG. 19, the offset distance between the central axis D-D' of the micro-lens 402 and the central axis C-C' of the corresponding light emitting mesa 401 is less than the offset distance between the central axis U-U' of the big micro-lens 404 and the central axis S-S' of the corresponding light emitting mesa 403.

Figure 20:
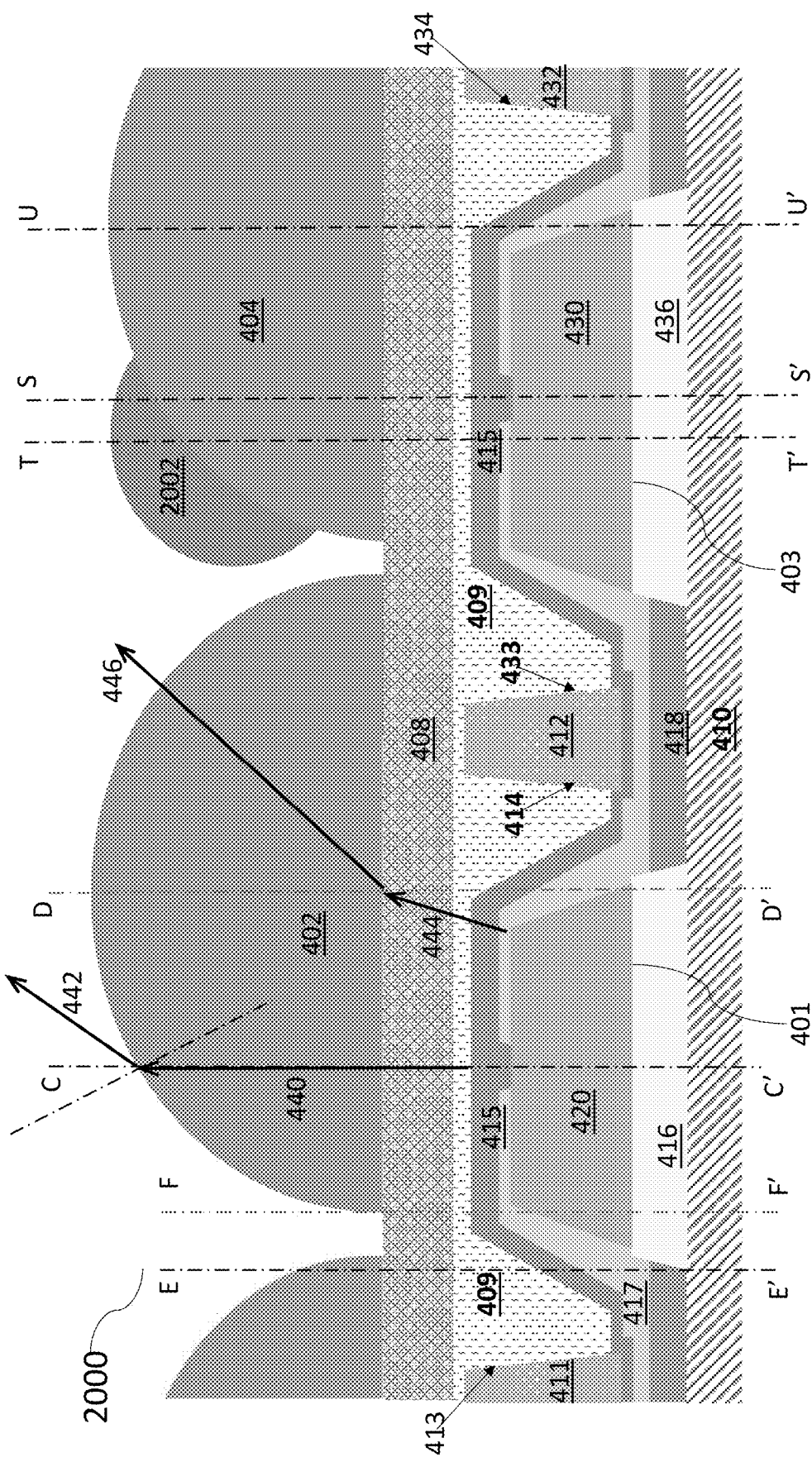
FIG. 20 illustrates a cross-sectional view of an exemplary light emitting structure having at least two micro-lens and light emitting mesa pairs, and at least one of the pairs has a small micro-lens above a big micro-lens (or the small micro-lens located farther on the light emitting path of the light emitting structure relative to the big micro-lens), wherein the lateral dimension of the small micro-lens is smaller than that of the big micro-lens, according to some embodiments.

FIG. 20 illustrates a cross-sectional view of an exemplary light emitting structure 2000 having at least two micro-lens and light emitting mesa pairs, and at least one of the pairs has a small micro-lens above a big micro-lens (or the small micro-lens located farther on the light emitting path of the light emitting structure relative to the big micro-lens), wherein the lateral dimension of the small micro-lens is smaller than that of the big micro-lens, according to some embodiments. The big micro-lens and light emitting mesa pair (including related reflective cups, and optional spacers) array structure, dimension, shape, fabrication, and material, is the same or similar to the light emitting structure described in any one of FIGS. 1-7, especially in FIG. 4. The material, shape, and fabrication of the small micro-lens is similar to the big micro-lens as described above in FIGS. 1-7. The light emitting structure 1900 includes a first pair of big micro-lens 402 and light emitting mesa 401. The light emitting structure 1900 includes a second pair of big micro-lens 404 and light emitting mesa 403, and a small micro-lens 1902 above the big micro-lens 404.

Similar as shown above in FIGS. 15-18, within the same micro-lens group and light emitting mesa pair, the light emitting structure 2000 includes a small micro-lens, such as 2002, and a big micro-lens, such as 404. The big micro-lens, such as 404, is formed on the light emitting mesa, such as 403. The small micro-lens, such as 2002, is formed above the big micro-lens, such as 404, and covers a portion of the surface of the big micro-lens but does not cover the whole surface of the big micro-lens. The diameter of the big micro-lens, such as 404, is larger than the diameter of the small micro-lens, such as 2002, so as to improve the light extraction efficiency. In some embodiments as shown in FIG. 20, the small micro-lens, such as 2002 is formed directly on the big micro-lens, such as 404, in a way that the top surface of the big micro-lens is intact (with its original shape, such as a hemisphere) and the bottom surface of the small micro-lens conforms to the shape of the surface of the big micro-lens. In some embodiments, the overall shape of the small micro-lens is a hemisphere with the bottom surface confirms to the shape of a portion of the top surface of the big micro-lens.

Within the same micro-lens group and light emitting mesa pair of the light emitting structure 2000, the relative positions and offset distances between the central axis S-S' of the light emitting mesa 403, the central axis T-T' of the small micro-lens 2002, and the central axis U-U' of the big micro-lens 404 is the same or similar as described in above in any one of FIGS. 15-18.

In some embodiments, in FIG. 20, the offset distance between the central axis D-D' of the micro-lens 402 and the central axis C-C' of the corresponding light emitting mesa 401 is larger than the offset distance between the central axis T-T' of the small micro-lens 2002 and the central axis S-S' of the corresponding light emitting mesa 403.

In some embodiments, in any one of the FIGS. 19-20, the material of the small micro-lens, 1902 or 2002, is the same as that of the big micro-lens 404 within the same micro-lens group and light emitting mesa pair. In some embodiments, the material of the big micro-lens 402 is the same as that of the small micro-lens, 1902 or 2002, in another micro-lens group and light emitting mesa pair.

Figure 21:
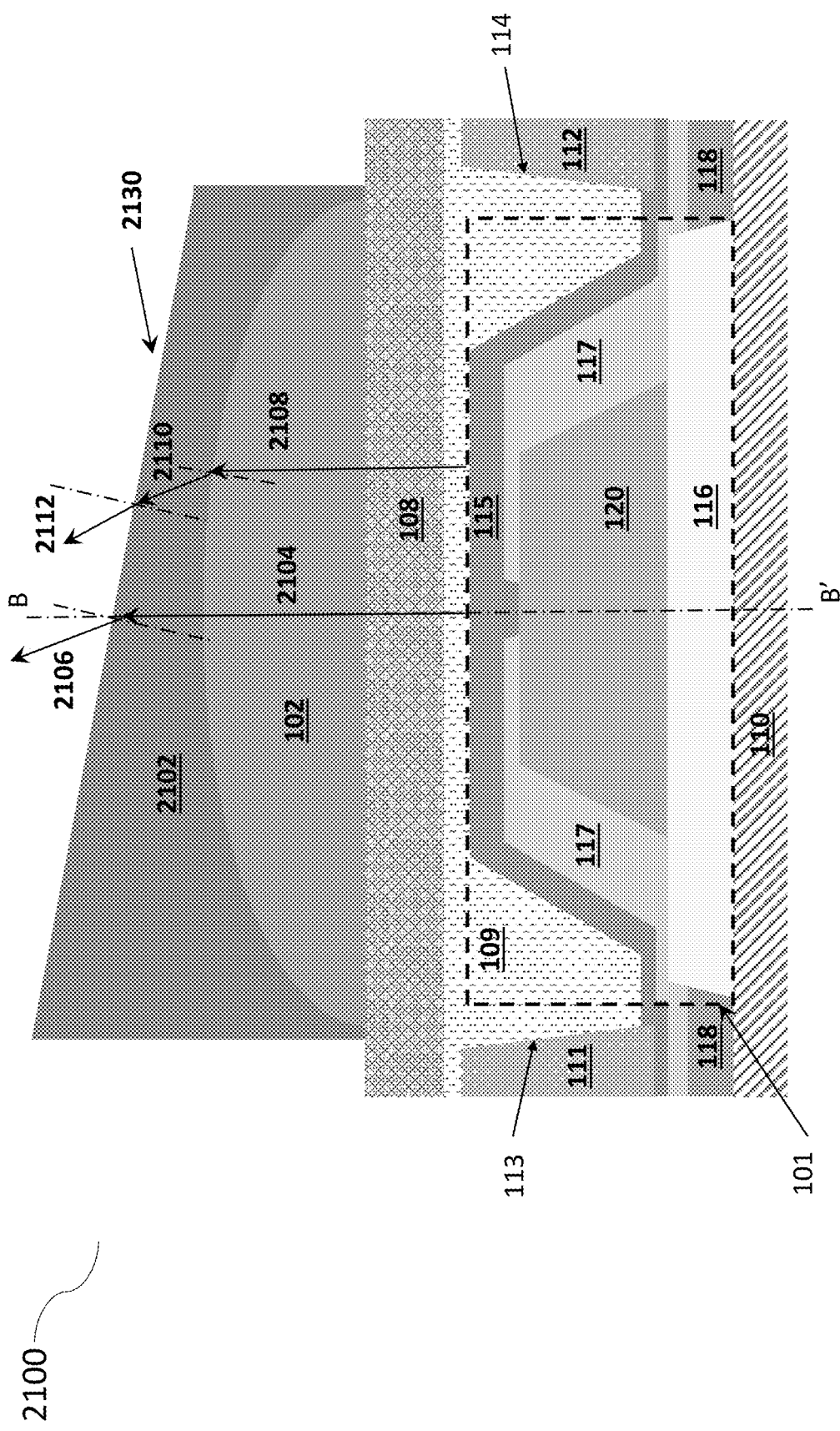
FIG. 21 illustrates a cross-sectional view of an exemplary light emitting structure having at least one micro-lens group and light emitting mesa pair, according to some embodiments.

FIG. 21 illustrates a cross-sectional view of an exemplary light emitting structure 2100 having at least one micro-lens group and light emitting mesa pair, according to some embodiments. The micro-lens 102 and light emitting mesa 101 pair array (including related reflective cups, and optional spacers) structure, dimension, shape, fabrication, and material, is the same or similar to the light emitting structure described in any one of FIGS. 1-7, especially in FIG. 1A. In FIG. 21, a micro-lens 2102 is formed above the micro-lens 102. In some embodiments, the micro-lens 2102 covers and contacts the top surface of the micro-lens 102. The material, and fabrication of the micro-lens 2102 is similar to the micro-lens 102 as described above in FIGS. 1-7. In some embodiments, the central axis of the micro-lens 102 and the central axis of the micro-lens 2102 are coaxially aligned or the same. In some embodiments as described above, the central axis of the micro-lens 102 is not coaxially aligned with or the same as the central axis B-B' of the light emitting mesa 101. In a preferred embodiment, the central axis of the micro-lens 102 is coaxially aligned with or the same as the central axis B-B' of the light emitting mesa 101. In some embodiments, the horizontal dimension of the micro-lens 2102 is the same or larger than the horizontal dimension of the micro-lens 102.

In some embodiments, the material of the micro-lens 2102 is different from the material of the micro-lens 102. In some embodiments, the refractive index of the micro-lens 102 is higher than that of the micro-lens 2102, improving the light extraction efficiency. The light ray direction from the light emitting mesa 101 is changed via the micro-lens 102 and the micro-lens 2102. For example, the light ray 2104 emitting from the central axis of the light emitting mesa 101 travels through the micro-lens 102 and the micro-lens 2102, and is redirected as 2106 out of the micro-lens 2102. The light ray 2108 emitting from the light emitting mesa 101 travels through the micro-lens 102, is redirected as 2110 when it travels through the micro-lens 2102, and is redirected as 2112 out of the micro-lens 2102.

In FIG. 21, in some embodiments, the bottom of the micro-lens 2102 conforms to the top curved surface of the micro-lens 102. In some embodiments, the micro-lens 102 has a shape of a hemisphere. In some embodiments, the micro-lens 2102 has a cylindrical structure with a polygon shaped cross-section when the carve-out of the micro-lens 102 is not considered. When seen from a cross-sectional view without consideration of the carve-out of the micro-lens 102, the polygon structure may be a plane figure that is described by a finite number of straight line segments connected to form a closed polygonal chain. For instance, the plain figure may be a monogon, digon, triangle, quadrilateral, pentagon, hexagon, heptagon, octagon, decagon, hendecagon, dodecagon, tridecagon, tetradecagon, pentadecagon, hexadecagon, heptadecagon, octadecagon, enneadecagon, icosagon, icositetragon, triacontagon, tetracontagon, pentacontagon, hexacontagon, heptacontagon, octacontagon, enneacontagon, hectogon or other regular or irregular shapes.

As shown in FIG. 21, in some embodiments, the polygon shape cross-section is a trapezoid shape having an inclined top surface 2130 without consideration of the carve-out of the micro-lens 102. In some embodiments, the inclined top surface 2130 has an angle relative to an axis perpendicular to the surface of the substrate 110 in the range of 10-80 degrees. In some embodiments, the inclined top surface 2130 has an angle relative to an axis perpendicular to the surface of the substrate 110 in the range of 30-60 degrees. In some embodiments, the inclined top surface may be curved, wavy or the combination thereof.

The addition of the micro-lens 2102 above the micro-lens 102 can further direct and adjust the light from the light emitting mesa to a certain angle. For example, in FIG. 21, the light rays from the micro-lens 102 are more focused in certain directions around the light emitting mesa after exiting. Therefore, even when the central axis of the light emitting mesa 101 and the central axis of the micro-lens 102 are the same, the light out from the micro-lens 102 can still be redirected toward a certain angle when it travels through and out of the micro-lens 2102. Furthermore, the light exiting angle and intensity can be further adjusted when the off-sets of the central axes of the micro-lens 102 and the micro-lens 2102 relative to the central axis of the light emitting mesa 101 are respectively changed. For example, the central axis of the micro-lens 2102 does not need to be the same as the central axis of the micro-lens 102 or the central axis of the light emitting mesa 101 and the offsets can be varied within the same display.

Figure 22:
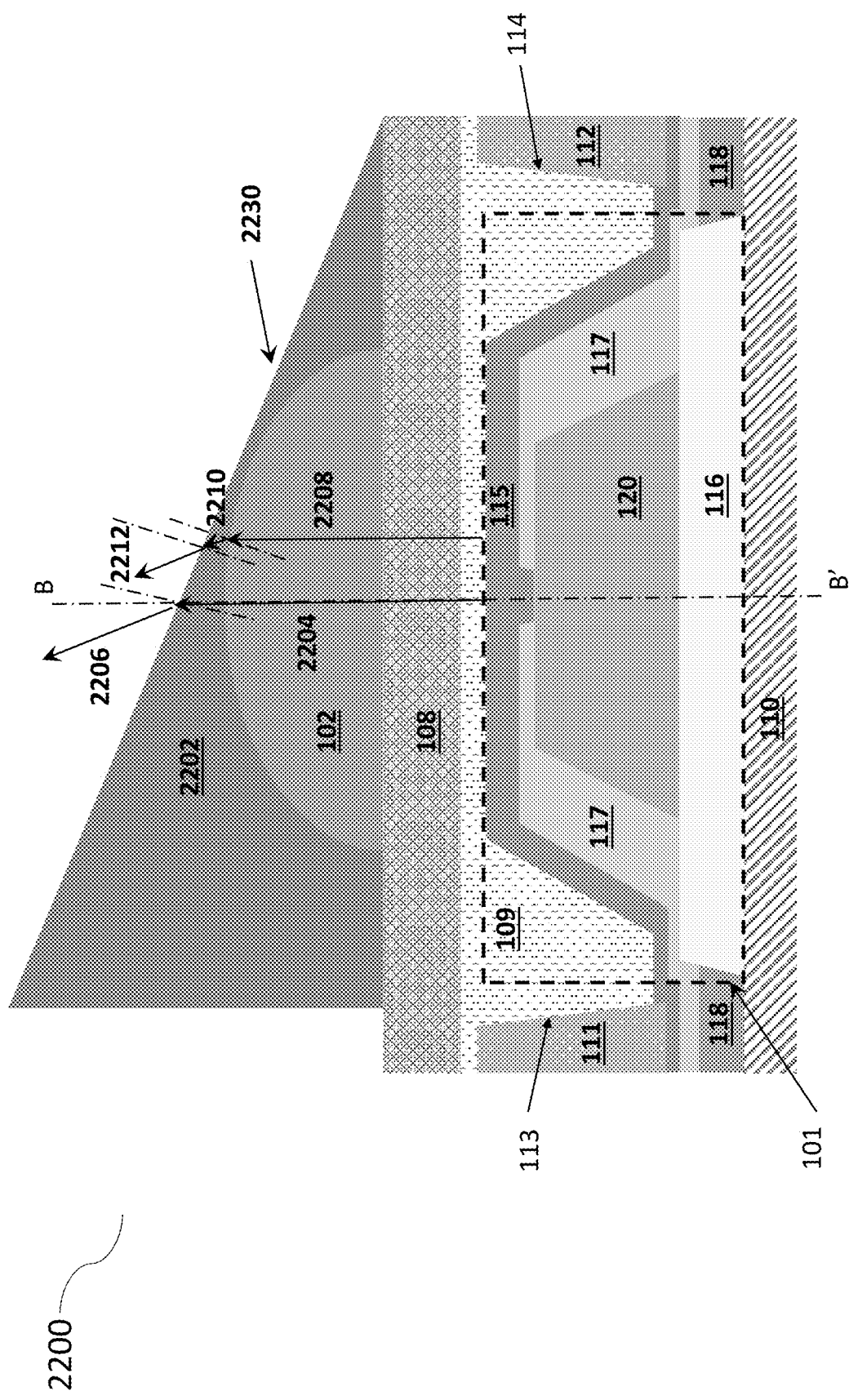
FIG. 22 illustrates a cross-sectional view of an exemplary light emitting structure having at least one micro-lens group and light emitting mesa pair, according to some embodiments.

FIG. 22 illustrates a cross-sectional view of an exemplary light emitting structure 2200 having at least one micro-lens group and light emitting mesa pair, according to some embodiments. The micro-lens 102 and light emitting mesa 101 pair array (including related reflective cups, and optional spacers) structure, dimension, shape, fabrication, and material, is the same or similar to the light emitting structure described in any one of FIGS. 1-7, especially in FIG. 1A. In FIG. 22, a micro-lens 2202 is formed above the micro-lens 102. In some embodiments, the micro-lens 2202 covers and contacts the top surface of the micro-lens 102. The material, and fabrication of the micro-lens 2202 is similar to the micro-lens 102 as described above in FIGS. 1-7. In some embodiments, the central axis of the micro-lens 102 and the central axis of the micro-lens 2202 are coaxially aligned or the same. In some embodiments as described above, the central axis of the micro-lens 102 is not coaxially aligned with or the same as the central axis B-B' of the light emitting mesa 101. In a preferred embodiment, the central axis of the micro-lens 102 is coaxially aligned with or the same as the central axis B-B' of the light emitting mesa 101. In some embodiments, the horizontal dimension of the micro-lens 2202 is the same or larger than the horizontal dimension of the micro-lens 102.

In some embodiments, the material of the micro-lens 2202 is different from the material of the micro-lens 102. In some embodiments, the refractive index of the micro-lens 102 is higher than that of the micro-lens 2202, improving the light extraction efficiency. The light ray direction from the light emitting mesa 101 is changed via the micro-lens 102 and the micro-lens 2202. For example, the light ray 2204 emitting from the central axis of the light emitting mesa 101 travels through the micro-lens 102 and the micro-lens 2202, and is redirected as 2206 out of the micro-lens 2202. The light ray 2208 emitting from the light emitting mesa 101 travels through the micro-lens 102, is redirected as 2210 when it travels through the micro-lens 2202, and is redirected as 2212 out of the micro-lens 2202.

In FIG. 22, in some embodiments, the bottom of the micro-lens 2202 conforms to the top curved surface of the micro-lens 102. In some embodiments, the micro-lens 102 has a shape of a hemisphere. In some embodiments, the micro-lens 2202 has a cylindrical structure with a triangular shaped cross-section when the carve-out of the micro-lens 102 is not considered. As shown in FIG. 22, in some embodiments, the micro-lens 2202 has an inclined top surface 2230. In some embodiments, the inclined top surface 2230 has an angle relative to an axis perpendicular to the surface of the substrate 110 in the range of 10-80 degrees. In some embodiments, the inclined top surface 2230 has an angle relative to an axis perpendicular to the surface of the substrate 110 in the range of 30-60 degrees.

The addition of the micro-lens 2202 above the micro-lens 102 can further direct and adjust the light from the light emitting mesa to a certain angle. For example, in FIG. 22, the light rays from the micro-lens 102 are more focused in certain directions around the light emitting mesa after exiting. Therefore, even when the central axis of the light emitting mesa 101 and the central axis of the micro-lens 102 are the same, the light out from the micro-lens 102 can still be redirected toward a certain angle when it travels through and out of the micro-lens 2202. Furthermore, the light exiting angle and intensity can be further adjusted when the off-sets of the central axes of the micro-lens 102 and the micro-lens 2202 relative to the central axis of the light emitting mesa 101 are respectively changed. For example, the central axis of the micro-lens 2202 does not need to be the same as the central axis of the micro-lens 102 or the central axis of the light emitting mesa 101 and the offsets can be varied within the same display.

Figure 23:
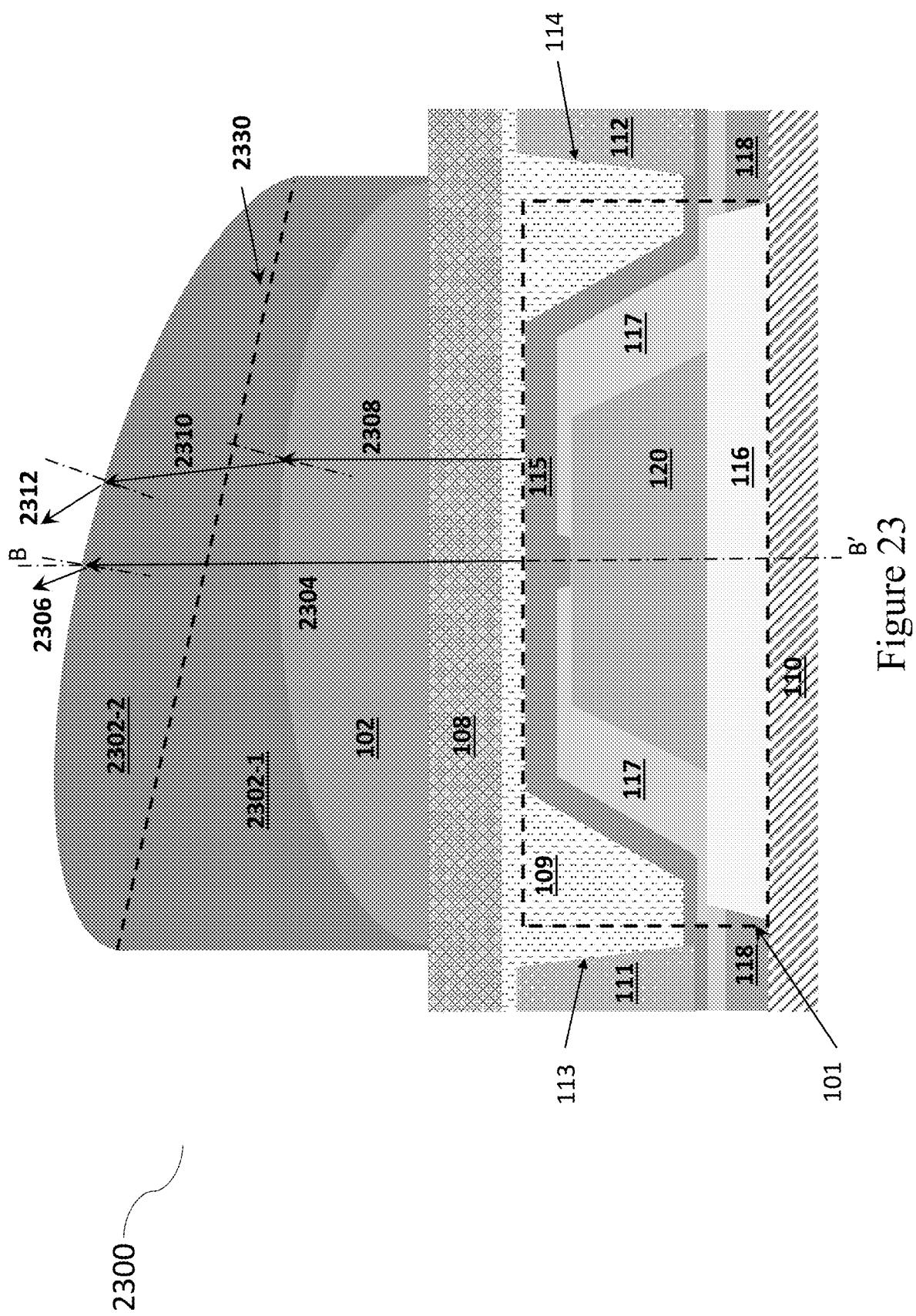
FIG. 23 illustrates a cross-sectional view of an exemplary light emitting structure having at least one micro-lens group and light emitting mesa pair, according to some embodiments.

FIG. 23 illustrates a cross-sectional view of an exemplary light emitting structure 2300 having at least one micro-lens group and light emitting mesa pair, according to some embodiments. The micro-lens 102 and light emitting mesa 101 pair array (including related reflective cups, and optional spacers) structure, dimension, shape, fabrication, and material, is the same or similar to the light emitting structure described in any one of FIGS. 1-7, especially in FIG. 1A. In FIG. 23, a micro-lens 2302 is formed above the micro-lens 102. In some embodiments, the micro-lens 2302 covers and contacts the top surface of the micro-lens 102. The material, and fabrication of the micro-lens 2302 is similar to the micro-lens 102 as described above in FIGS. 1-7. In some embodiments, the central axis of the micro-lens 102 and the central axis of the micro-lens 2302 are coaxially aligned or the same. In some embodiments as described above, the central axis of the micro-lens 102 is not coaxially aligned with or the same as the central axis B-B' of the light emitting mesa 101. In a preferred embodiment, the central axis of the micro-lens 102 is coaxially aligned with or the same as the central axis B-B' of the light emitting mesa 101. In some embodiments, the horizontal dimension of the micro-lens 2302 is the same or larger than the horizontal dimension of the micro-lens 102.

In some embodiments, the material of the micro-lens 2302 is different from the material of the micro-lens 102. In some embodiments, the refractive index of the micro-lens 102 is higher than that of the micro-lens 2302, improving the light extraction efficiency. The light ray direction from the light emitting mesa 101 is changed via the micro-lens 102 and the micro-lens 2302. For example, the light ray 2304 emitting from the central axis of the light emitting mesa 101 travels through the micro-lens 102 and the micro-lens 2302, and is redirected as 2306 out of the micro-lens 2302. The light ray 2308 emitting from the light emitting mesa 101 travels through the micro-lens 102, is redirected as 2310 when it travels through the micro-lens 2302, and is redirected as 2312 out of the micro-lens 2302.

In FIG. 23, in some embodiments, the bottom of the micro-lens 2302 conforms to the top curved surface of the micro-lens 102. In some embodiments, the micro-lens 102 has a shape of a hemisphere. In some exemplary embodiments, a composite structure may be a combination of two or more structures. In some embodiments, the micro-lens 2302 is a composite structure with two shape components 2302-1 and 2302-2. The micro-lens component 2302-1 is formed at the bottom of the micro-lens component 2302-2. In some embodiments, the micro-lens component 2302-1 has a cylindrical structure with a polygon shaped cross-section when the carve-out of the micro-lens 102 is not considered. As shown in FIG. 23, in some embodiments, the polygon shape cross-section is a trapezoid shape having an inclined top surface 2330 without consideration of the carve-out of the micro-lens 102. As shown in FIG. 23, in some embodiments, the micro-lens component 2302-1 has an inclined top surface 2330. In some embodiments, the inclined top surface 2330 has an angle relative to an axis perpendicular to the surface of the substrate 110 in the range of 10-80 degrees. In some embodiments, the inclined top surface 2330 has an angle relative to an axis perpendicular to the surface of the substrate 110 in the range of 30-60 degrees. As shown in FIG. 23, in some embodiments, the micro-lens component 2302-2 has a shape of a hemisphere with a flat bottom side surface and a convex top side surface. The flat bottom side surface of the micro-lens component 2302-2 touches and covers seamlessly with the inclined top surface 2330 of the micro-lens component 2302-1. The flat bottom side surface of the micro-lens component 2302-2 and the inclined top surface 2330 of the micro-lens component 2302-1 have the same shape and dimension, and they both incline at the same angle relative to the axis perpendicular to the surface of the substrate 110. The two micro-lens components 2302-1 and 2302-2 are integral portions of the micro-lens 2302 and form a composite shape of the micro-lens 2302.

The addition of the micro-lens 2302 above the micro-lens 102 can further direct and adjust the light from the light emitting mesa to a certain angle. For example, in FIG. 23, the light rays from the micro-lens 102 are more focused in certain directions around the light emitting mesa after exiting. Therefore, even when the central axis of the light emitting mesa 101 and the central axis of the micro-lens 102 are the same, the light out from the micro-lens 102 can still be redirected toward a certain angle when it travels through and out of the micro-lens 2302. Furthermore, the light exiting angle and intensity can be further adjusted when the off-sets of the central axes of the micro-lens 102 and the micro-lens 2302 relative to the central axis of the light emitting mesa 101 are respectively changed. For example, the central axis of the micro-lens 2302 does not need to be the same as the central axis of the micro-lens 102 or the central axis of the light emitting mesa 101 and the offsets can be varied within the same display.

Figure 24:
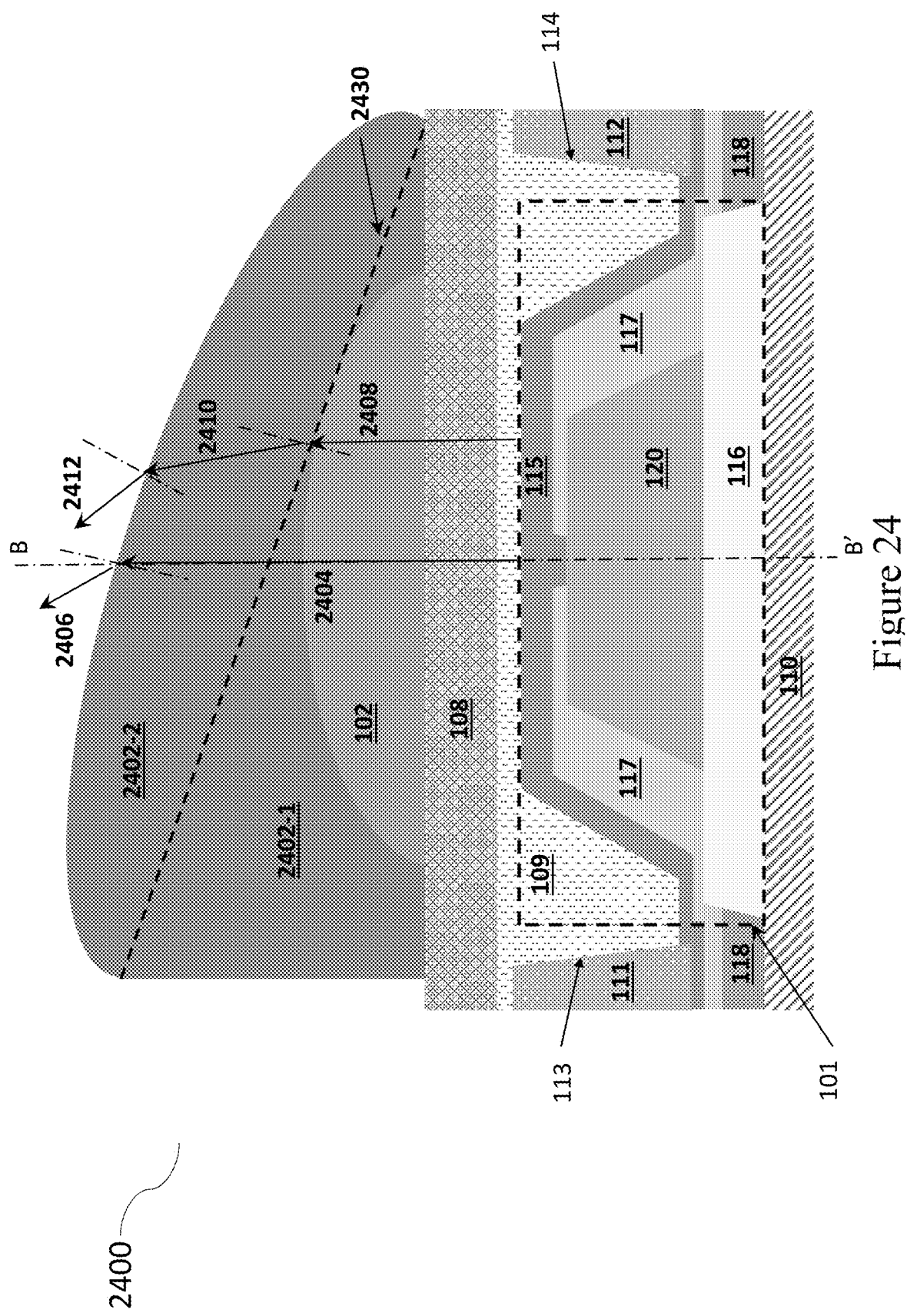
FIG. 24 illustrates a cross-sectional view of an exemplary light emitting structure having at least one micro-lens group and light emitting mesa pair, according to some embodiments.

FIG. 24 illustrates a cross-sectional view of an exemplary light emitting structure 2400 having at least one micro-lens group and light emitting mesa pair, according to some embodiments. The micro-lens 102 and light emitting mesa 101 pair array (including related reflective cups, and optional spacers) structure, dimension, shape, fabrication, and material, is the same or similar to the light emitting structure described in any one of FIGS. 1-7, especially in FIG. 1A. In FIG. 24, a micro-lens 2402 is formed above the micro-lens 102. In some embodiments, the micro-lens 2402 covers and contacts the top surface of the micro-lens 102. The material, and fabrication of the micro-lens 2402 is similar to the micro-lens 102 as described above in FIGS. 1-7. In some embodiments, the central axis of the micro-lens 102 and the central axis of the micro-lens 2402 are coaxially aligned or the same. In some embodiments as described above, the central axis of the micro-lens 102 is not coaxially aligned with or the same as the central axis B-B' of the light emitting mesa 101. In a preferred embodiment, the central axis of the micro-lens 102 is coaxially aligned with or the same as the central axis B-B' of the light emitting mesa 101. In some embodiments, the horizontal dimension of the micro-lens 2402 is the same or larger than the horizontal dimension of the micro-lens 102.

In some embodiments, the material of the micro-lens 2402 is different from the material of the micro-lens 102. In some embodiments, the refractive index of the micro-lens 102 is higher than that of the micro-lens 2402, improving the light extraction efficiency. The light ray direction from the light emitting mesa 101 is changed via the micro-lens 102 and the micro-lens 2402. For example, the light ray 2404 emitting from the central axis of the light emitting mesa 101 travels through the micro-lens 102 and the micro-lens 2402, and is redirected as 2406 out of the micro-lens 2402. The light ray 2408 emitting from the light emitting mesa 101 travels through the micro-lens 102, is redirected as 2410 when it travels through the micro-lens 2402, and is redirected as 2412 out of the micro-lens 2402.

In FIG. 24, in some embodiments, the bottom of the micro-lens 2402 conforms to the top curved surface of the micro-lens 102. In some embodiments, the micro-lens 102 has a shape of a hemisphere. In some embodiments, the micro-lens 2402 is a composite structure with two shape components 2402-1 and 2402-2. The micro-lens component 2402-1 is formed at the bottom of the micro-lens component 2402-2. The micro-lens component 2402-1 has a cylindrical structure with a triangular shaped cross-section when the carve-out of the micro-lens 102 is not considered. As shown in FIG. 24, in some embodiments, the micro-lens component 2402-1 has an inclined top surface 2430. In some embodiments, the inclined top surface 2430 has an angle relative to an axis perpendicular to the surface of the substrate 110 in the range of 10-80 degrees. In some embodiments, the inclined top surface 2430 has an angle relative to an axis perpendicular to the surface of the substrate 110 in the range of 30-60 degrees. As shown in FIG. 24, in some embodiments, the micro-lens component 2402-2 has a shape of a hemisphere with a flat bottom side surface and a convex top side surface. The flat bottom side surface of the micro-lens component 2402-2 touches and covers seamlessly with the inclined top surface 2430 of the micro-lens component 2402-1. The flat bottom side surface of the micro-lens component 2402-2 and the inclined top surface 2430 of the micro-lens component 2402-1 have the same shape and dimension, and they both incline at the same angle relative to the axis perpendicular to the surface of the substrate 110. The two micro-lens components 2402-1 and 2402-2 are integral portions of the micro-lens 2402 and form a composite shape of the micro-lens 2402.

The addition of the micro-lens 2402 above the micro-lens 102 can further direct and adjust the light from the light emitting mesa to a certain angle. For example, in FIG. 24, the light rays from the micro-lens 102 are more focused in certain directions around the light emitting mesa after exiting. Therefore, even when the central axis of the light emitting mesa 101 and the central axis of the micro-lens 102 are the same, the light out from the micro-lens 102 can still be redirected toward a certain angle when it travels through and out of the micro-lens 2402. Furthermore, the light exiting angle and intensity can be further adjusted when the off-sets of the central axes of the micro-lens 102 and the micro-lens 2402 relative to the central axis of the light emitting mesa 101 are respectively changed. For example, the central axis of the micro-lens 2402 does not need to be the same as the central axis of the micro-lens 102 or the central axis of the light emitting mesa 101 and the offsets can be varied within the same display.

Figure 25:
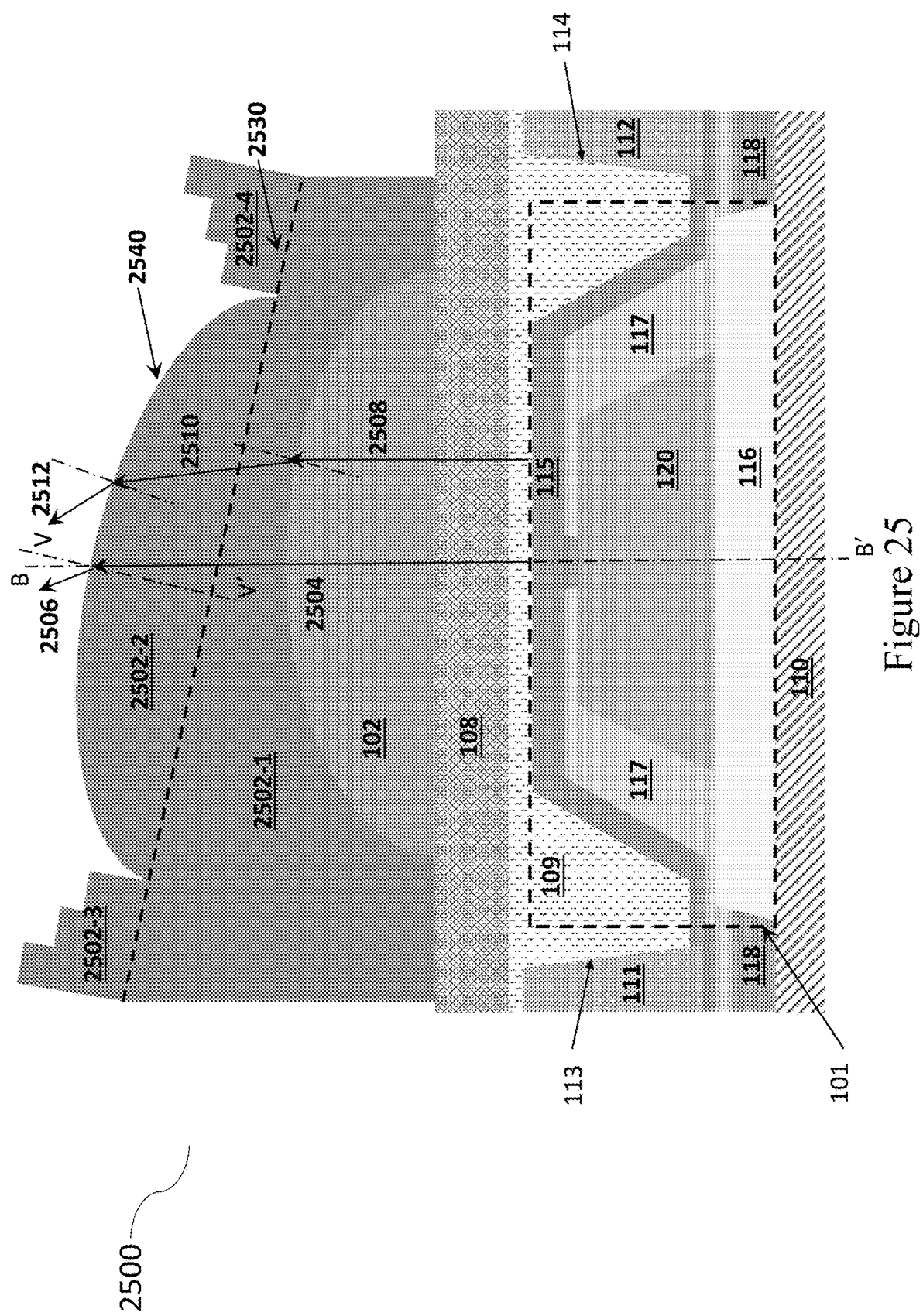
FIG. 25 illustrates a cross-sectional view of an exemplary light emitting structure having at least one micro-lens group and light emitting mesa pair, according to some embodiments.

FIG. 25 illustrates a cross-sectional view of an exemplary light emitting structure 2500 having at least one micro-lens group and light emitting mesa pair, according to some embodiments. The micro-lens 102 and light emitting mesa 101 pair array (including related reflective cups, and optional spacers) structure, dimension, shape, fabrication, and material, is the same or similar to the light emitting structure described in any one of FIGS. 1-7, especially in FIG. 1A. In FIG. 25, a micro-lens 2502 is formed above the micro-lens 102. In some embodiments, the micro-lens 2502 covers and contacts the top surface of the micro-lens 102. In some embodiments, the material, and fabrication of the micro-lens 2502 is similar to the micro-lens 102 as described above in FIGS. 1-7. In some embodiments, the micro-lens 2502 is a diffraction micro-lens. In some embodiments, the central axis of the micro-lens 102 and the center point of the top surface 2540 of the diffraction micro-lens 2502 intersects. In a preferred embodiment, the central axis of the micro-lens 102 is coaxially aligned with or the same as the central axis B-B' of the light emitting mesa 101. In some embodiments, the horizontal dimension of the micro-lens 2502 is the same or larger than the horizontal dimension of the micro-lens 102.

In some embodiments, the material of the micro-lens 2502 is different from the material of the micro-lens 102. In some embodiments, the refractive index of the micro-lens 102 is higher than that of the micro-lens 2502, improving the light extraction efficiency. In some embodiments, the refractive index of the micro-lens 102 is smaller than that of the micro-lens 2502. The light ray direction from the light emitting mesa 101 is changed via the micro-lens 102 and the micro-lens 2502. For example, the light ray 2504 emitting from the central axis of the light emitting mesa 101 travels through the micro-lens 102 and the micro-lens 2502, and is redirected as 2506 out of the micro-lens 2502. The light ray 2508 emitting from the light emitting mesa 101 travels through the micro-lens 102, is redirected as 2510 when it travels through the micro-lens 2502, and is redirected as 2512 out of the micro-lens 2502.

In FIG. 25, in some embodiments, the bottom of the micro-lens 2502 conforms to the top curved surface of the micro-lens 102. In some embodiments, the micro-lens 102 has a shape of a hemisphere. In some embodiments, the micro-lens 2502 is a composite structure with four shape components 2502-1, 2502-2, 2502-3, and 2502-4. In some embodiments, the micro-lens component 2502-1 has a cylindrical structure with a polygon shaped cross-section when the carve-out of the micro-lens 102 is not considered. As shown in FIG. 25, in some embodiments, the polygon shape cross-section is a trapezoid shape having an inclined top surface 2530 without consideration of the carve-out of the micro-lens 102. In some other embodiments, not as shown in FIG. 25, the micro-lens component 2502-1 has a cylindrical structure with a triangular shaped cross-section when the carve-out of the micro-lens 102 is not considered, similar as the micro-lens component as described above in FIGS. 22 and 24. The micro-lens component 2502-1 is formed at the bottom of the micro-lens components 2502-2, 2502-3, and 2502-4.

As shown in FIG. 25, in some embodiments, the micro-lens component 2502-1 has an inclined top surface 2530. In some embodiments, the inclined top surface 2530 has an angle relative to an axis perpendicular to the surface of the substrate 110 in the range of 10-80 degrees. In some embodiments, the inclined top surface 2530 has an angle relative to an axis perpendicular to the surface of the substrate 110 in the range of 30-60 degrees. As shown in FIG. 25, in some embodiments, the micro-lens component 2502-2 has a shape of a hemisphere with a flat bottom side surface and a convex top side surface. In some embodiments, the micro-lens component 2502-2 has a central axis V-V' that passes through the center point of the top surface and the center point of the bottom surface of the hemisphere shape micro-lens component 2502-2. In some embodiments, the center point may refer to a point that is related to a geometrical figure in such a way that for any point on the figure there is another point on the figure such that a straight line joining the two points is bisected by the original point. For example, the diffraction micro-lens 2502 may be a hemisphere structure, and therefore the center point of the top surface of the diffraction micro-lens 2502 may refer to the peak point of the top surface of the hemisphere structure.

The central axis V-V' is inclined while the central axis of the micro-lens 102 is vertical. In some embodiments, the central axis V-V' of the micro-lens component 2502-2 is perpendicular to the inclined top surface 2530 of the micro-lens component 2502-1. The flat bottom side surface of the micro-lens component 2502-2 touches and covers seamlessly with a central portion of the inclined top surface 2530 of the micro-lens component 2502-1. The flat bottom side surface of the micro-lens component 2502-2 and the inclined top surface 2530 of the micro-lens component 2502-1 contacts each other, and they both incline at the same angle relative to the axis perpendicular to the surface of the substrate 110. In some embodiments, around the micro-lens component 2502-2, some polygon structure is formed such as, micro-lens components 2502-3 and 2502-4 from the cross section in FIG. 25 to increase diffraction. In some embodiments, the polygon structure is similar to the stair-like structure described in FIG. 2C. In some embodiments the stair-like structure micro-lens components 2502-3 and 2502-4 has an increased step top surface toward the edge of the micro-lens 2502. In some embodiments, the micro-lens components 2502-3 and 2502-4 have multiple surfaces that are inclined at different angles to redirect light from the light emitting structure 2500 into different directions. The four micro-lens components 2502-1, 2502-2, 2502-3, and 2502-4 are integral portions of the micro-lens 2502 and form a composite shape of the micro-lens 2502. In some embodiments, the micro-lens 2502 has multiple surfaces that are inclined at different angles to redirect light from the light emitting structure 2500 into different directions.

The addition of the diffraction micro-lens 2502 above the micro-lens 102 can further direct and adjust the light from the light emitting mesa to a certain angle. For example, in FIG. 25, the light rays from the micro-lens 102 are more diffracted in certain directions around the light emitting mesa after exiting. Therefore, even when the central axis of the light emitting mesa 101 and the central axis of the micro-lens 102 are the same, the light out from the micro-lens 102 can still be redirected toward a number of angles when it travels through and out of the micro-lens 2502. Furthermore, the light exiting angle and intensity can be further adjusted when the off-sets of the central axes of the micro-lens 102 and the micro-lens 2502 relative to the central axis of the light emitting mesa 101 are respectively changed. For example, the central axis of the micro-lens 2502 does not need to be the same as the central axis of the micro-lens 102 or the central axis of the light emitting mesa 101 and the offsets can be varied within the same display.

In some embodiments, lights with certain wavelengths may be selectively passed through or reflected by the diffraction micro-lens 2502 according to the design thereof. In some embodiments, the diffraction lens may be on the micro-lens 102 and the bottom surface of the diffraction micro-lens 2502 is no larger than the bottom surface of the micro-lens 102.

In some embodiments, the diffraction micro-lens 2502 may comprise a single slit where the diffraction effect may occur. In some embodiments, the diffraction micro-lens 2502 may comprise a double slit where the diffraction effect may occur. In some embodiments, the diffraction micro-lens 2502 may comprise one or more circular apertures where the diffraction effect may occur. In some embodiments, the diffraction micro-lens 2502 may comprise one or more periodic and/or non-periodic structures where the diffraction effect may occur.

In some exemplary embodiments, the diffraction micro-lens 2502 may be a Bragg mirror. The Bragg mirror may comprise an alternating sequence of layers of two different optical materials. For example, the Bragg mirror may be a quarter-wave mirror. Each layer of the optical materials may have a different thickness corresponding to one quarter of the wavelengths for which the Bragg mirror is designed. When the Bragg mirror is designed for larger angles of incidence, accordingly thicker layers may be needed. Therefore, selected wavelengths of the light emitted from the light emitting mesa and/or the light passing through the micro-lens can be reflected by the Bragg mirror. In some embodiments, the Bragg mirror is implemented on the top surface of the micro-lens 2502. In some embodiments, the Bragg mirror is only implemented on the surface of micro-lens components 2502-3 and 2502-4.

In some embodiments, a Bragg mirror for a red light LED include multiple layers of Au or/and Indium Tin Oxide (ITO).

In one example, the Bragg mirror may comprise an alternating arrangement of TiO2 and SiO2 layers. In one example, the following Distributed Bragg reflector (DBR) structure shown in Table 1 may be used to reflect green light from a green light LED:

TABLE 1

DBR layer structure for a green light LED reflective layer.

| Layer composition | Layer thickness (in nanometer) |
|---|---|
| SiO2 | 1000 |
| TiO2 | 109.54 |
| SiO2 | 318.48 |
| TiO2 | 64.95 |
| SiO2 | 106.07 |
| TiO2 | 245.76 |
| SiO2 | 137.08 |
| TiO2 | 65.14 |
| SiO2 | 106.77 |
| TiO2 | 338.95 |
| SiO2 | 37.27 |

TABLE 1-continued

DBR layer structure for a green light LED reflective layer.

| Layer composition | Layer thickness (in nanometer) |
|---|---|
| TiO2 | 12.41 |
| SiO2 | 352.18 |
| TiO2 | 70.83 |
| SiO2 | 229.25 |
| Indium tin oxide (ITO) | 20 |

In one example, the following DBR structure shown in Table 2 may be used to reflect blue light from a blue light LED:

TABLE 2

DBR layer structure for a blue light LED reflective layer.

| Layer composition | Layer thickness (in nanometer) |
|---|---|
| SiO2 | 1000 |
| SiO2 | 183.36 |
| TiO2 | 96 |
| SiO2 | 84.65 |
| TiO2 | 51.37 |
| SiO2 | 332.37 |
| TiO2 | 79.95 |
| SiO2 | 423.13 |
| TiO2 | 52.99 |
| SiO2 | 35.87 |
| TiO2 | 235.03 |
| SiO2 | 253.67 |
| TiO2 | 64.38 |
| SiO2 | 336.08 |
| ITO | 20 |

The light emitting structure 2500 may use the Bragg mirror with different structures. In some embodiments, the Bragg mirror may be a dielectric mirror based on thin-film coating technology, fabricated, for example with electron beam evaporation or with ion beam sputtering. In these embodiments, the Bragg mirror may comprise amorphous materials. In some embodiments, the Bragg mirror may be fiber Bragg gratings, including long-period fiber gratings. In these embodiments, the fiber Bragg gratings can be fabricated by irradiating a fiber with spatially patterned ultraviolet light. In some embodiments, the Bragg mirror may be volume Bragg gratings which can be made in photosensitive bulk glass. In some embodiments, the Bragg mirror may be a semiconductor Bragg mirror which can be produced with lithographic methods. Other types of Bragg mirror may be used based on, e.g., corrugated waveguide structures which can be fabricated via lithography.

In some embodiments, the Bragg mirror may use other multilayer mirror designs which is different from the simple quarter-wave design. In these embodiments, the Bragg mirror may have a lower reflectance for the same number of layers, but can be optimized for example as dichroic mirrors or as dispersive chirped mirrors for dispersion compensation.

Figure 26:
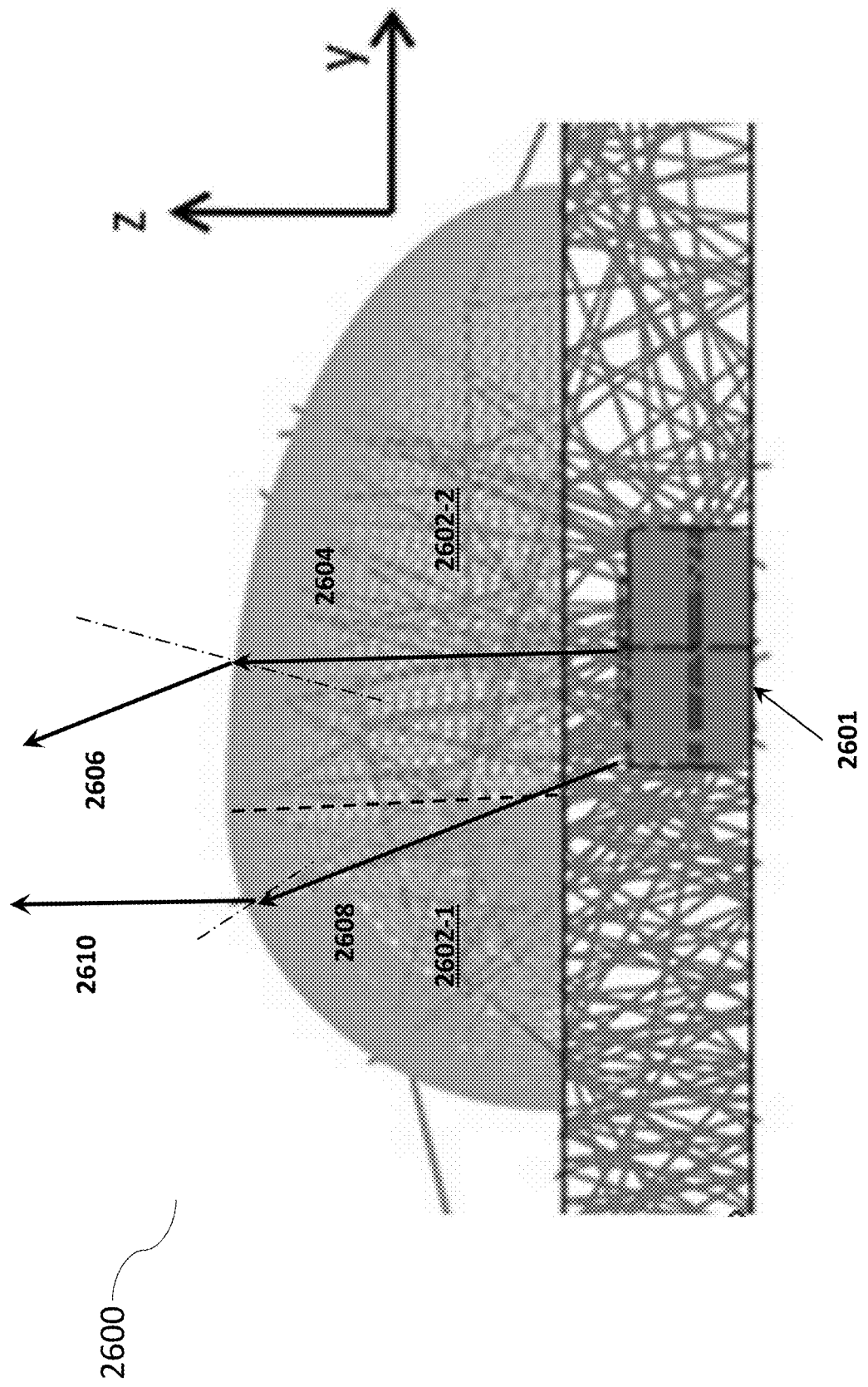
FIG. 26 illustrates a cross-sectional view of an exemplary light emitting structure having at least one micro-lens and light emitting mesa pair, according to some embodiments.

In some embodiments, as described in FIG. 1A, the micro-lens 102 can be formed in many different shapes or composite shapes. FIG. 26 illustrates a cross-sectional view of an exemplary light emitting structure 2600 having at least one micro-lens and light emitting mesa pair, according to some embodiments. The micro-lens 2602 and light emitting mesa 2601 pair array (including related reflective cups, and optional spacers) structure, dimension, shape, fabrication, and material, is the same or similar to the light emitting structure described in any one of FIGS. 1-7, especially in FIG. 1A. In some embodiments, the micro-lens 2602 is an elliptical micro-lens formed by a quarter of sphere combined with a quarter of ellipsoid. In some embodiments, not shown in FIG. 26, other micro-lenses as described in FIGS. 8-25 can be formed above or within the micro-lens 2602.

In a preferred embodiment, the central axis of the micro-lens 2602 (the axis that passes through the center point of the bottom surface of the micro-lens 2602 that is vertical to the surface of the substrate) is not coaxially aligned with or the same as the central axis of the light emitting mesa 2601.

In some embodiments, the micro-lens 2602 is a composite structure with two shape components 2602-1, and 2602-2. In some embodiments, the micro-lens component 2602-1 is a quarter of a sphere. In some embodiments, the micro-lens component 2602-2 is a quarter of an ellipsoid. The two shape components 2602-1, and 2602-2 form seamlessly and integrate with each other. For example, the diameter of the micro-lens component 2602-1 matches the diameter along the Z direction of the micro-lens component 2602-2 and the diameter along the direction that is perpendicular to the cross-section 2600. The two micro-lens components 2602-1, and 2602-2 are integral portions of the micro-lens 2602 and form a composite shape of the micro-lens 2602

The light ray direction from the light emitting mesa 2601 is changed via the micro-lens 2602 in a different angle from different surfaces of the micro-lens 2602. FIG. 26 shows a simulation of the light ray paths of many different light rays from the light emitting mesa 2601 into the micro-lens 2602 including the effect of diffraction and reflection. For example, the light ray 2604 emitting from the central axis of the light emitting mesa 2601 travels through the micro-lens 2602, and is redirected as 2606 out of the micro-lens 2602. The light ray 2608 emitting from the light emitting mesa 2601 travels through the micro-lens 2602, is redirected as 2610 out of the micro-lens 2602.

In some embodiments, the radius of the sphere is not more than 9 µm and the long radius of the ellipsoid is not more than 18 µm. In some embodiments, similar as in FIG. 1A for the micro-lens 102, in order to improve the light extraction efficiency, the offset distance of the central axis of the micro-lens 2602 from the central axis of the light emitting mesa 2601 in the horizontal level is not more than 4.5 µm. In some embodiments, similar as in FIG. 1A for the micro-lens 102, the edge of the micro-lens 2602 covers the central axis of the light emitting mesa 2601.

The composite asymmetric shape of the micro-lens 2602 can further direct and adjust the light from the light emitting mesa to a certain angle. For example, in FIG. 26, the light rays from the micro-lens 2602 are more diffracted in certain directions and more focused in other directions around the light emitting mesa after exiting. Therefore, even when the central axis of the light emitting mesa 2601 and the central axis of the micro-lens 2602 are the same, the light out from the micro-lens 2602 can still be redirected toward a number of angles when it travels through and out of the micro-lens 2602. Furthermore, the light exiting angle and intensity can be further adjusted when the off-sets of the central axes of the micro-lens 2602 and the micro-lens above the micro-lens 2602 relative to the central axis of the light emitting mesa 2601 are respectively changed. For example, the central axis of the micro-lens above the micro-lens 2602 does not need to be the same as the central axis of the micro-lens 2602 or the central axis of the light emitting mesa 2601 and the offsets can be varied within the same display.

Figure 27:
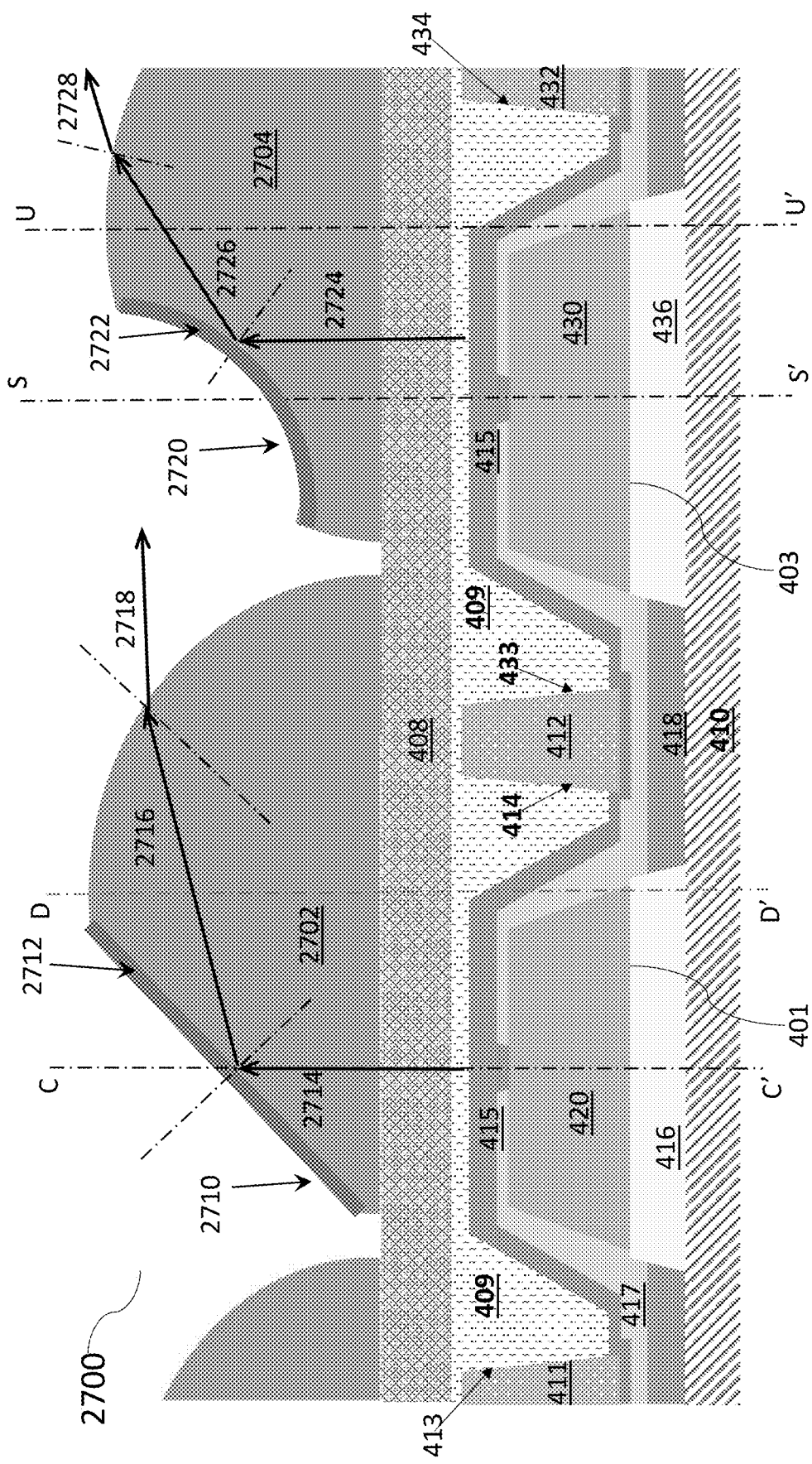
FIG. 27 illustrates a cross-sectional view of an exemplary light emitting structure having at least two micro-lens and light emitting mesa pairs, and at least one of the micro-lenses has a breach portion covered by a reflective part, according to some embodiments.

FIG. 27 illustrates a cross-sectional view of an exemplary light emitting structure 2700 having at least two micro-lens and light emitting mesa pairs, and at least one of the micro-lenses has a breach portion covered by a reflective part, according to some embodiments. The micro-lens and light emitting mesa pair (including related reflective cups, and optional spacers) array structure, dimension, shape (without consideration of the breach), fabrication, and material, is the same or similar to the light emitting structure described in any one of FIGS. 1-7, especially in FIG. 4. The light emitting structure 2700 includes a first pair of micro-lenses 2702 and light emitting mesa 401. The light emitting structure 2700 includes a second pair of micro-lenses 2704 and light emitting mesa 403.

In some embodiments, the micro-lens 2702 or 2704 has a carved-out portion as a breach at one side of the top surface of the micro-lens. In one example, the breach 2710 leaves an inclined flat surface on the micro-lens 2702. In another example, the breach 2720 leaves a curved surface on the micro-lens 2704. In some embodiments, a reflective part is formed on or attached to the surface of the breach. For example, a reflective part 2712 is formed on the surface of the breach 2710. A reflective part 2722 is formed on the surface of the breach 2720. The reflective part is a surface conforms to the shape of the surface of the breach on the micro-lens. For instance, the reflective part 2712 on the micro-lens 2702 is an incline flat surface layer. The reflective part 2722 on the micro-lens 2704 is a curved surface layer. The shape of the breach and reflective part is not limited to flat and curved shapes, other shapes such as a portion of the surface of a rectangle, triangle, square, polygon, and other composite shape might be possible.

In some embodiments, the reflective part 2712 or 2722 may include a reflective layer to improve light reflection within a certain portion of the micro-lens. In these embodiments, the reflective layer may have a high reflectivity. For example, the reflectivity of the reflective layer may be above 60%. In another example, the reflectivity of the reflective layer may be above 70%. In yet another example, the reflectivity of the reflective layer may be above 80%. Yet in these embodiments, the material of the reflective layer may comprise metal selected from one or more of Rh, Al, Ag, and Au, or comprise two sublayers with different refractive index. In some embodiments, the reflective layer may be a Bragg mirror as described above in FIG. 25.

In some embodiments, the light ray direction from the light emitting mesa 401 is changed via the micro-lens 2702 and the reflective part 2712 in different angles from different surfaces of the micro-lens 2702. For example, the light ray 2714 emitting from the light emitting mesa 401 travels through the micro-lens 2702, is reflected as 2716 within the micro-lens 2702, and is redirected as 2718 out of the micro-lens 2702. In some embodiments, the light ray direction from the light emitting mesa 403 is changed via the micro-lens 2704 and the reflective part 2722 in different angles from different surfaces of the micro-lens 2704. For example, the light ray 2724 emitting from the light emitting mesa 403 travels through the micro-lens 2704, is reflected as 2726 within the micro-lens 2704, and is redirected as 2728 out of the micro-lens 2704.

The asymmetric shape of the micro-lens with a breach combined with a reflective part can further direct and adjust the light from the light emitting mesa to a certain angle. For example, in FIG. 27, the light rays from the micro-lens 2702 or 2704 are more diffracted in certain directions and more focused in other directions around the light emitting mesa after exiting. Therefore, even when the central axis of the light emitting mesa, such as 401, and the central axis of the micro-lens, such as 2702, are the same, the light out from the micro-lens 2702 can still be redirected toward a number of angles when it travels through and out of the micro-lens 2702. Furthermore, the light exiting angle and intensity can be further adjusted when the off-set of the central axis of the micro-lens, such as 2702, relative to the central axis of the light emitting mesa, such as 401, and the position of the breach, such as 2710, on the micro-lens, are respectively changed. For example, the off-set of the central axis of the micro-lens and the central axis of the light emitting mesa, the position of the breach, and the shape and type of the breach can be varied within the same display.

Although the detailed description contains many specifics, these should not be construed as limiting the scope of the invention but merely as illustrating different examples and aspects of the invention. It should be appreciated that the scope of the invention includes other embodiments not discussed in detail above. For example, micro-lenses with different shape bases may also be used, such as square base or other polygon base. Various other modifications, changes and variations which will be apparent to those skilled in the art may be made in the arrangement, operation and details of the method and apparatus of the present invention disclosed herein without departing from the spirit and scope of the invention as defined in the appended claims. Therefore, the scope of the invention should be determined by the appended claims and their legal equivalents.

Further embodiments also include various subsets of the above embodiments including embodiments shown in FIGS. 1-27 combined or otherwise re-arranged in various other embodiments. For example, each embodiment of the micro-lens (group) and light emitting mesa pair structure described in any one of FIGS. 1-27 can be mixed with any other embodiments described in FIGS. 1-27 within the same display panel.

Figure 28:
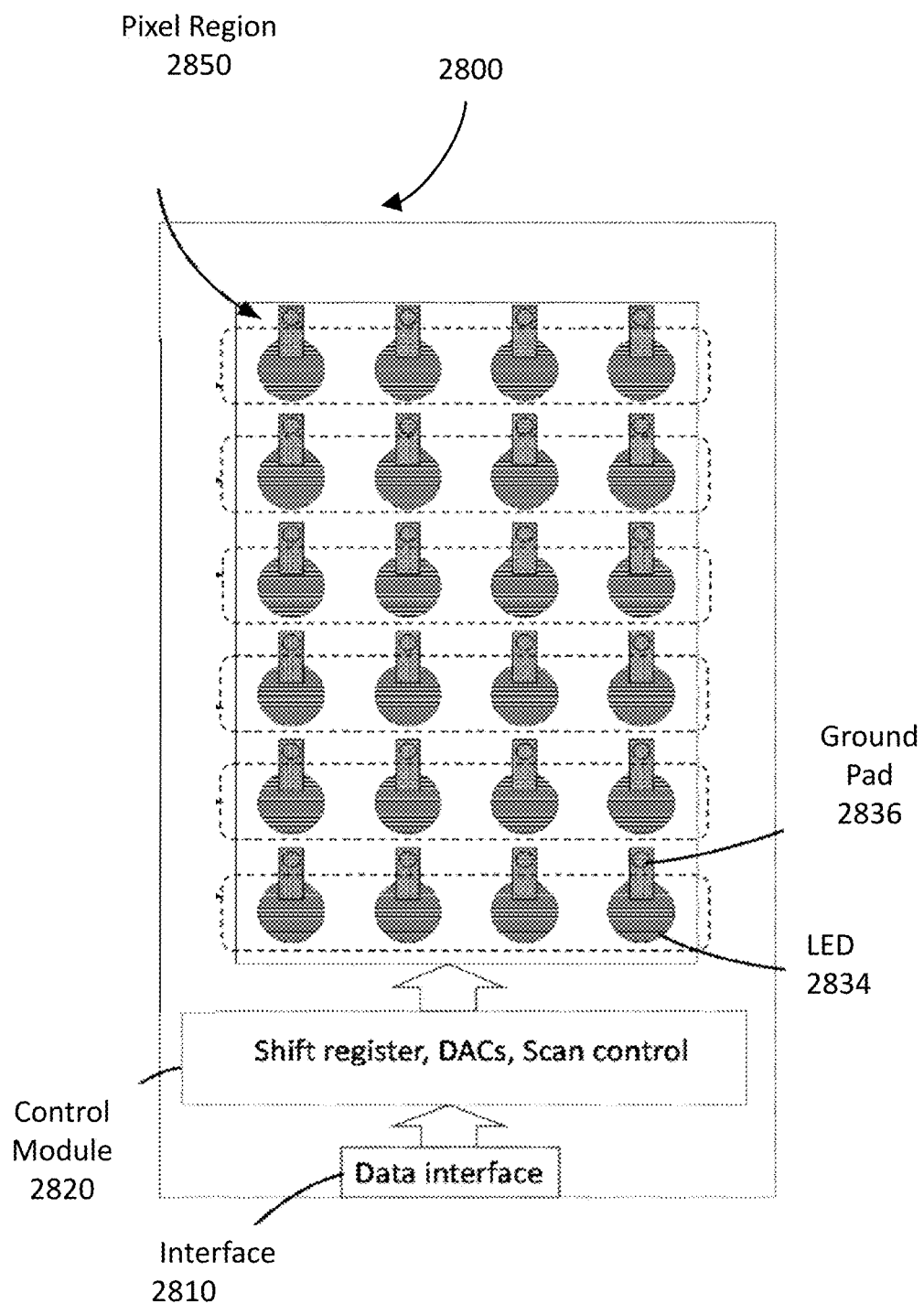
FIG. 28 is a top view of a micro LED display panel, in accordance with some embodiments.

FIG. 28 is a top view of a micro LED display panel 2800, in accordance with some embodiments. The display panel 2800 includes a data interface 2810, a control module 2820 and a pixel region 2850. The data interface 2810 receives data defining the image to be displayed. The source(s) and format of this data will vary depending on the application. The control module 2820 receives the incoming data and converts it to a form suitable to drive the pixels in the display panel. The control module 2820 may include digital logic and/or state machines to convert from the received format to one appropriate for the pixel region 2850, shift registers or other types of buffers and memory to store and transfer the data, digital-to-analog converters and level shifters, and scan controllers including clocking circuitry.

The pixel region 2850 includes an array of mesas (not separately shown from the LED 2834 in FIG. 28) including pixels. The pixels include micro LEDs, such as a single color or multi-color LED 2834, integrated with pixel drivers, for example as described above. An array of micro-lens (not separately shown from the LED 2834 in FIG. 28) covers the top of the array of mesas. In this example, the display panel 2800 is a color RGB display panel. It includes red, green and blue pixels. Within each pixel, the LED 2834 is controlled by a pixel driver. The pixel makes contact to a supply voltage (not shown) and ground via a ground pad 2836, and also to a control signal, according to the embodiments shown previously. Although not shown in FIG. 28, the p-electrode of the LED 2834 and the output of the driving transistor are electrically connected. The LED current driving signal connection (between p-electrode of LED and output of the pixel driver), ground connection (between n-electrode and system ground), the supply voltage Vdd connection (between source of the pixel driver and system Vdd), and the control signal connection to the gate of the pixel driver are made in accordance with various embodiments. Any of the micro-lens array disclosed herein can be implemented with the micro LED display panel 2800.

FIG. 28 is merely a representative figure. Other designs will be apparent. For example, the colors do not have to be red, green and blue. They also do not have to be arranged in columns or stripes. As one example, apart from the arrangement of a square matrix of pixels shown in FIG. 28, an arrangement of hexagonal matrix of pixels can also be used to form the display panel 2800.

In some applications, a fully programmable rectangular array of pixels is not necessary. Other designs of display panels with a variety of shapes and displays may also be formed using the device structures described herein. One class of examples is specialty applications, including signage and automotive. For example, multiple pixels may be arranged in the shape of a star or a spiral to form a display panel, and different patterns on the display panel can be produced by turning on and off the LEDs. Another specialty example is automobile headlights and smart lighting, where certain pixels are grouped together to form various illumination shapes and each group of LED pixels can be turned on or off or otherwise adjusted by individual pixel drivers.

Even the lateral arrangement of devices within each pixel can vary. In FIG. 1A, the LEDs and pixel drivers are arranged vertically, i.e., each LED is located on top of the corresponding pixel driver circuit. Other arrangements are possible. For example, the pixel drivers could also be located "behind", "in front of", or "beside" the LED.

Different types of display panels can be fabricated. For example, the resolution of a display panel can range typically from 8×8 to 3840×2160. Common display resolutions include QVGA with 320×240 resolution and an aspect ratio of 4:3, XGA with 1024×768 resolution and an aspect ratio of 4:3, D with 1280×720 resolution and an aspect ratio of 16:9, FHD with 1920×1080 resolution and an aspect ratio of 16:9, UHD with 3840×2160 resolution and an aspect ratio of 16:9, and 4K with $326×2160 resolution. There can also be a wide variety of pixel sizes, ranging from sub-micron and below to 10 mm and above. The size of the overall display region can also vary widely, ranging from diagonals as small as tens of microns or less up to hundreds of inches or more.

Different applications will also have different requirements for optical brightness and viewing angle. Example applications include direct viewing display screens, light engines for home/office projectors and portable electronics such as smart phones, laptops, wearable electronics, AR and VR glasses, and retinal projections. The power consumption can vary from as low as a few milliwatts for retinal projectors to as high as kilowatts for large screen outdoor displays, projectors, and smart automobile headlights. In terms of frame rate, due to the fast response (nanoseconds) of inorganic LEDs, the frame rate can be as high as KHz, or even MHz for small resolutions.

Further embodiments also include various subsets of the above embodiments including embodiments as shown in FIGS. 1-28 combined or otherwise re-arranged in various other embodiments.

Although the detailed description contains many specifics, these should not be construed as limiting the scope of the invention but merely as illustrating different examples and aspects of the invention. It should be appreciated that the scope of the invention includes other embodiments not discussed in detail above. For example, the approaches described above can be applied to the integration of functional devices other than LEDs and OLEDs with control circuitry other than pixel drivers. Examples of non-LED devices include vertical cavity surface emitting lasers (VCSEL), photodetectors, micro-electro-mechanical system (MEMS), silicon photonic devices, power electronic devices, and distributed feedback lasers (DFB). Examples of other control circuitry include current drivers, voltage drivers, trans-impedance amplifiers, and logic circuits.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

Features of the present invention can be implemented in, using, or with the assistance of a computer program product, such as a storage medium (media) or computer readable storage medium (media) having instructions stored thereon/in which can be used to program a processing system to perform any of the features presented herein. The storage medium can include, but is not limited to, high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory optionally includes one or more storage devices remotely located from the CPU(s). Memory or alternatively the non-volatile memory device(s) within the memory, comprises a non-transitory computer readable storage medium.

Stored on any machine readable medium (media), features of the present invention can be incorporated in software and/or firmware for controlling the hardware of a processing system, and for enabling a processing system to interact with other mechanisms utilizing the results of the present invention. Such software or firmware may include, but is not limited to, application code, device drivers, operating systems, and execution environments/containers.

It will be understood that, although the terms "first," "second," etc. may be used herein to describe various elements or steps, these elements or steps should not be limited by these terms. These terms are only used to distinguish one element or step from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art to best utilize the invention and the various embodiments.

What is claimed is:

1. A light emitting structure array system with an off-axis micro-lens array structure comprising:
   a plurality of light emitting mesas; and
   a plurality of micro-lenses, each micro-lens of the plurality of micro-lenses being formed above a corresponding light emitting mesa of the plurality light emitting mesas;
   wherein:
      a central axis of each micro-lens of the plurality of micro-lenses is not coaxially aligned with a central axis of the corresponding light emitting mesa;
      an offset distance of the central axis of each micro-lens of the plurality of micro-lenses relative to the central axis of the corresponding light emitting mesa becomes larger from a center of the light emitting structure array system to an edge of the light emitting structure array system.

2. The light emitting structure array system according to claim 1, further comprising a sensor, wherein emitting light rays from each light emitting mesa of the plurality light emitting mesas through a corresponding micro-lens of the plurality of micro-lenses is converted together into the sensor.

3. The light emitting structure array system according to claim 2, wherein the sensor is arranged at a central axis of the light emitting structure array system.

4. The light emitting structure array system according to claim 2, wherein the sensor is not arranged at a central axis of the light emitting structure array system.

5. The light emitting structure array system according to claim 4, wherein the offset distance of the central axis of each micro-lens of the plurality of micro-lenses relative to the central axis of the corresponding light emitting mesa becomes larger from a central axis of the sensor to an edge of the light emitting structure array system.

6. The light emitting structure array system according to claim 4, wherein an angle of light emitted out of each micro-lens of the plurality of micro-lenses becomes larger from a central axis of the sensor to an edge of the light emitting structure array system.

7. The light emitting structure array system according to claim 1, wherein a range of the offset distance of the central axis of each micro-lens of the plurality of micro-lenses relative to the central axis of the corresponding light emitting mesa is less than or equal to about 4.5 µm.

8. The light emitting structure array system according to claim 1, wherein an offset distance between an edge of a bottom surface of each micro-lens of the plurality of micro-lenses and an edge of a bottom surface of the corresponding light emitting mesa is within about 30% of a diameter of the bottom surface of the micro-lens.

9. The light emitting structure array system according to claim 1, wherein a material of the plurality of micro-lens is silicon oxide or organic materials.

10. The light emitting structure array system according to claim 1, wherein a bottom surface of each micro-lens intersects with the central axis of the corresponding light emitting mesa.

11. The light emitting structure array system according to claim 1, further comprising a semiconductor substrate and a plurality of reflective cups, wherein the plurality of light emitting mesas are formed on the semiconductor substrate, and each light emitting mesa of the plurality of light emitting mesas is surrounded by a corresponding reflective cup of the plurality of reflective cups.

12. The light emitting structure array system according to claim 11, wherein an inside wall of each reflective cup of the plurality of reflective cups is stair-shaped.

13. The light emitting structure array system according to claim 11, wherein each light emitting mesa includes:

a light emitting layer;
a bottom bonding layer, at a bottom of the light emitting layer and bonded with the semiconductor substrate; and
a top electrode layer, covering the light emitting mesa and electrically connected with the corresponding reflective cup, wherein the corresponding reflective cup is electrically connected with the semiconductor substrate.

14. The light emitting structure array system according to claim 11, wherein the semiconductor substrate is an IC substrate.

15. The light emitting structure array system according to claim 11, wherein an inside wall of each reflective cup of the plurality of reflective cups comprises multiple sidewalls at different angles.

16. The light emitting structure array system according to claim 1, further comprising a spacer, formed between the plurality of light emitting mesa and the plurality of micro-lens.

17. The light emitting structure array system according to claim 16, wherein a height of the spacer is less than a height of each micro-lens.

* * * * *